(12) United States Patent
Kori et al.

(10) Patent No.: US 11,635,691 B2
(45) Date of Patent: Apr. 25, 2023

(54) COMPOSITION FOR FORMING ORGANIC FILM, SUBSTRATE FOR MANUFACTURING SEMICONDUCTOR DEVICE, METHOD FOR FORMING ORGANIC FILM, PATTERNING PROCESS, AND POLYMER

(71) Applicant: SHIN-ETSU CHEMICAL CO., LTD., Tokyo (JP)

(72) Inventors: Daisuke Kori, Joetsu (JP); Takashi Sawamura, Joetsu (JP); Keisuke Niida, Joetsu (JP); Seiichiro Tachibana, Joetsu (JP); Takeru Watanabe, Joetsu (JP); Tsutomu Ogihara, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 430 days.

(21) Appl. No.: 16/921,023

(22) Filed: Jul. 6, 2020

(65) Prior Publication Data
US 2021/0003920 A1 Jan. 7, 2021

(30) Foreign Application Priority Data
Jul. 5, 2019 (JP) .............................. JP2019-125740

(51) Int. Cl.
*G03F 7/09* (2006.01)
*C08G 61/12* (2006.01)
(Continued)

(52) U.S. Cl.
CPC ............. *G03F 7/094* (2013.01); *C08G 61/10* (2013.01); *C08G 61/12* (2013.01); *C08G 61/124* (2013.01);
(Continued)

(58) Field of Classification Search
CPC ........ G03F 7/094; G03F 7/0757; G03F 7/091; G03F 7/11; G03F 7/162; G03F 7/168;
(Continued)

(56) References Cited

U.S. PATENT DOCUMENTS

2005/0255712 A1  11/2005  Kato et al.
2009/0274978 A1  11/2009  Ohashi et al.
(Continued)

FOREIGN PATENT DOCUMENTS

EP    3584238 A1    12/2019
JP    2002-334869 A    11/2002
(Continued)

OTHER PUBLICATIONS

Nov. 18, 2020 Search Report issued in European Patent Application No. 20183521.2.
(Continued)

*Primary Examiner* — Caleen O Sullivan
(74) *Attorney, Agent, or Firm* — Oliff PLC

(57) ABSTRACT

A composition for forming an organic film contains a polymer having a partial structure shown by the following general formula (1) as a repeating unit, and an organic solvent. Each of AR1 and AR2 represents a benzene ring or naphthalene ring which optionally have a substituent; $W_1$ represents a particular partial structure having a triple bond, and the polymer optionally contains two or more kinds of $W_1$; and $W_2$ represents a divalent organic group having 6 to 80 carbon atoms and at least one aromatic ring. This invention provides: a polymer curable even under film formation conditions in an inert gas and capable of forming an organic film which has not only excellent heat resistance and properties of filling and planarizing a pattern formed in a substrate, but also favorable film formability onto a
(Continued)

substrate with less sublimation product; and a composition for forming an organic film, containing the polymer.

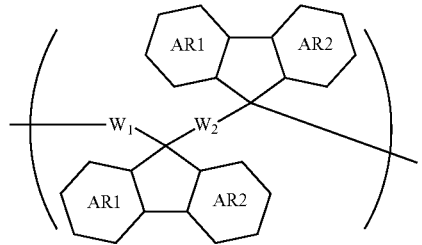

(1)

21 Claims, 3 Drawing Sheets

(51) Int. Cl.
| | |
|---|---|
| C08G 61/10 | (2006.01) |
| C08J 5/18 | (2006.01) |
| G03F 7/16 | (2006.01) |
| G03F 7/075 | (2006.01) |
| G03F 7/11 | (2006.01) |
| G03F 7/20 | (2006.01) |
| G03F 7/32 | (2006.01) |
| H01L 21/311 | (2006.01) |
| H01L 21/027 | (2006.01) |

(52) U.S. Cl.
CPC .............. *C08J 5/18* (2013.01); *G03F 7/0757* (2013.01); *G03F 7/091* (2013.01); *G03F 7/11* (2013.01); *G03F 7/162* (2013.01); *G03F 7/168* (2013.01); *G03F 7/2002* (2013.01); *G03F 7/2022* (2013.01); *G03F 7/325* (2013.01); *G03F 7/327* (2013.01); *H01L 21/0276* (2013.01); *H01L 21/31116* (2013.01); *H01L 21/31144* (2013.01); *C08G 2261/124* (2013.01); *C08G 2261/1414* (2013.01); *C08G 2261/1424* (2013.01); *C08G 2261/312* (2013.01); *C08G 2261/3142* (2013.01); *C08G 2261/3241* (2013.01); *C08G 2261/3245* (2013.01); *C08G 2261/334* (2013.01); *C08J 2365/00* (2013.01)

(58) Field of Classification Search
CPC ...... G03F 7/2002; G03F 7/2022; G03F 7/325; G03F 7/327; G03F 1/56; G03F 1/76; C08G 61/10; C08G 61/12; C08G 61/124; C08G 2261/124; C08G 2261/1414; C08G 2261/1424; C08G 2261/312; C08G 2261/3142; C08G 2261/3241; C08G 2261/3245; C08G 2261/334; C08G 2261/135; C08G 2261/314; C08G 2261/3162; C08G 2261/344; C08G 2261/76; C08G 61/02; C08G 73/026; C08G 73/0672; C08J 5/18; C08J 2365/00; H01L 21/0276; H01L 21/31116; H01L 21/31144; H01L 21/0271; H01L 21/0332; H01L 21/0337; C09D 165/00; C08L 65/00
USPC .................... 438/700; 430/311, 270.1, 271.1
See application file for complete search history.

(56) References Cited

U.S. PATENT DOCUMENTS

| | | |
|---|---|---|
| 2010/0099044 A1 | 4/2010 | Hatakeyama et al. |
| 2012/0077345 A1 | 3/2012 | Saito et al. |
| 2012/0252217 A1 | 10/2012 | Minegishi et al. |
| 2013/0302990 A1 | 11/2013 | Watanabe et al. |
| 2014/0235059 A1 | 8/2014 | Sakamoto et al. |
| 2014/0235060 A1 | 8/2014 | Shinjo et al. |
| 2016/0085152 A1 | 3/2016 | Nakafuji et al. |
| 2016/0314984 A1 | 10/2016 | Matsumura et al. |
| 2016/0326396 A1 | 11/2016 | Nishimaki et al. |
| 2017/0184968 A1 | 6/2017 | Kori et al. |
| 2018/0065930 A1 | 3/2018 | Okada et al. |
| 2018/0356732 A1 | 12/2018 | Tokunaga et al. |
| 2019/0027369 A1* | 1/2019 | Kori ..................... G03F 7/11 |
| 2019/0064659 A1 | 2/2019 | Kori et al. |
| 2019/0067021 A1 | 2/2019 | Kori et al. |
| 2019/0390000 A1 | 12/2019 | Tachibana et al. |
| 2020/0012193 A1 | 1/2020 | Nosaka et al. |
| 2020/0166844 A1 | 5/2020 | Okada et al. |
| 2022/0214617 A1* | 7/2022 | Kori ..................... G03F 7/40 |
| 2022/0214618 A1* | 7/2022 | Kori ..................... G03F 7/094 |

FOREIGN PATENT DOCUMENTS

| | | |
|---|---|---|
| JP | 2005-128509 A | 5/2005 |
| JP | 2006-285095 A | 10/2006 |
| JP | 2006-293298 A | 10/2006 |
| JP | 2007-199653 A | 8/2007 |
| JP | 2009-269953 A | 11/2009 |
| JP | 2010-122656 A | 6/2010 |
| JP | 2010-181605 A | 8/2010 |
| JP | 2012-215842 A | 11/2012 |
| JP | 2013-137334 A | 7/2013 |
| JP | 2013-253227 A | 12/2013 |
| JP | 2016-044272 A | 4/2016 |
| JP | 2016-060886 A | 4/2016 |
| JP | 2017-119671 A | 7/2017 |
| JP | 2019-041059 A | 3/2019 |
| JP | 2019-044022 A | 3/2019 |
| WO | 2004/066377 A1 | 8/2004 |
| WO | 2010/147155 A1 | 12/2010 |
| WO | 2013/005797 A1 | 1/2013 |
| WO | 2013/047516 A1 | 4/2013 |
| WO | 2014/208324 A1 | 12/2014 |
| WO | 2015/098594 A1 | 7/2015 |
| WO | 2016/147989 A1 | 9/2016 |
| WO | 2017/094780 A1 | 6/2017 |
| WO | 2018/164267 A1 | 9/2018 |
| WO | 2018/212116 A1 | 11/2018 |
| WO | 2019/121480 A1 | 6/2019 |
| WO | 2020/216899 A1 | 10/2020 |

OTHER PUBLICATIONS

May 10, 2022 Office Action issued in Japanese Patent Application No. 2019-125740.

* cited by examiner

[FIG. 1]
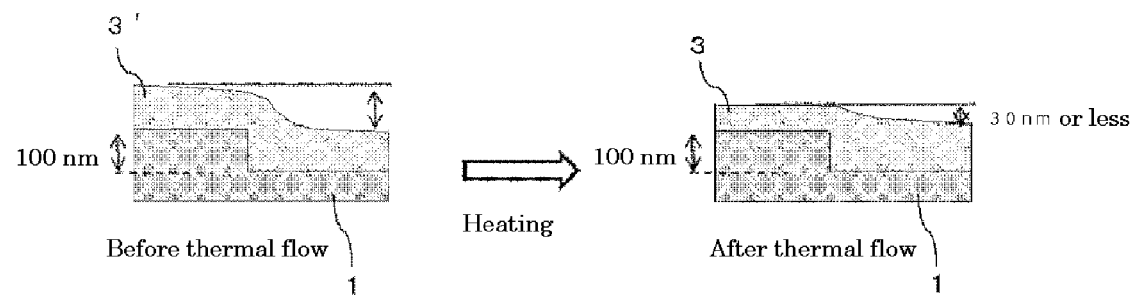
[FIG. 2]
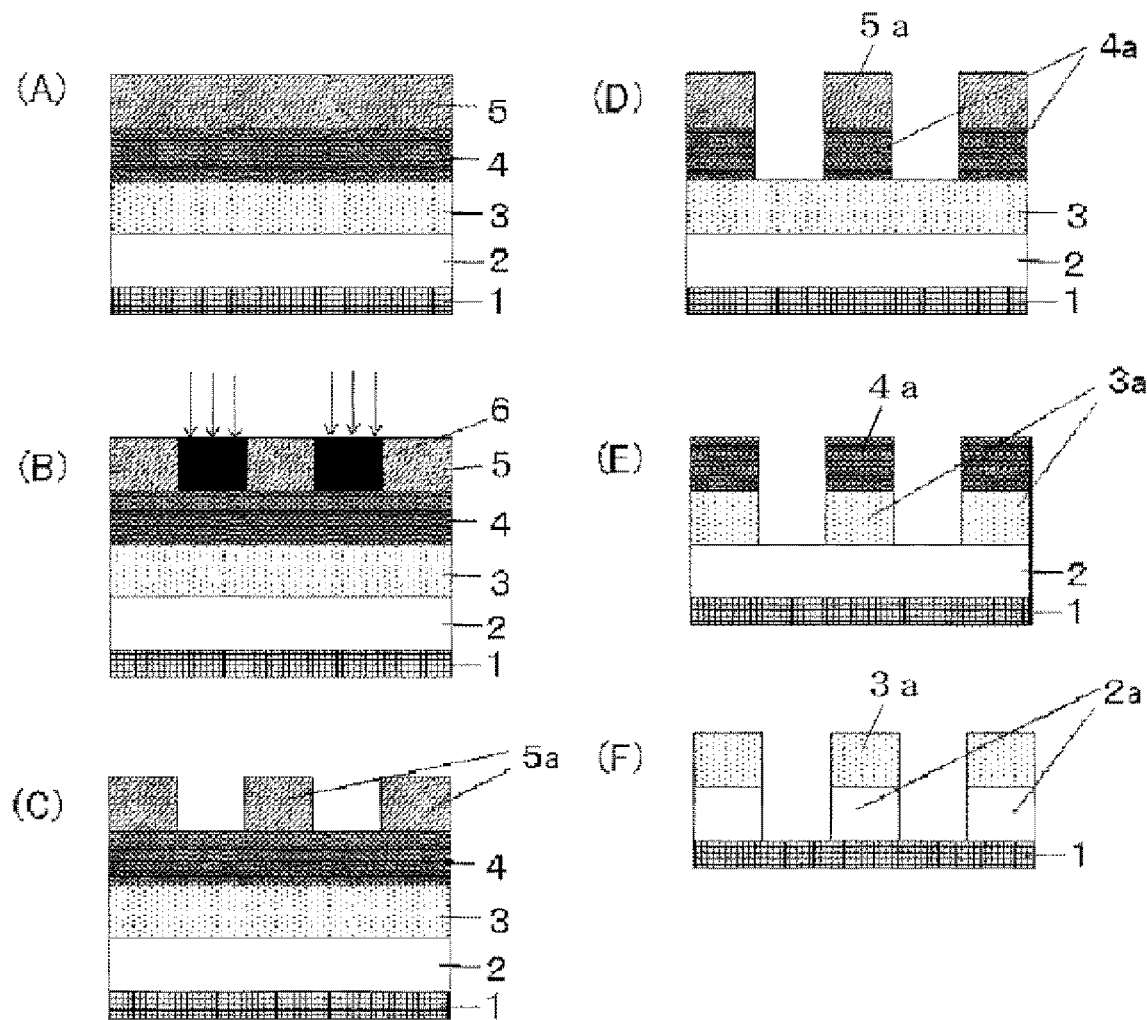

[FIG. 3]
(G)
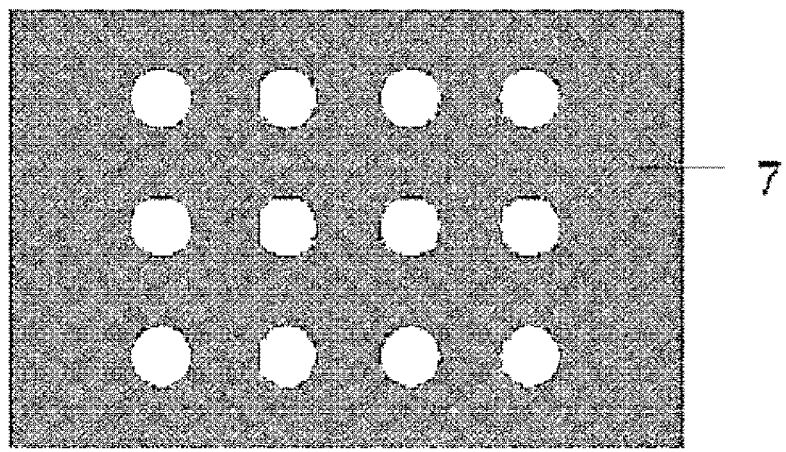
(H)
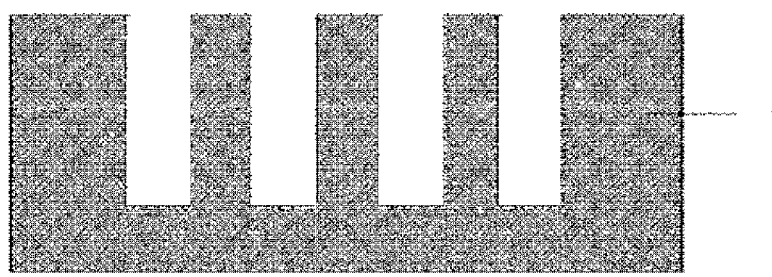
(I)
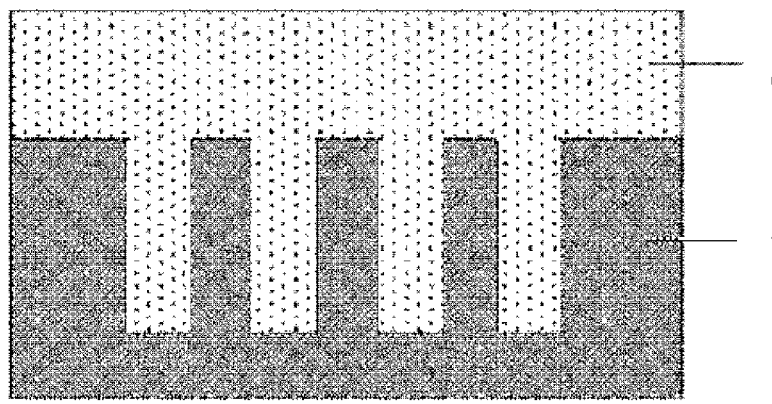

[FIG. 4]
(J)
(K)
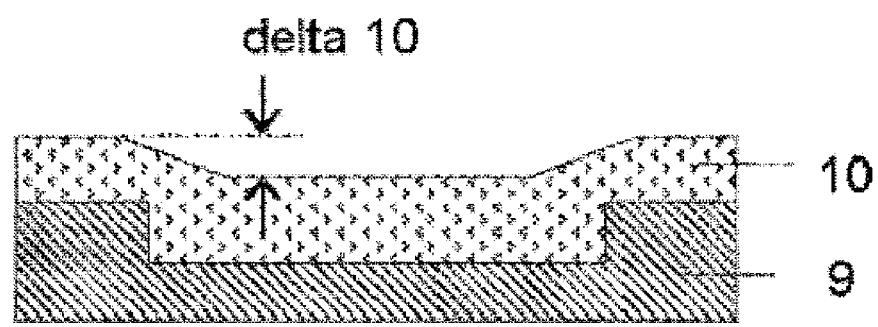

COMPOSITION FOR FORMING ORGANIC FILM, SUBSTRATE FOR MANUFACTURING SEMICONDUCTOR DEVICE, METHOD FOR FORMING ORGANIC FILM, PATTERNING PROCESS, AND POLYMER

TECHNICAL FIELD

The present invention relates to: a composition for forming an organic film used in a semiconductor device manufacturing process; a substrate for manufacturing a semiconductor device, a method for forming an organic film, and a patterning process according to a multilayer resist method, all of which utilize the composition; and a polymer suitably used in the composition.

BACKGROUND ART

Conventionally, high integration and high processing speed of semiconductor devices have been achieved through the miniaturization of pattern size by shortening the wavelength of light sources in lithography technology using light exposure (photolithography), which is commonly employed technology. To form such a fine circuit pattern on a semiconductor device substrate (substrate to be processed), the following method is generally employed in which the substrate to be processed is processed by dry etching using a patterned photoresist film as an etching mask. In practice, however, there is no dry etching method capable of providing an absolute etching selectivity between the photoresist film and the substrate to be processed. Hence, recently, it has been common to process a substrate by a multilayer resist method. This method is as follows: first, a middle layer film having a different etching selectivity from a photoresist film (hereinafter, resist upper layer film) is placed between the resist upper layer film and a substrate to be processed; a pattern is formed in the resist upper layer film; then, the pattern is transferred to the middle layer film by dry etching using the resist upper layer film pattern as a dry etching mask; further, the pattern is transferred to the substrate to be processed by dry etching using the middle layer film as a dry etching mask.

One of such multilayer resist methods is a three-layer resist method which can be performed with a typical resist composition used in a monolayer resist method. In this method, a substrate to be processed is coated with an organic film material composed of an organic resin-containing composition and then baked to form an organic film (hereinafter, organic film); the organic film is subsequently coated with a resist middle layer film material composed of a composition containing a silicon-containing resin, and baked to form a silicon-containing film (hereinafter, silicon-containing resist middle layer film); thereafter, a typical organic photoresist film is formed on the middle layer film. This resist upper layer film is patterned and then subjected to dry etching with fluorine-based gas plasma, so that the organic resist upper layer film can exhibit a favorable etching selectivity ratio relative to the silicon middle layer film. Thus, the resist upper layer film pattern can be transferred to the silicon middle layer film. This method allows a pattern to be easily transferred to the silicon middle layer film even if a resist upper layer film does not have film thickness sufficient for directly processing the substrate to be processed or if a resist upper layer film does not have sufficient dry etching resistance for processing the substrate to be processed. This is because the silicon middle layer film generally has a film thickness equal to or smaller than the resist upper layer film.

Subsequently, using the silicon middle layer film having the transferred pattern as a dry etching mask, the pattern is transferred to the organic film by dry etching with oxygen- or hydrogen-based gas plasma. Thereby, the pattern can be transferred to the organic film having dry etching resistance sufficient for substrate processing. This transferred organic film pattern can be transferred to the substrate by dry etching with a fluorine-based gas, chlorine-based gas, or the like.

Meanwhile, the miniaturization in the semiconductor device manufacturing process is approaching to the limit inherent in the wavelength of light sources for photolithography. Accordingly, recently, the high integration of semiconductor devices has been examined without depending on the miniaturization. As one means for the high integration, semiconductor devices having complicated structures such as multigate structure have been examined, and some of these have been already put into practical use. In forming such structures by multilayer resist methods, it is possible to employ an organic film material which is capable of filling a fine pattern including hole, trench, and fin formed on a substrate to be processed with a film without space, and capable of filling a step- or pattern-dense region and a pattern-free region with a film and planarizing the regions. The use of such an organic film material to form an organic film having a flat surface on a stepped substrate reduces fluctuations in film thicknesses of a silicon middle layer film and a resist upper layer film formed thereon, and can suppress reductions in a focus margin in photolithography and a margin in a subsequent step of processing the substrate to be processed. This makes it possible to manufacture semiconductor devices with high yields. On the other hand, in the monolayer resist method, the upper resist film has to have a large film thickness to fill a stepped or patterned substrate to be processed. As a result, for example, pattern collapse occurs after exposure and development, and the pattern profile is degraded due to reflection from the substrate at exposure. Consequently, the pattern formation margin at exposure is narrowed, making it difficult to manufacture semiconductor devices with high yields.

Further, as techniques for the high processing speed of next-generation semiconductor devices, for example, the applications of the following materials have also started to be examined: novel materials having high electron mobility using strained silicon, gallium arsenic, and so forth; and high-precision materials such as ultrathin polysilicon controlled in units of angstrom. However, in substrates to be processed to which such novel high-precision materials are applied, the materials may be corroded by oxygen in air under conditions during the planarizing film formation from an organic film material as described above, for example, film formation conditions of air and 300° C. or higher. Hence, such a performance as a high processing speed of a semiconductor device cannot be exhibited according to the material design, and industrially satisfactory yield may not be achieved. For this reason, an organic film material capable of forming a film in an inert gas has been desired so as to avoid a decrease in yield due to substrate corrosion by air under such high temperature conditions.

Conventionally, condensed resins using aromatic alcohols and carbonyl compounds such as ketones and aldehydes as condensing agents for a phenol compound or naphthol compound have been known as materials for forming an organic film for multilayer resist methods. Examples of such condensed resins include a fluorene bisphenol novolak resin described in Patent Document 1, a bisphenol compound and a novolak resin thereof described in Patent Document 2, a novolak resin of an adamantane phenol compound described in Patent Document 3, a bisnaphthol compound and a novolak resin thereof described in Patent Document 4, etc. Crosslinking with a methylol compound as a crosslinking agent, or curing action through a crosslinking reaction by oxidation at the α-position of an aromatic ring due to the action of oxygen in air and the following condensation causes these materials to form films having solvent resistance in relation to a coating film material used in the subsequent step. Consequently, the materials are unable to suppress cured film formation in an inert gas, film thickness fluctuation due to thermal decomposition under high temperature conditions, and degradation of filling and planarizing properties, etc.

Moreover, there are known materials in which triple bonds are utilized as intermolecular crosslinking groups of curable resins. For example, Patent Documents 5 to 10, etc. are known. These materials form cured films having solvent resistance through not only crosslinking with aforementioned methylol but also crosslinking by polymerization at the triple bonds. However, these materials for forming an organic film do not have sufficient properties of filling and planarizing a pattern formed in a substrate.

Further, known examples of a material containing a nitrogen-containing polymer include copolymer resins containing a heterocycle (Patent Documents 11, 12), carbazole resins (Patent Documents 13, 14), novolak having a secondary amino group (Patent Document 15), diarylamine novolak (Patent Document 16), indolocarbazole novolak (Patent Document 17), etc. However, these materials are not exemplified as to the substituent having a triple bond on a nitrogen atom. In addition, cured film formation in an inert gas, film thickness fluctuation due to thermal decomposition under high temperature conditions, filling property, planarizing property, and so forth are unknown, either.

Furthermore, as nitrogen-containing compounds, Patent Documents 18, 19 describe examples of a middle layer film material using a single-molecular compound. Nonetheless, the use of such single-molecular compound has problems of: coatability onto a substrate having complex shape, sublimation product originated from the low-molecular-weight compound during baking, and so forth. These bring new issues regarding the resulting cured organic film; some properties thereof such as heat resistance and etching resistance need to be improved.

CITATION LIST

Patent Literature

Patent Document 1: JP 2005-128509 A
Patent Document 2: JP 2006-293298 A
Patent Document 3: JP 2006-285095 A
Patent Document 4: JP 2010-122656 A
Patent Document 5: JP 2010-181605 A
Patent Document 6: WO 2014-208324 A1
Patent Document 7: JP 2012-215842 A
Patent Document 8: JP 2016-044272 A
Patent Document 9: JP 2016-060886 A
Patent Document 10: JP 2017-119671 A
Patent Document 11: JP 2013-137334 A
Patent Document 12: WO 2018-212116 A1
Patent Document 13: WO 2010-147155 A1
Patent Document 14: WO 2013-005797 A1
Patent Document 15: WO 2015-098594 A1
Patent Document 16: WO 2013-047516 A1
Patent Document 17: WO 2017-094780 A1
Patent Document 18: WO 2016-147989 A1
Patent Document 19: WO 2018-164267 A1

SUMMARY OF INVENTION

Technical Problem

The present invention has been made in view of the above-described circumstances. An object of the present invention is to provide a polymer that is curable under film formation conditions in air and also in an inert gas, and capable of forming an organic film which is not only excellent in heat resistance and properties of filling and planarizing a pattern formed in a substrate, but also has favorable film formability onto a substrate with less sublimation product; and a composition for forming an organic film, the composition containing the polymer. Another object of the present invention is to provide a substrate for manufacturing a semiconductor device, a method for forming an organic film, and a patterning process, all of which utilize the composition.

Solution to Problem

To achieve the object, the present invention provides a composition for forming an organic film, comprising:

a polymer having a partial structure shown by the following general formula (1) as a repeating unit; and an organic solvent,

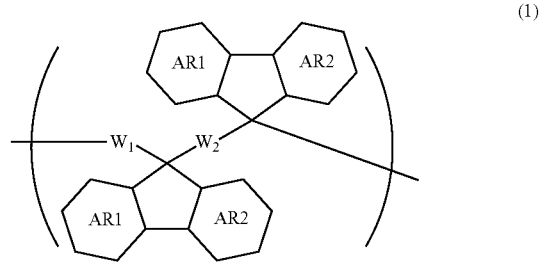

(1)

wherein each of AR1 and AR2 represents a benzene ring or a naphthalene ring which optionally have a substituent; $W_1$ represents any shown by the following general formulae (2), (4), and (6), and the polymer optionally contains two or more kinds of $W_1$; and $W_2$ represents a divalent organic group having 6 to 80 carbon atoms and at least one or more aromatic rings,

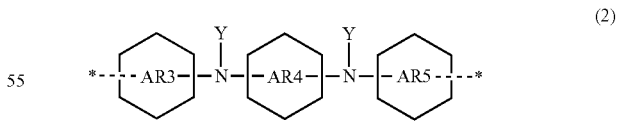

(2)

wherein AR3, AR4, and AR5 each represent a benzene ring or a naphthalene ring which optionally have a substituent, and aromatic rings of AR3 and AR4, or AR4 and AR5, optionally form a bridge structure via carbon atoms to which hydrogen atoms have been bonded on the aromatic ring; and Y represents a substituent shown by the following general formula (3),

(3)

wherein $R_3$ represents a single bond or a divalent organic group having 20 or fewer carbon atoms; and $R_4$ represents hydrogen or a monovalent organic group having 20 or fewer carbon atoms,

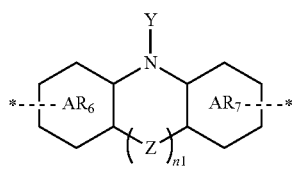

(4)

wherein $AR_6$ and $AR_7$ each represent a benzene ring or a naphthalene ring which optionally have a substituent; n1 represents 0 or 1, when n1=0, $AR_6$ and $AR_7$ form no bridge structure between aromatic rings thereof via Z, and when n1=1, $AR_6$ and $AR_7$ form a bridge structure via Z; Z represents a single bond or any in the following general formula (5); and Y represents a substituent shown by the general formula (3),

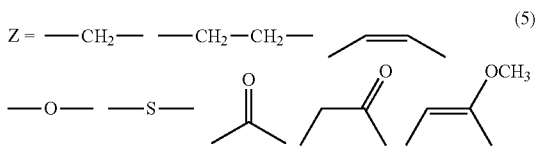

(5)

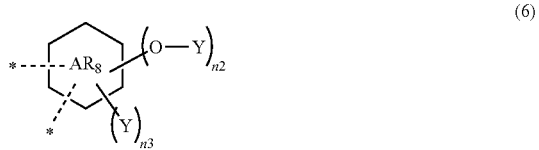

(6)

wherein $AR_8$ represents a benzene ring, a naphthalene ring, an anthracene ring, a phenanthrene ring, or a pyrene ring; Y represents a substituent shown by the general formula (3); and n2 and n3 represent integers satisfying relations of $0 \leq n2 \leq 4$, $0 \leq n3 \leq 4$, and $1 \leq n2+n3 \leq 4$.

Such a composition for forming an organic film is capable of forming an organic film which is curable under film formation conditions not only in air but also in an inert gas, and which has high heat resistance, excellent film formability, and both high filling and planarizing properties.

The divalent organic group represented by $W_2$ in the general formula (1) is preferably any of the following,

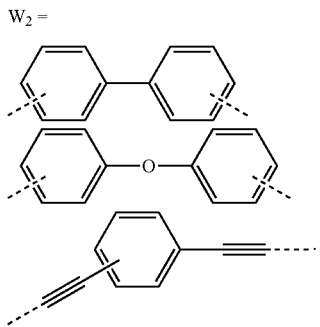

Introducing such partial structures to $W_2$ improves the heat resistance and makes the polymer suitable for forming an organic film excellent in etching resistance and twisting resistance.

The polymer preferably has a weight-average molecular weight of 1000 to 5000.

When the composition for forming an organic film contains such a polymer having a Mw in this range, outgassing can be suppressed during baking without impairing the solubility into the organic solvent.

The organic solvent is preferably a mixture of one or more organic solvents each having a boiling point of lower than 180° C. and one or more organic solvents each having a boiling point of 180° C. or higher.

With such a composition for forming an organic film, the addition of the high-boiling-point solvent(s) to the polymer imparts thermal flowability to the resulting film. Thus, the composition for forming an organic film has both high filling and planarizing properties.

The composition for forming an organic film preferably further comprises at least one of a surfactant and a plasticizer.

Incorporating such a component(s) into the composition for forming an organic film enables the composition for forming an organic film to have more excellent coatability or filling and planarizing properties.

Moreover, the present invention provides a substrate for manufacturing a semiconductor device, comprising an organic film on the substrate, the organic film being formed by curing the above-described composition for forming an organic film.

The organic film formed from the inventive composition for forming an organic film has both high filling and planarizing properties. Accordingly, the organic film does not have fine pores due to insufficient filling or asperity in the organic film surface due to insufficient planarizing property. The inventive semiconductor device substrate planarized by the organic film has a wide process margin at patterning, making it possible to manufacture semiconductor devices with high yields.

The present invention provides a method for forming an organic film employed in a semiconductor device manufacturing process, the method comprising the steps of:

spin-coating a substrate to be processed with the above-described composition for forming an organic film; and heating the substrate to be processed coated with the composition for forming an organic film under an inert gas atmosphere at a temperature of 50° C. or higher and 600° C. or lower within a range of 10 seconds to 7200 seconds to obtain a cured film.

Further, the present invention provides a method for forming an organic film employed in a semiconductor device manufacturing process, the method comprising the steps of:

spin-coating a substrate to be processed with the above-described composition for forming an organic film;

heating the substrate to be processed coated with the composition for forming an organic film in air at a temperature of 50° C. or higher and 250° C. or lower within a range of 5 seconds to 600 seconds to form a coating film; and heating the resultant under an inert gas atmosphere at a temperature of 200° C. or higher and 600° C. or lower within a range of 10 seconds to 7200 seconds to obtain a cured film.

The organic films formed according to the inventive methods for forming an organic film and employed in a semiconductor device manufacturing process have high heat resistance and high filling and planarizing properties. The use of such organic films in a semiconductor device manufacturing process improves the yield of semiconductor devices.

In this event, the inert gas preferably has an oxygen concentration of 1% or less.

Even when the inventive composition for forming an organic film is heated in such an inert gas atmosphere, it is possible to form an organic film which is sufficiently cured without generating sublimation product, and which is excellent in adhesiveness to a substrate.

As the substrate to be processed, a substrate to be processed which has structure or step with a height of 30 nm or more is preferably used.

The inventive methods for forming an organic film are particularly useful in forming a flat organic film on such a substrate to be processed.

The present invention provides a patterning process comprising the steps of:

forming an organic film by using the above-described composition for forming an organic film on a body to be processed;

forming a silicon-containing resist middle layer film by using a silicon-containing resist middle layer film material on the organic film;

forming a resist upper layer film by using a photoresist composition on the silicon-containing resist middle layer film;

forming a circuit pattern in the resist upper layer film;

transferring the pattern to the silicon-containing resist middle layer film by etching using the resist upper layer film having the formed circuit pattern as a mask;

transferring the pattern to the organic film by etching using the silicon-containing resist middle layer film having the transferred pattern as a mask; and etching the body to be processed using the organic film having the transferred pattern as a mask to form the pattern in the body to be processed.

The present invention provides a patterning process comprising the steps of:

forming an organic film by using the above-described composition for forming an organic film on a body to be processed;

forming a silicon-containing resist middle layer film by using a silicon-containing resist middle layer film material on the organic film;

forming an organic antireflective coating (BARC) on the silicon-containing resist middle layer film;

forming a resist upper layer film by using a photoresist composition on the BARC;

forming a circuit pattern in the resist upper layer film;

successively transferring the pattern by etching to the BARC and the silicon-containing resist middle layer film using the resist upper layer film having the formed circuit pattern as a mask;

transferring the pattern to the organic film by etching using the silicon-containing resist middle layer film having the transferred pattern as a mask; and etching the body to be processed using the organic film having the transferred pattern as a mask to form the pattern in the body to be processed.

The present invention provides a patterning process comprising the steps of:

forming an organic film by using the above-described composition for forming an organic film on a body to be processed;

forming an inorganic hard mask selected from a silicon oxide film, a silicon nitride film, a silicon oxynitride film, a titanium oxide film, and a titanium nitride film on the organic film;

forming a resist upper layer film by using a photoresist composition on the inorganic hard mask;

forming a circuit pattern in the resist upper layer film;

transferring the pattern to the inorganic hard mask by etching using the resist upper layer film having the formed circuit pattern as a mask;

transferring the pattern to the organic film by etching using the inorganic hard mask having the formed pattern as a mask; and etching the body to be processed using the organic film having the formed pattern as a mask to form the pattern in the body to be processed.

The present invention provides a patterning process comprising the steps of:

forming an organic film by using the above-described composition for forming an organic film on a body to be processed;

forming an inorganic hard mask selected from a silicon oxide film, a silicon nitride film, a silicon oxynitride film, a titanium oxide film, and a titanium nitride film on the organic film;

forming a BARC on the inorganic hard mask;

forming a resist upper layer film by using a photoresist composition on the BARC;

forming a circuit pattern in the resist upper layer film;

successively transferring the pattern to the BARC and the inorganic hard mask by etching using the resist upper layer film having the formed circuit pattern as a mask;

transferring the pattern to the organic film by etching using the inorganic hard mask having the formed pattern as a mask; and etching the body to be processed using the organic film having the formed pattern as a mask to form the pattern in the body to be processed.

The inventive composition for forming an organic film is suitably usable in various patterning processes such as four-layer resist processes using an organic antireflective coating besides three-layer resist processes using a silicon-containing resist middle layer film or inorganic hard mask. In a semiconductor device manufacturing process, when a circuit pattern is formed by such a patterning process according to the present invention, semiconductor devices can be manufactured with high yields.

In this event, the inorganic hard mask is preferably formed by a CVD method or an ALD method.

In the inventive patterning processes, the inorganic hard mask can be formed by such a method, for example.

The circuit pattern is preferably formed in the resist upper layer film by a photolithography with a wavelength of 10 nm or more and 300 nm or less, direct lithography with electron beam, nanoimprinting, or a combination thereof.

In the inventive patterning processes, alkali development or organic solvent development is preferably employed as a development method.

In the inventive patterning processes, such means for forming and developing a circuit pattern are suitably usable.

The body to be processed is preferably a semiconductor device substrate or the semiconductor device substrate coated with any of a metal film, a metal carbide film, a metal oxide film, a metal nitride film, a metal oxycarbide film, and a metal oxynitride film.

The metal is preferably silicon, titanium, tungsten, hafnium, zirconium, chromium, germanium, copper, silver, gold, aluminum, indium, gallium, arsenic, palladium, iron, tantalum, iridium, cobalt, manganese, molybdenum, or an alloy thereof.

The inventive patterning processes make it possible to form a pattern by processing the above-described body to be processed.

Furthermore, the present invention provides a polymer comprising a partial structure shown by the following general formula (1) as a repeating unit,

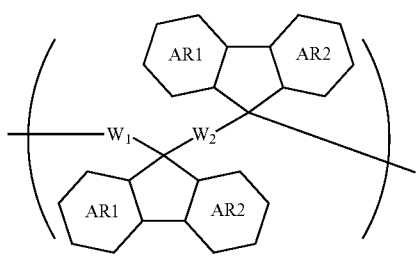

wherein each of AR1 and AR2 represents a benzene ring or a naphthalene ring which optionally have a substituent; $W_1$ represents any shown by the following general formulae (2), (4), and (6), and the polymer optionally contains two or more kinds of $W_1$; and $W_2$ represents a divalent organic group having 6 to 80 carbon atoms and at least one or more aromatic rings,

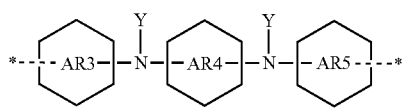

wherein AR3, AR4, and AR5 each represent a benzene ring or a naphthalene ring which optionally have a substituent, and aromatic rings of AR3 and AR4, or AR4 and AR5, optionally form a bridge structure via carbon atoms to which hydrogen atoms have been bonded on the aromatic ring; and Y represents a substituent shown by the following general formula (3), $$Y=\!\!-\!\!R_3\!\equiv\!\!R_4 \qquad (3)$$

wherein $R_3$ represents a single bond or a divalent organic group having 20 or fewer carbon atoms; and $R_4$ represents hydrogen or a monovalent organic group having 20 or fewer carbon atoms,

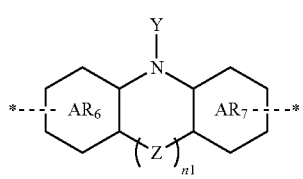

wherein $AR_6$ and $AR_7$ each represent a benzene ring or a naphthalene ring which optionally have a substituent; n1 represents 0 or 1, when n1=0, $AR_6$ and $AR_7$ form no bridge structure between aromatic rings thereof via Z, and when n1=1, $AR_6$ and $AR_7$ form a bridge structure via Z; Z represents a single bond or any in the following general formula (5); and Y represents a substituent shown by the general formula (3),

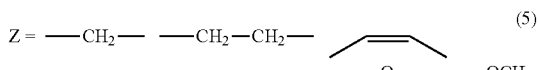
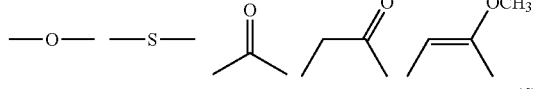
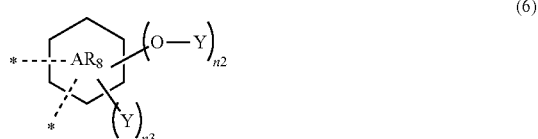

wherein $AR_8$ represents a benzene ring, a naphthalene ring, an anthracene ring, a phenanthrene ring, or a pyrene ring; Y represents a substituent shown by the general formula (3); and n2 and n3 represent integers satisfying relations of $0 \leq n2 \leq 4$, $0 \leq n3 \leq 4$, and $1 \leq n2+n3 \leq 4$.

Such a polymer is cured under film formation conditions not only in air but also in an inert gas by the action of the substituent which has a triple bond and is introduced at the position $W_1$. The polymer is capable of forming an organic film having high heat resistance, excellent film formability, and high filling and planarizing properties. Moreover, steric hindrance by a cardo structure contained in the repeating unit prevents crystallization, so that the film formability is improved, and heat resistance and etching resistance can be imparted without impairing thermal flowability.

The divalent organic group represented by $W_2$ in the general formula (1) is preferably any of the following,

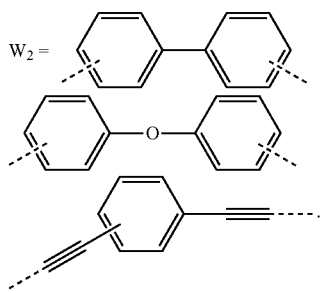

Such a polymer is a useful polymer for forming an organic film having both etching resistance and twisting resistance. Further, the film shrink is suppressed during curing, so that excellent filling and planarizing properties can be exhibited.

Advantageous Effects of Invention

As described above, by the action of the substituent which has a triple bond and which is introduced to the partial structure represented by $W_1$, the inventive polymer is cured during the film formation in an inert gas for preventing corrosion of a substrate. The polymer is useful for forming an organic film having both high filling and planarizing properties. Moreover, the organic film composition containing this polymer serves as a material for forming an organic film having excellent filling property, planarizing property, and coatability as well as various properties such as heat resistance and etching resistance. Thus, the inventive composition is quite useful as a planarizing material for manufacturing a semiconductor device, or an organic film material in multilayer resist methods, for example, a two-layer resist method, a three-layer resist method using a silicon-containing resist middle layer film, and four-layer resist methods using a silicon-containing resist middle layer film and an organic antireflective coating. Further, since the organic film formed from the inventive composition for forming an organic film is excellent in heat resistance, when a CVD hard mask is formed on the organic film, the film thickness does not fluctuate due to thermal decomposition, and a pattern is formed suitably.

BRIEF DESCRIPTION OF DRAWINGS

FIG. 1 is an explanatory view of the planarizing property in the present invention.

FIG. 2 is an explanatory view of an example of an inventive patterning process according to a three-layer resist method.

FIG. 3 is an explanatory view of a method for evaluating the filling property in Examples.

FIG. 4 is an explanatory view of a method for evaluating the planarizing property in Examples.

DESCRIPTION OF EMBODIMENTS

As described above, it has been desired to develop a material for forming an organic film, which generates no sublimation product under such film formation conditions in an inert gas as to prevent substrate corrosion, for example, even at 300° C. or higher, and which is capable of forming an organic film not only excellent in properties of filling and planarizing a pattern formed on a substrate but also favorable for dry etching resistance during substrate processing; moreover, the film thickness of the resulting organic film does not fluctuate by thermal decomposition even when a CVD hard mask is formed on the organic film. Additionally, it has been desired to develop a compound useful in a patterning process using the material.

Generally, when an organic film is formed, a composition is prepared by dissolving a compound useful for forming the organic film in an organic solvent. Then, a substrate on which a semiconductor device structure, wiring, and so forth have been formed is coated with this composition and baked to form the organic film. Immediately after the application of the composition, a coating film is formed in a shape according to the step structure on the substrate. Nevertheless, when the coating film is baked, most of the organic solvent is evaporated before curing, so that the organic film is formed from the compound remaining on the substrate. In this situation, the present inventors have conceived that if the compound remaining on the substrate has sufficient thermal flowability, the step profile immediately after the application is planarized by thermal flow, and a flat film can be formed.

The present inventors have further earnestly studied and found that a polymer shown by the following general formula (1) has thermosetting property equivalent to those of conventional underlayer film materials not only in air but also in an inert gas by the action of the substituent with a triple bond introduced to the partial structure represented by $W_1$, and generates no by-product during the curing reaction at the triple bond serving as a crosslinking group. Moreover, the thermal flowability is favorable. Accordingly, the polymer provides a composition for forming an organic film with high filling and planarizing properties, favorable dry etching resistance, and such heat resistance that the coating film thickness does not fluctuate due to the thermal decomposition even when a CVD hard mask is formed. These findings have led to the completion of the present invention.

Specifically, the present invention provides a composition for forming an organic film, comprising:

a polymer having a partial structure shown by the following general formula (1) as a repeating unit; and an organic solvent,

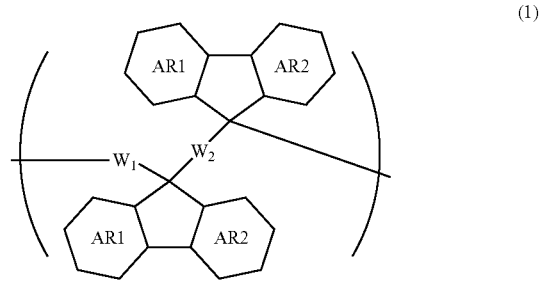

(1)

wherein each of AR1 and AR2 represents a benzene ring or a naphthalene ring which optionally have a substituent; $W_1$ represents any shown by the following general formulae (2), (4), and (6), and the polymer optionally contains two or more kinds of $W_1$; and $W_2$ represents a divalent organic group having 6 to 80 carbon atoms and at least one or more aromatic rings,

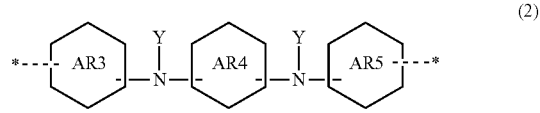

(2)

wherein AR3, AR4, and AR5 each represent a benzene ring or a naphthalene ring which optionally have a substituent, and aromatic rings of AR3 and AR4, or AR4 and AR5, optionally form a bridge structure via carbon atoms to which hydrogen atoms have been bonded on the aromatic ring; and Y represents a substituent shown by the following general formula (3),

$$Y=\!\!-\!\!R_3\!\!=\!\!R_4 \qquad (3)$$

wherein $R_3$ represents a single bond or a divalent organic group having 20 or fewer carbon atoms; and $R_4$ represents hydrogen or a monovalent organic group having 20 or fewer carbon atoms,

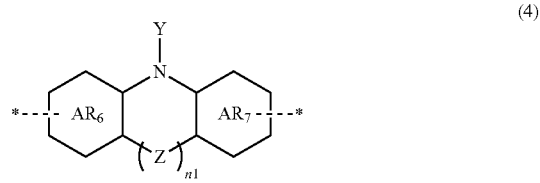

(4)

wherein $AR_6$ and $AR_7$ each represent a benzene ring or a naphthalene ring which optionally have a substituent; n1 represents 0 or 1, when n1=0, $AR_6$ and $AR_7$ form no bridge structure between aromatic rings thereof via Z, and when n1=1, $AR_6$ and $AR_7$ form a bridge structure via Z; Z represents a single bond or any in the following general formula (5); and Y represents a substituent shown by the general formula (3),

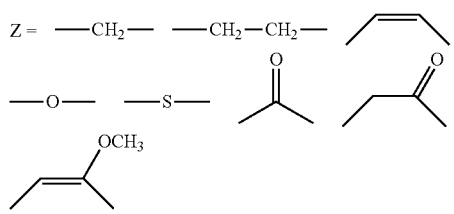
(5)

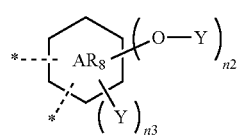
(6)

wherein $AR_8$ represents a benzene ring, a naphthalene ring, an anthracene ring, a phenanthrene ring, or a pyrene ring; Y represents a substituent shown by the general formula (3); and n2 and n3 represent integers satisfying relations of $0 \leq n2 \leq 4$, $0 \leq n3 \leq 4$, and $1 \leq n2+n3 \leq 4$.

Further, the present invention provides a polymer comprising a partial structure shown by the following general formula (1) as a repeating unit,

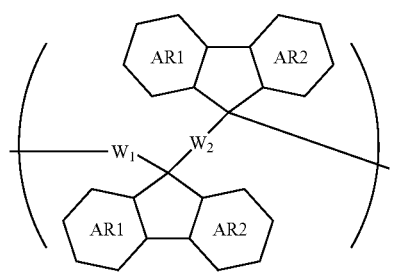
(1)

wherein each of AR1 and AR2 represents a benzene ring or a naphthalene ring which optionally have a substituent; $W_1$ represents any shown by the following general formulae (2), (4), and (6), and the polymer optionally contains two or more kinds of $W_1$; and $W_2$ represents a divalent organic group having 6 to 80 carbon atoms and at least one or more aromatic rings;

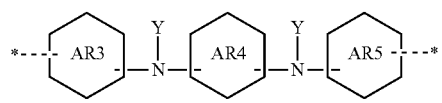
(2)

wherein AR3, AR4, and AR5 each represent a benzene ring or a naphthalene ring which optionally have a substituent, and aromatic rings of AR3 and AR4, or AR4 and AR5, optionally form a bridge structure via carbon atoms to which hydrogen atoms have been bonded on the aromatic ring; and Y represents a substituent shown by the following general formula (3), $$Y = -R_3 = R_4 \qquad (3)$$

wherein $R_3$ represents a single bond or a divalent organic group having 20 or fewer carbon atoms; and $R_4$ represents hydrogen or a monovalent organic group having 20 or fewer carbon atoms,

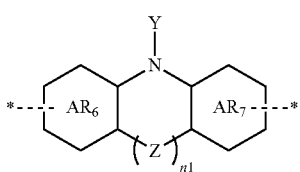
(4)

wherein $AR_6$ and $AR_7$ each represent a benzene ring or a naphthalene ring which optionally have a substituent; n1 represents 0 or 1, when n1=0, $AR_6$ and $AR_7$ form no bridge structure between aromatic rings thereof via Z, and when n1=1, $AR_6$ and $AR_7$ form a bridge structure via Z; Z represents a single bond or any in the following general formula (5); and Y represents a substituent shown by the general formula (3),

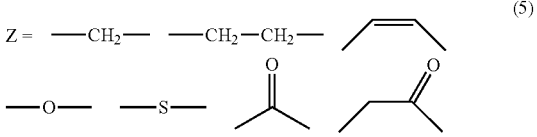
(5)

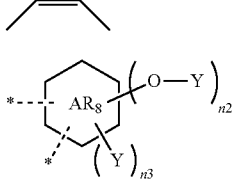
(6)

wherein $AR_8$ represents a benzene ring, a naphthalene ring, an anthracene ring, a phenanthrene ring, or a pyrene ring; Y represents a substituent shown by the general formula (3); and n2 and n3 represent integers satisfying relations of $0 \leq n2 \leq 4$, $0 \leq n3 \leq 4$, and $1 \leq n2+n3 \leq 4$.

Hereinafter, the present invention will be described in detail, but the present invention is not limited thereto.
[Polymer]

The inventive composition for forming an organic film contains a polymer with a partial structure shown by the following general formula (1) as a repeating unit.

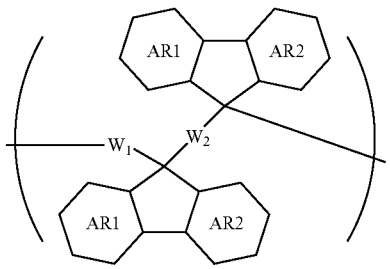
(1)

In the general formula (1), AR1 and AR2 are each a benzene ring or a naphthalene ring which optionally have a substituent. $W_1$ is any shown by the following general formulae (2), (4), and (6), and two or more kinds of $W_1$ are optionally used in combination. $W_2$ is a divalent organic group having 6 to 80 carbon atoms and at least one or more aromatic rings.

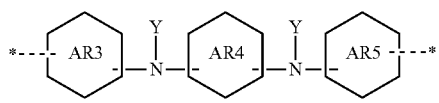

(2)

In the general formula (2), AR3, AR4, and AR5 are each a benzene ring or a naphthalene ring which optionally have a substituent. Aromatic rings of AR3 and AR4, or AR4 and AR5, may form a bridge structure in place of hydrogen atoms which have been bonded to carbon atoms on the aromatic ring. Y is a substituent shown by the following general formula (3).

(3)

$R_3$ is a single bond or a divalent organic group having 20 or fewer carbon atoms. $R_4$ is hydrogen or a monovalent organic group having 20 or fewer carbon atoms.

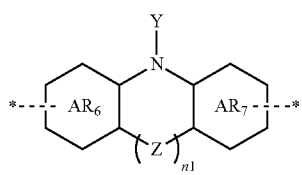

(4)

In the general formula (4), $AR_6$ and $AR_7$ are each a benzene ring or a naphthalene ring which optionally have a substituent. n1 represents 0 or 1. When n1=0, no bridge structure is formed between aromatic rings of $AR_6$ and $AR_7$ via Z. When n1=1, $AR_6$ and $AR_7$ form a bridge structure via Z. Z is a single bond or any in the following general formula (5). Y is a substituent shown by the general formula (3).

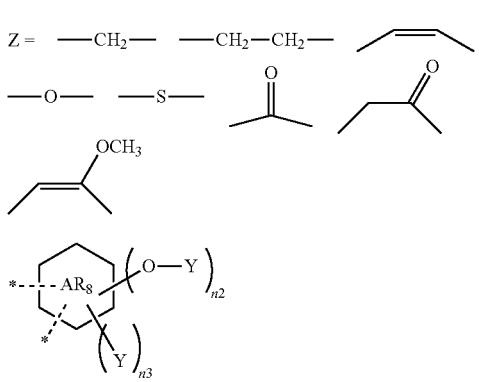

(5)

(6)

In the general formula (6), $AR_8$ is a benzene ring, a naphthalene ring, an anthracene ring, a phenanthrene ring, or a pyrene ring. Y is a substituent shown by the general formula (3). n2 and n3 are integers satisfying relations of $0 \leq n2 \leq 4$, $0 \leq n3 \leq 4$, and $1 \leq n2+n3 \leq 4$.

Specific examples of the partial structure shown by the general formula (2) include the following. These optionally have a substituent on aromatic rings thereof. Examples of the substituent include a hydroxyl group, a trifluoromethyl group, an alkyl group having 1 to 10 carbon atoms, an alkynyl group and alkenyl group having 3 to 10 carbon atoms, an alkyloxy group having 1 to 10 carbon atoms, an alkynyloxy group and alkenyloxy group having 3 to 10 carbon atoms, an aryl group having 6 to 10 carbon atoms, a thiol group, a nitro group, a halogen group, a nitrile group, a sulfonic acid group, an alkoxycarbonyl group having 1 to 10 carbon atoms, an alkanoyloxy group having 1 to 10 carbon atoms, etc. Among these, indenofluorene is preferable from the viewpoints of imparting heat resistance and etching resistance.

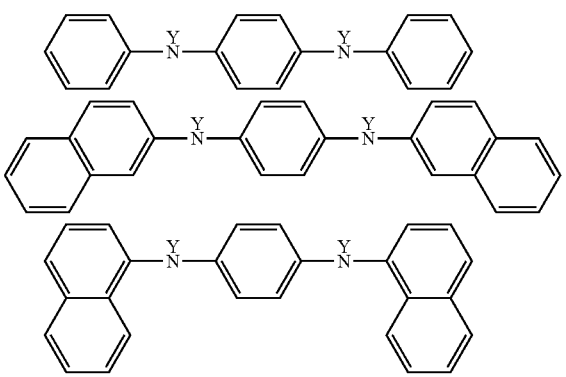

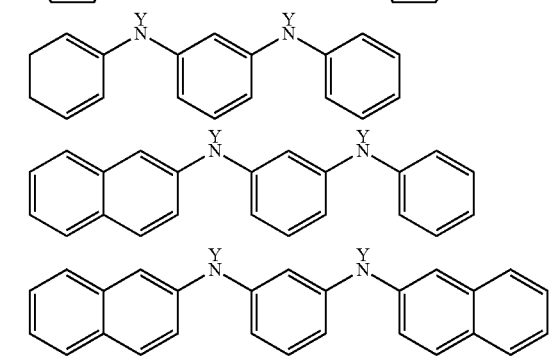

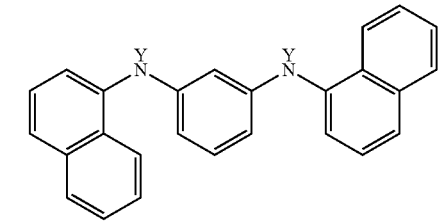

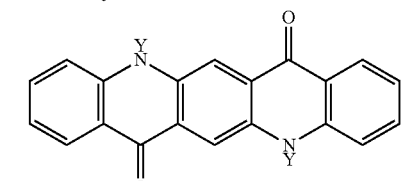

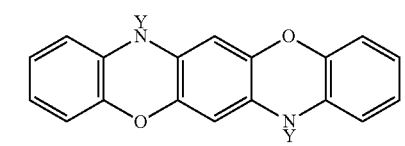

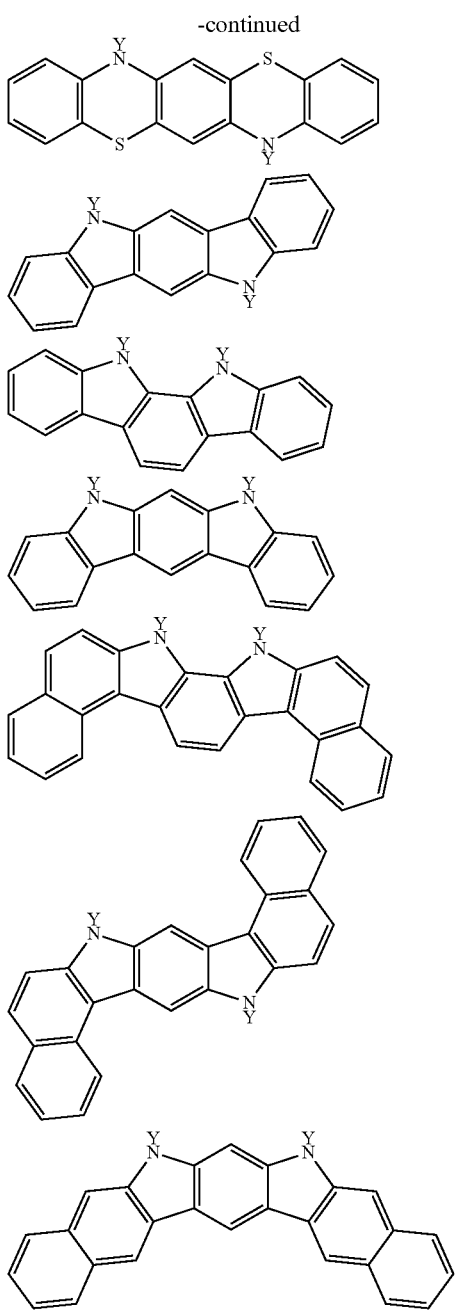
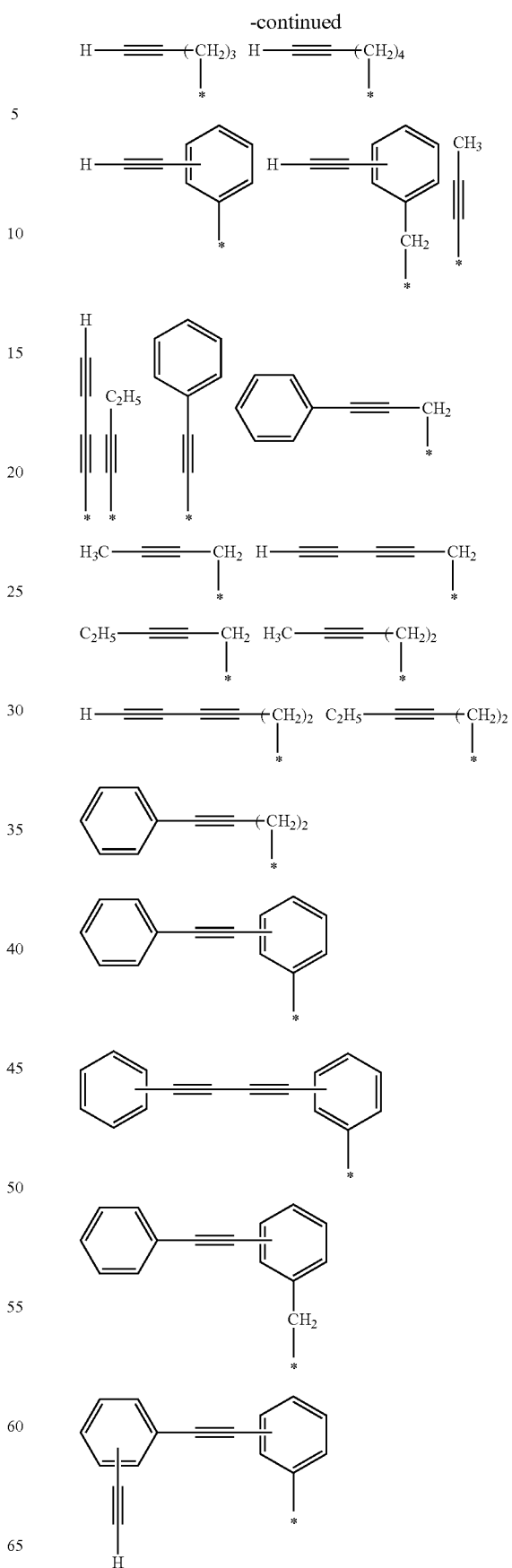
Moreover, specific examples of the substituent Y shown by the general formula (3) include the following. In the following formulae, * represents a binding site to a N atom in the formula (2). Above all, a propargyl group and a butynyl group are preferable in views of ease of synthesizing the intermediate and availability of the industrial raw materials.

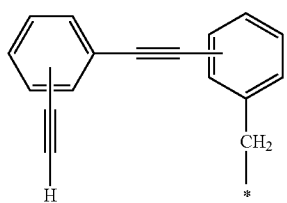

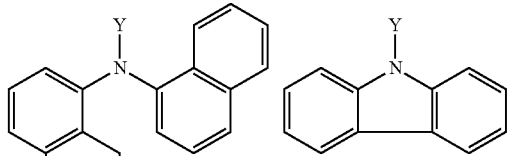

Specific examples of the partial structure shown by the general formula (4) include the following. These optionally have a substituent on aromatic rings thereof. Examples of the substituent include a hydroxyl group, a trifluoromethyl group, an alkyl group having 1 to 10 carbon atoms, an alkynyl group and alkenyl group having 3 to 10 carbon atoms, an alkyloxy group having 1 to 10 carbon atoms, an alkynyloxy group and alkenyloxy group having 3 to 10 carbon atoms, an aryl group having 6 to 10 carbon atoms, a thiol group, a nitro group, a halogen group, a nitrile group, a sulfonic acid group, an alkoxycarbonyl group having 1 to 10 carbon atoms, an alkanoyloxy group having 1 to 10 carbon atoms, etc. Among these, one having phenylnaphthylamine or carbazole as the partial structure is preferable from the viewpoints of availability of the industrial raw materials, heat resistance, and solvent solubility. In the following formulae, Y is as defined above.

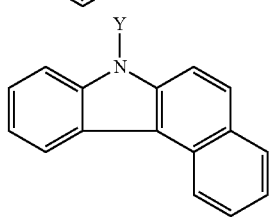

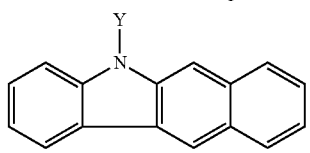

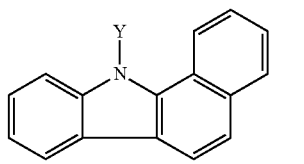

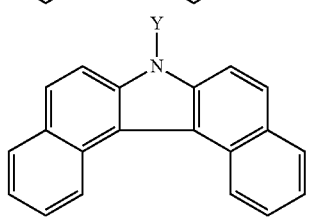

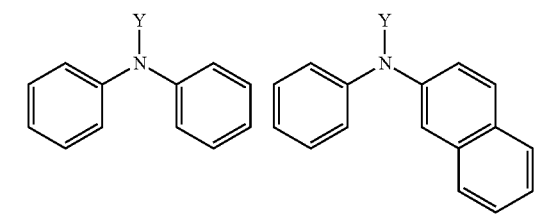

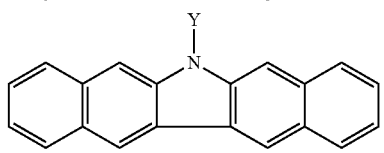

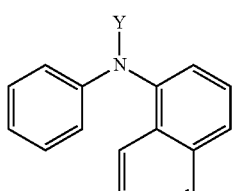

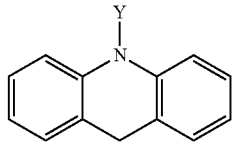

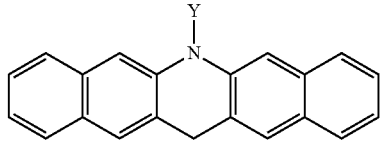

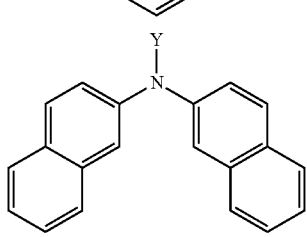

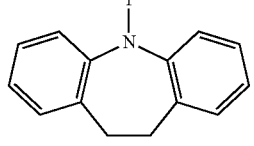

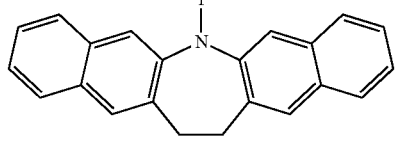

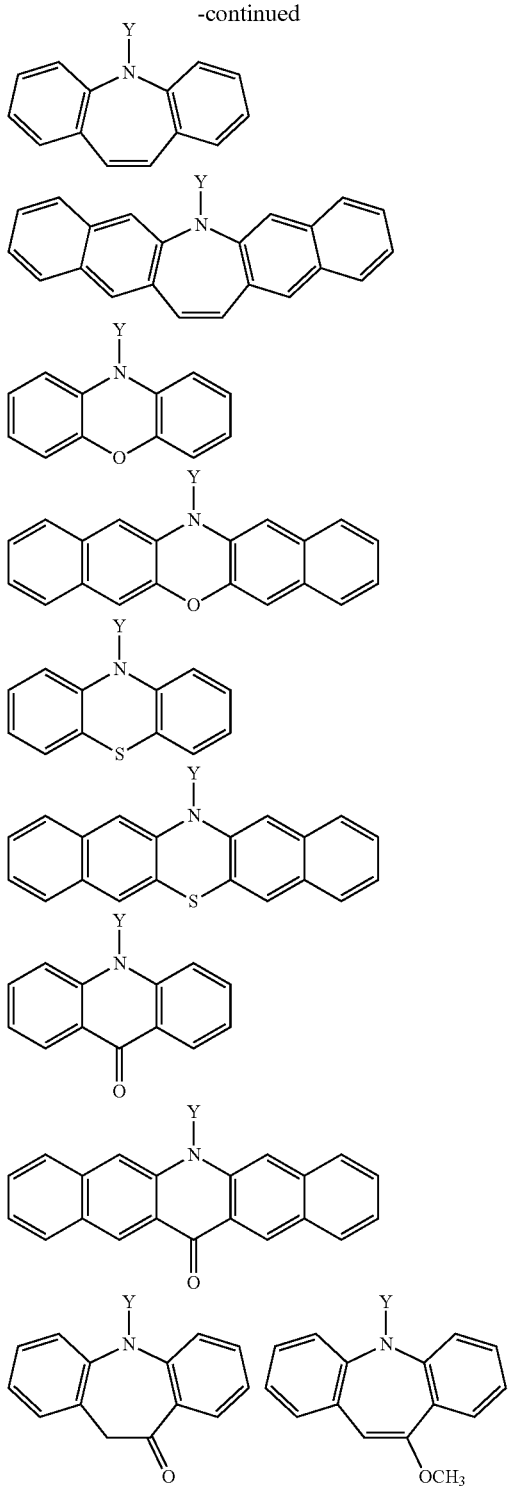

alkanoyloxy group having 1 to 10 carbon atoms, etc. Among these, from the viewpoints of availability of the raw material and heat resistance, one having a naphthalene ring is preferable.

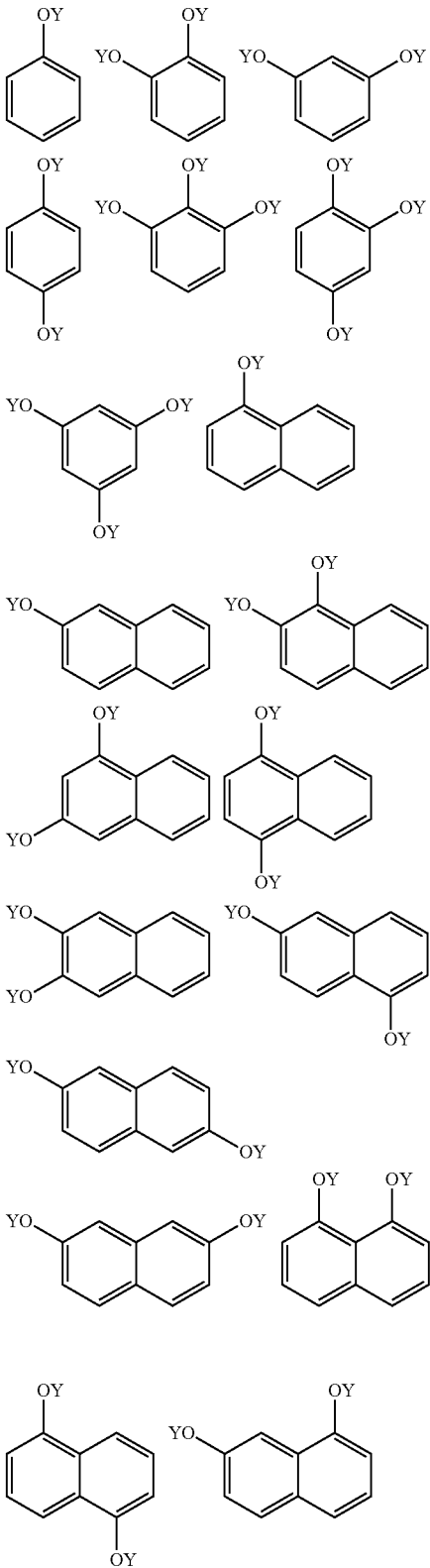

Specific examples of the partial structure shown by the general formula (6) include the following. These optionally have a substituent on aromatic rings thereof. Examples of the substituent include a hydroxyl group, a trifluoromethyl group, an alkyl group having 1 to 10 carbon atoms, an alkyloxy group having 1 to 10 carbon atoms, an aryl group having 6 to 10 carbon atoms, a thiol group, a nitro group, a halogen group, a nitrile group, a sulfonic acid group, an alkoxycarbonyl group having 1 to 10 carbon atoms, an

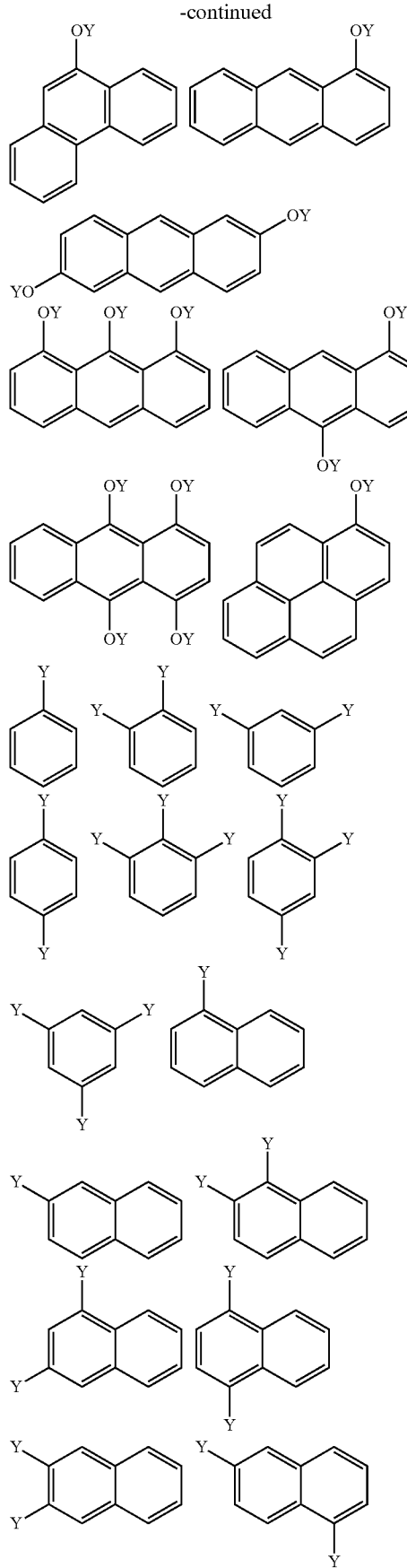
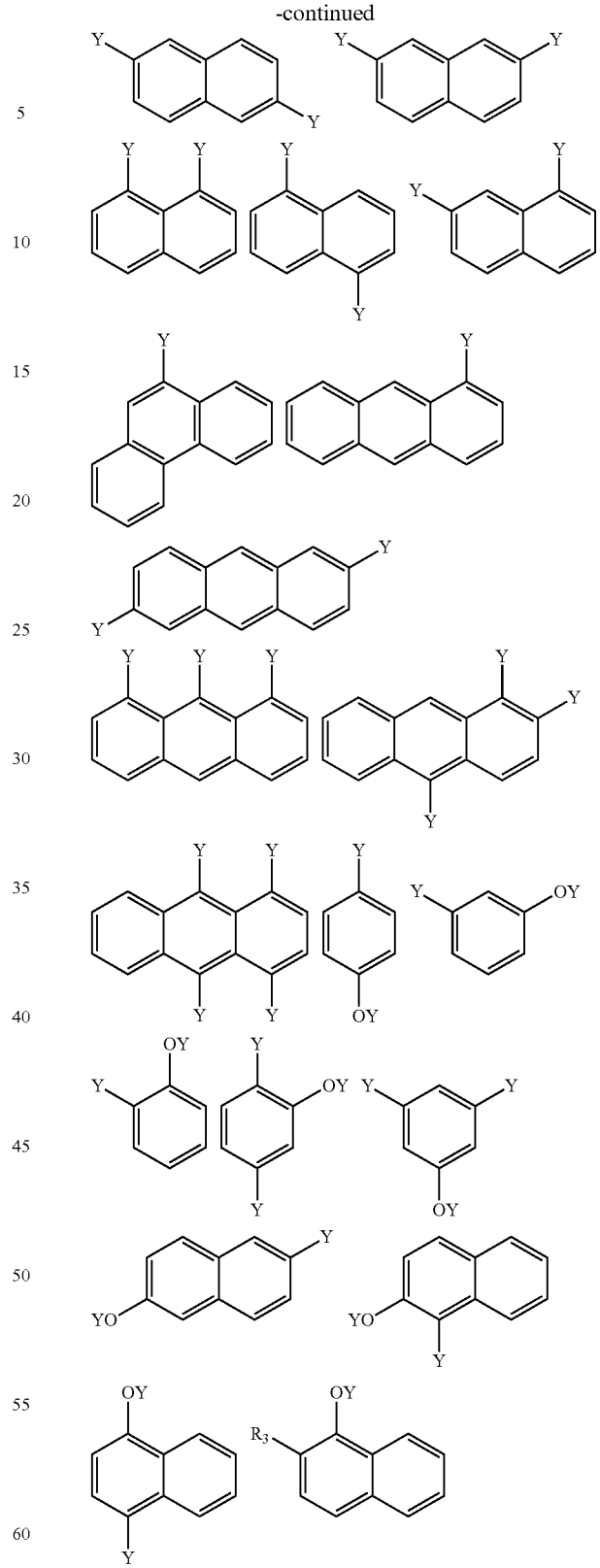
Further, the divalent organic group represented by $W_2$ in the polymer shown by the general formula (1) is preferably any of the following.

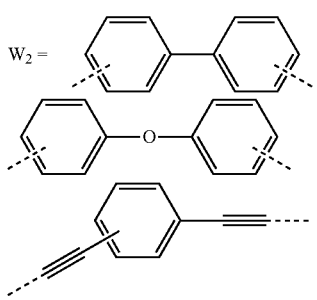

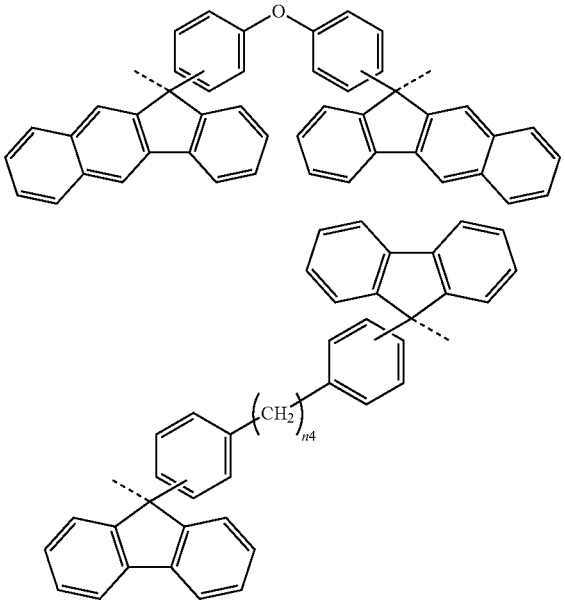

Examples of the partial structure shown by the general formula (1) include ones shown by the following structural formulae, and the like. These optionally have a substituent on aromatic rings thereof. Examples of the substituent include a hydroxyl group, a trifluoromethyl group, an alkyl group having 1 to 10 carbon atoms, an alkynyl group and alkenyl group having 3 to 10 carbon atoms, an alkyloxy group having 1 to 10 carbon atoms, an alkynyloxy group and alkenyloxy group having 3 to 10 carbon atoms, an aryl group having 6 to 10 carbon atoms, a thiol group, a nitro group, a halogen group, a nitrile group, a sulfonic acid group, an alkoxycarbonyl group having 1 to 10 carbon atoms, an alkanoyloxy group having 1 to 10 carbon atoms, etc. In the following formulae, n4 represents an integer of 1 to 10.

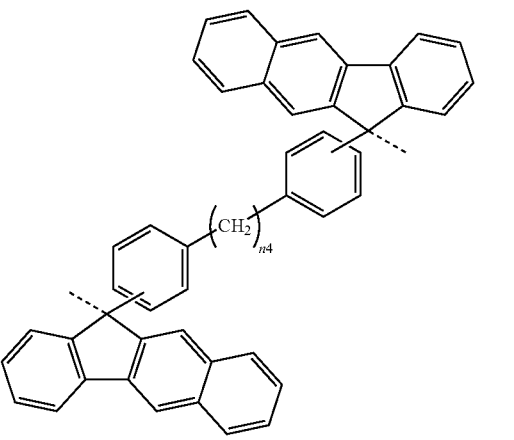

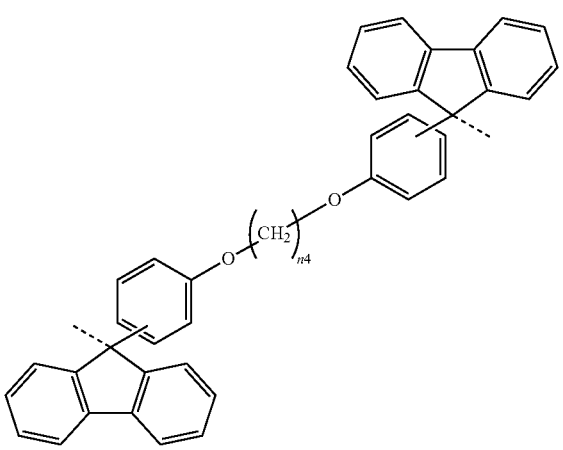

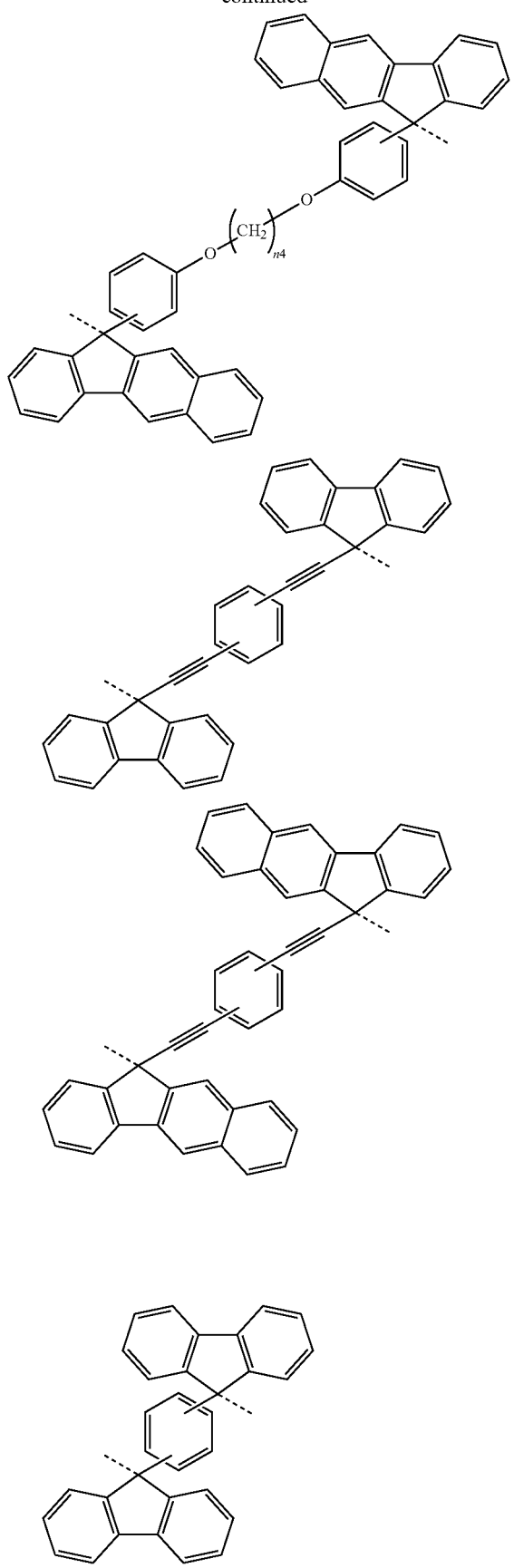
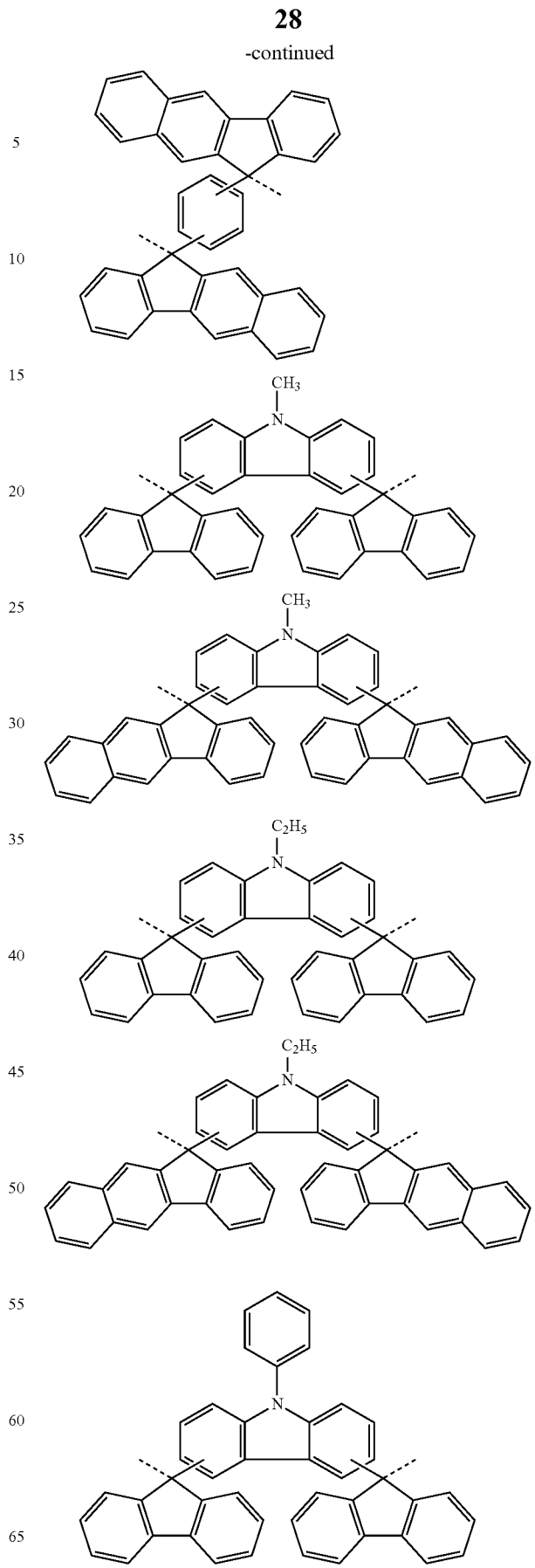

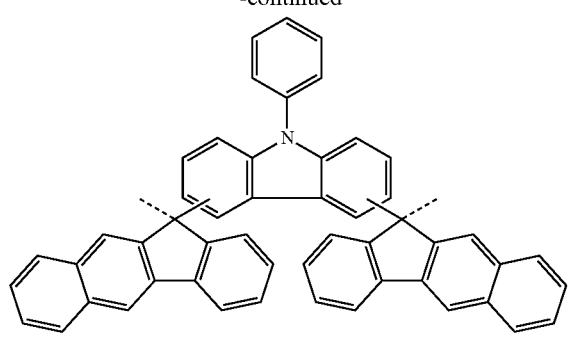

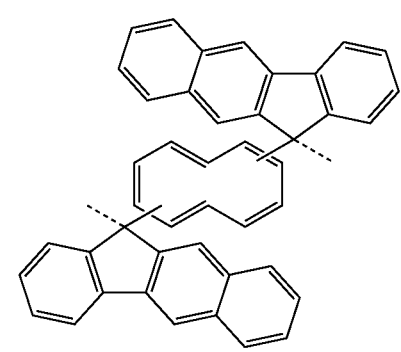

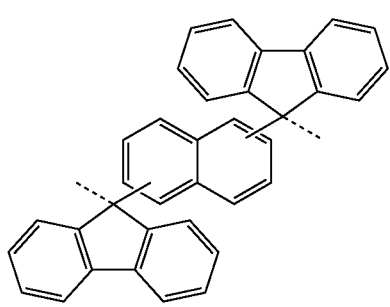

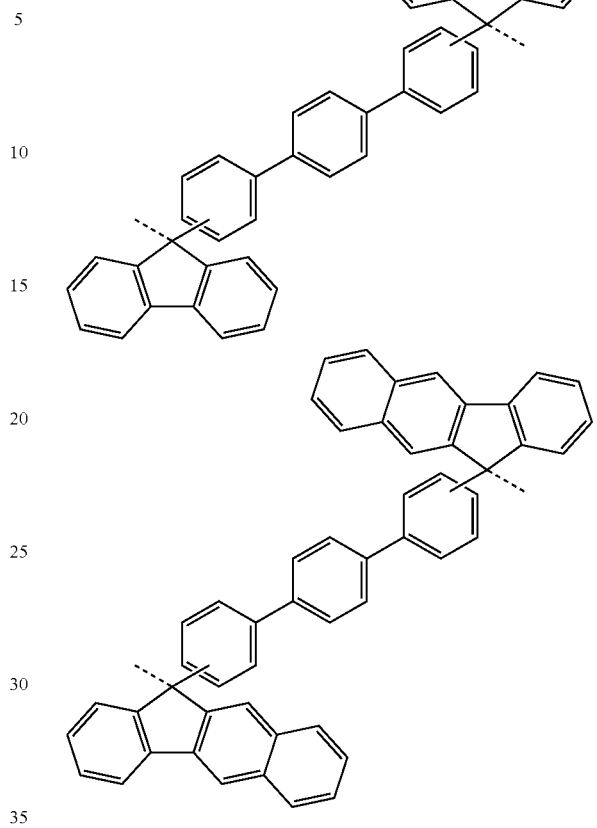

Furthermore, the polymer has a weight-average molecular weight (Mw) of preferably 1000 to 5000, more preferably 1000 to 4000.

With such a molecular weight, the solubility into the organic solvent can be guaranteed, and the generation of sublimation product can be suppressed during baking. Moreover, the polymer has favorable thermal flowability. Accordingly, the composition blended with the polymer can not only favorably fill a fine structure formed on a substrate but also form an organic film while planarizing the entire substrate.

Furthermore, the inventive polymer may have any partial structure shown by the following general formulae as a repeating unit. When the inventive polymer has these partial structures, the carbon density is increased, so that excellent twisting resistance and etching resistance can be imparted.

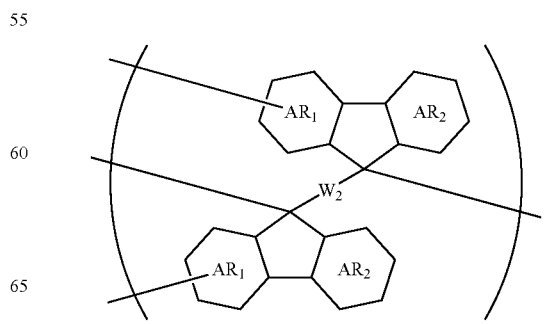

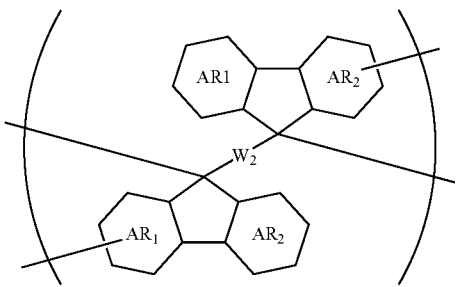

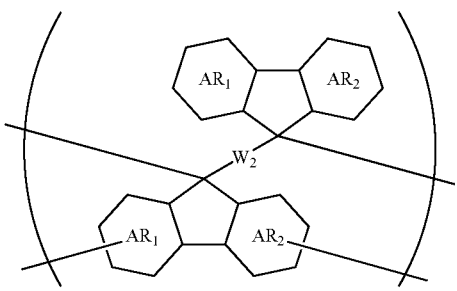

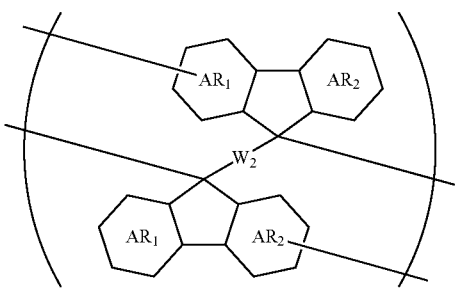

[Polymer Production Method 1]

The inventive polymer can be synthesized by polycondensation using a tertiary alcohol or alkyl ether compound as shown below. In the polycondensation, one or two or more kinds of the tertiary alcohol or alkyl ether each of which has $W_1$ or $W_2$ as a linking group can be used. These can be appropriately selected and combined according to a required property. In the following scheme, AR1, AR2, $W_1$, and $W_2$ are as defined above, and R represents a hydrogen atom or an alkyl group having 1 to 10 carbon atoms.

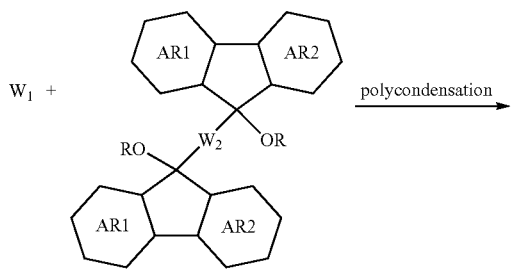

The polymer can be obtained generally in an organic solvent in the presence of an acid catalyst at room temperature or under cooling or heating as necessary. Examples of the acid catalyst that can be used include inorganic acids such as hydrochloric acid, hydrobromic acid, sulfuric acid, nitric acid, phosphoric acid, and heteropoly acid; organic acids such as oxalic acid, trifluoroacetic acid, methanesulfonic acid, benzenesulfonic acid, p-toluenesulfonic acid, and trifluoromethanesulfonic acid; and Lewis acids such as aluminum trichloride, aluminum ethoxide, aluminum isopropoxide, boron trifluoride, boron trichloride, boron tribromide, tin tetrachloride, tin tetrabromide, dibutyltin dichloride, dibutyltin dimethoxide, dibutyltin oxide, titanium tetrachloride, titanium tetrabromide, titanium(IV) methoxide, titanium(IV) ethoxide, titanium(IV) isopropoxide, and titanium(IV) oxide.

The solvent to be used is not particularly limited. Examples thereof include alcohols such as methanol, ethanol, isopropyl alcohol, butanol, ethylene glycol, propylene glycol, diethylene glycol, glycerol, ethylene glycol monomethyl ether, and propylene glycol monomethyl ether; ethers such as diethyl ether, dibutyl ether, diethylene glycol diethyl ether, diethylene glycol dimethyl ether, tetrahydrofuran, and 1,4-dioxane; chlorinated solvents such as methylene chloride, chloroform, dichloroethane, and trichloroethylene; hydrocarbons such as hexane, heptane, benzene, toluene, xylene, and cumene; nitriles such as acetonitrile; ketones such as acetone, ethyl methyl ketone, and isobutyl methyl ketone; esters such as ethyl acetate, n-butyl acetate, and propylene glycol methyl ether acetate; and non-protic polar solvents such as dimethylsulfoxide, N,N-dimethylformamide, and hexamethylphosphoric triamide. One of these or a mixture of two or more thereof can be used.

The reaction method includes a method in which the compound constituted of AR1, AR2, and $W_1$ and an aldehyde, tertiary alcohol, or the like are used as monomers, and such monomers and an acid catalyst are charged at once; a method in which the monomers are dispersed or dissolved, and then a catalyst is added at once or intermittently; a method in which a catalyst is diluted with a solvent and then added dropwise; a method in which a catalyst is dispersed or dissolved, and then the monomers are added at once or intermittently; and a method in which the monomers are diluted with a solvent and added dropwise. After completion of the reaction, the resultant may be diluted with an organic solvent and then subjected to liquid separation and washing to remove the catalyst having been used for the reaction and to collect the target product.

Further, in these reactions, another compound different from the above-described monomers but capable of polycondensation can be used to carry out co-polycondensation. Examples of such co-polycondensable compound include the following. These optionally have a substituent on aromatic rings thereof. Examples of the substituent include a vinyl group, an allyl group, a propargyl group, an aryl group, an allyloxy group, etc. From the viewpoints of imparting etching resistance and solvent solubility, the polycondensable compound preferably has a naphthalene ring, a fluorene structure, or a carbazole structure. Such a compound can be added when the polycondensation takes place by the aforementioned method, or added at another timing and then subjected to the co-polycondensation.

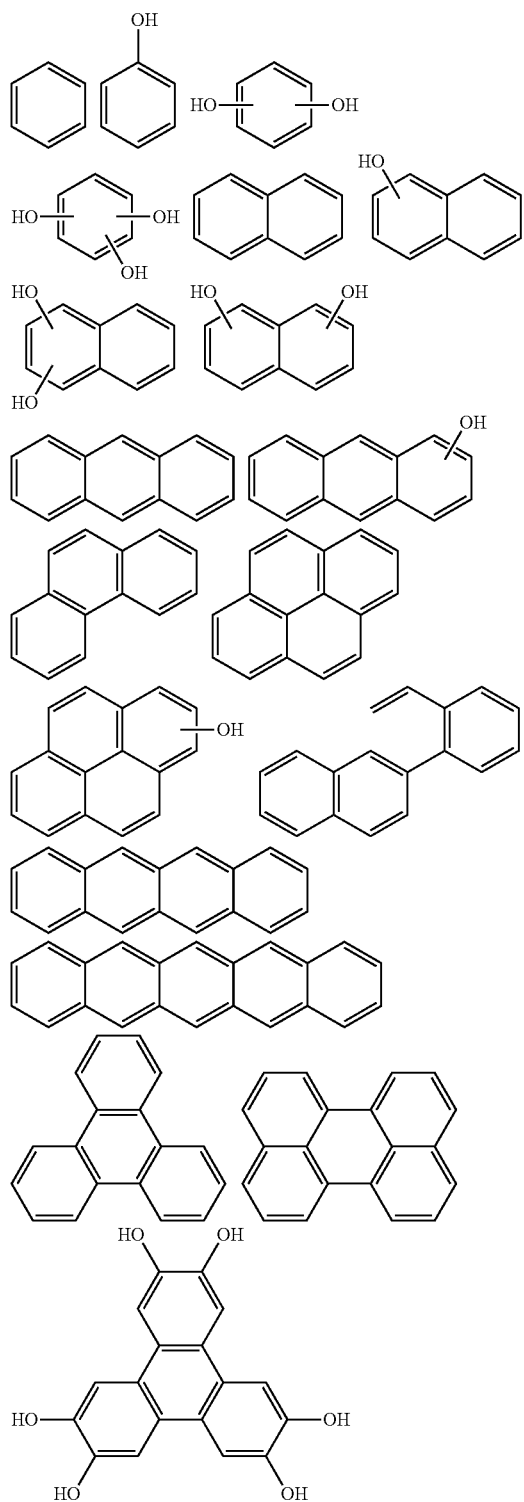

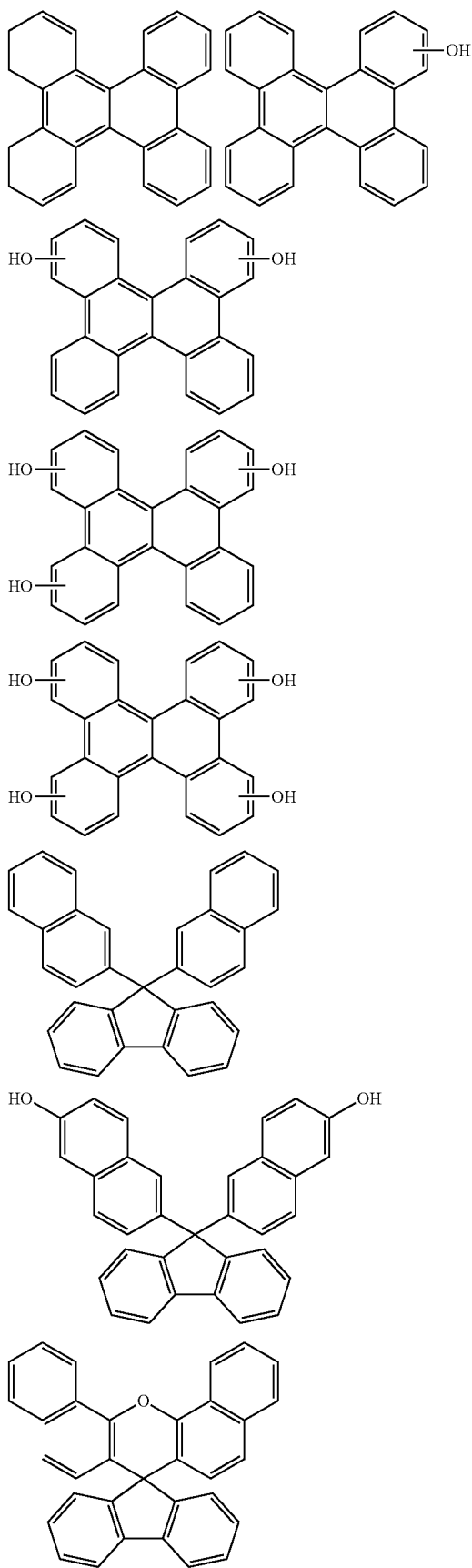

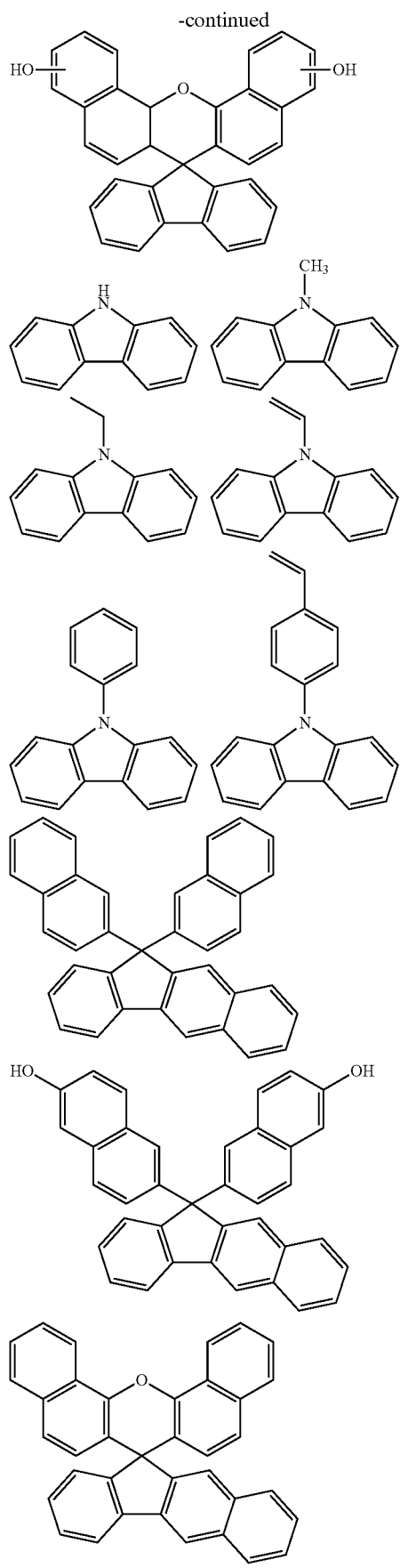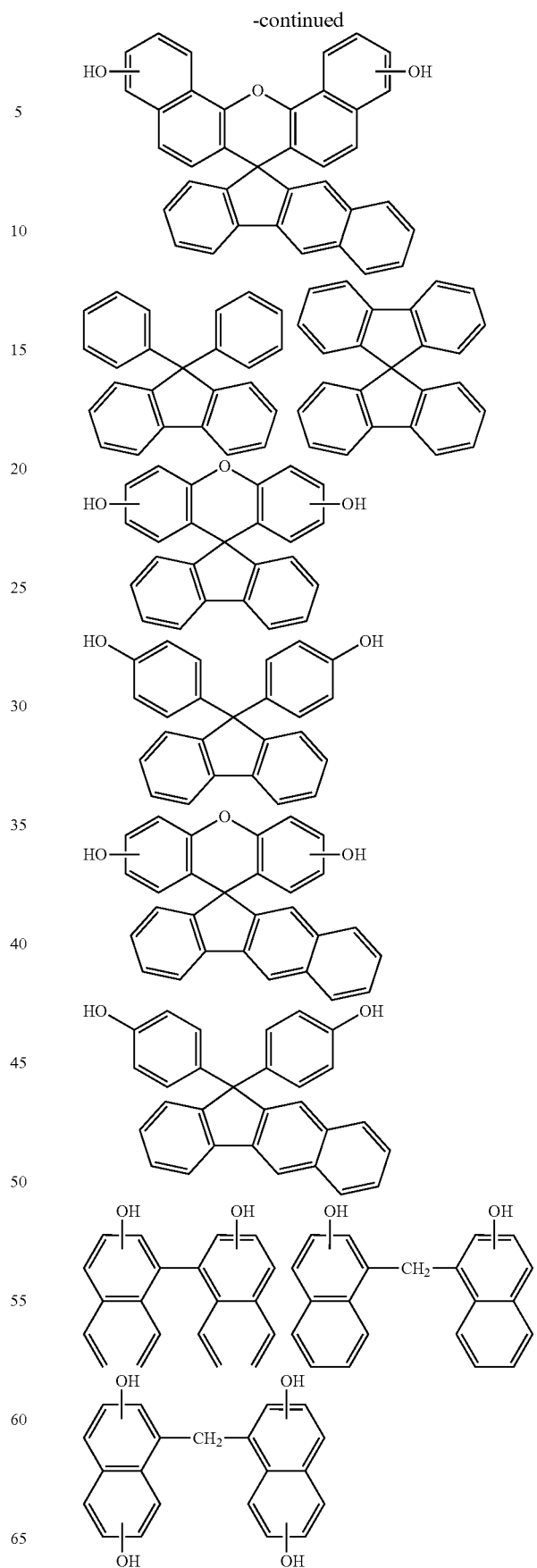

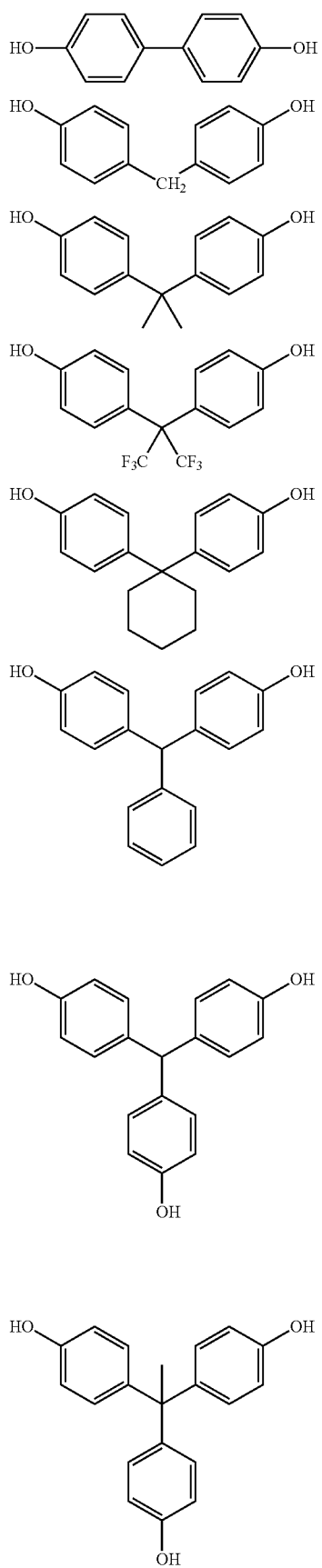
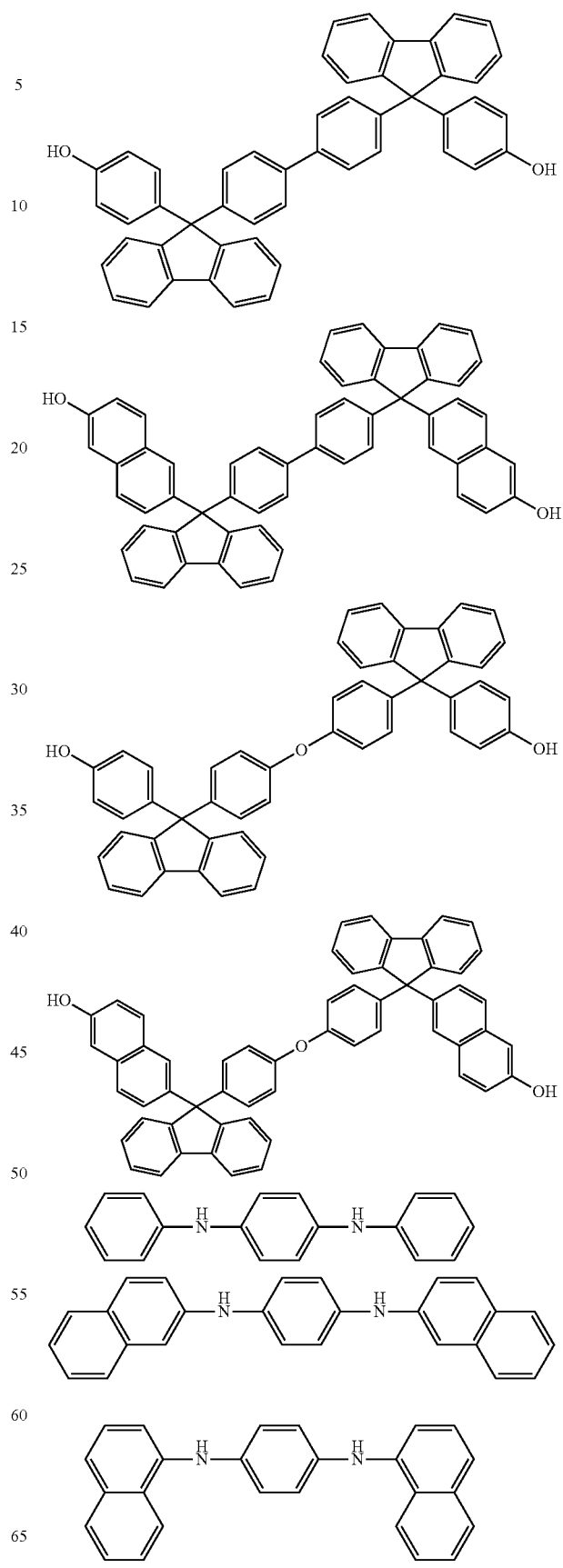

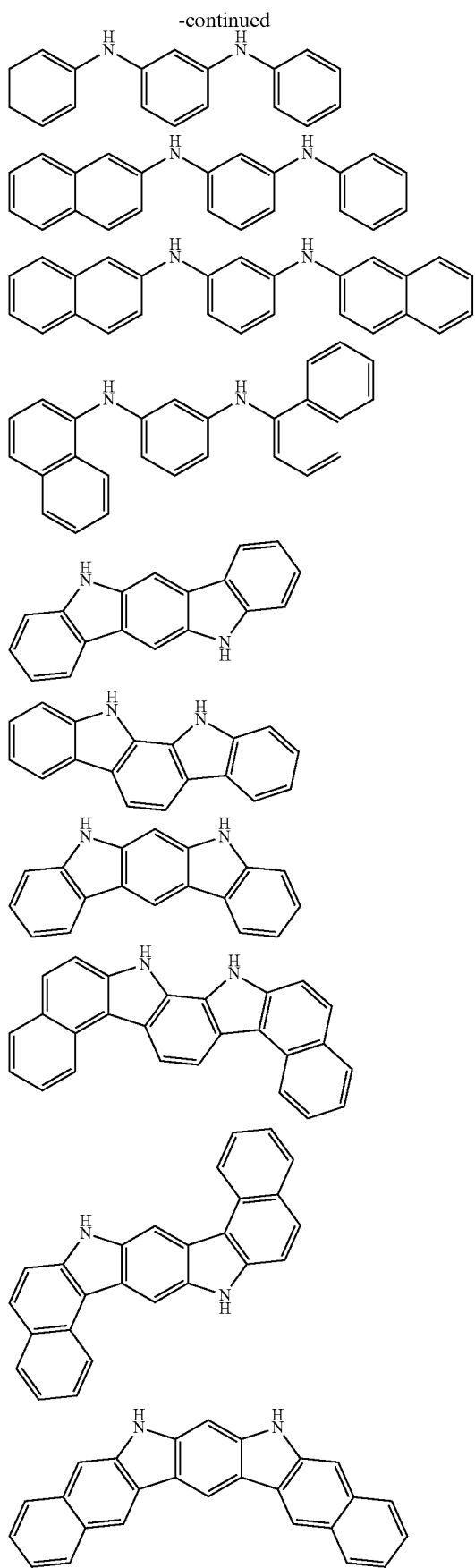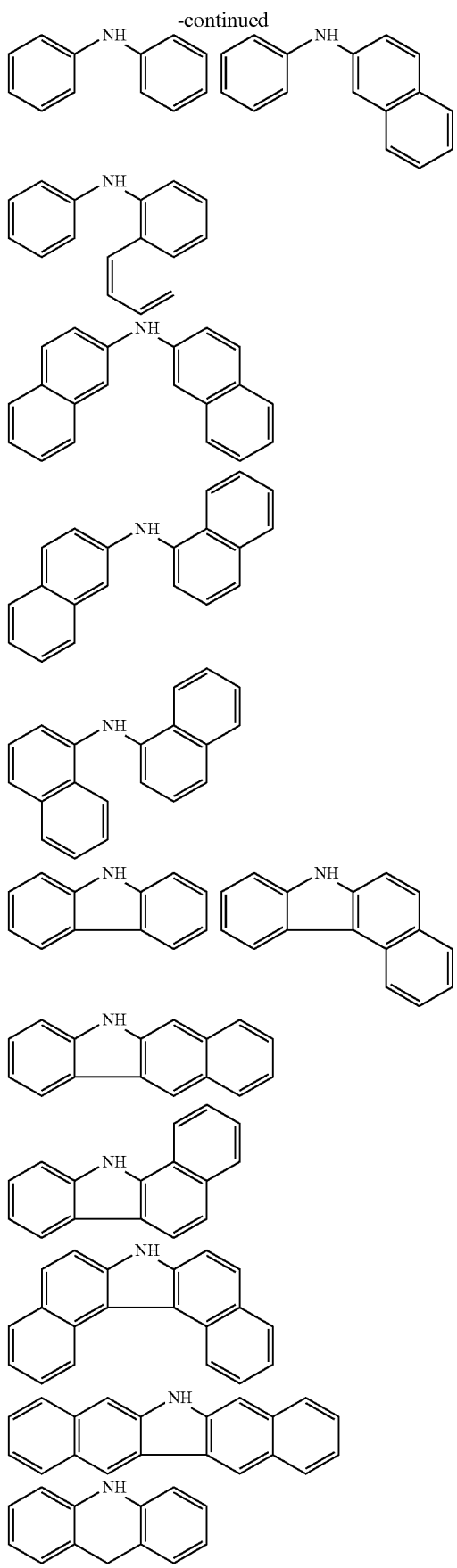

-continued

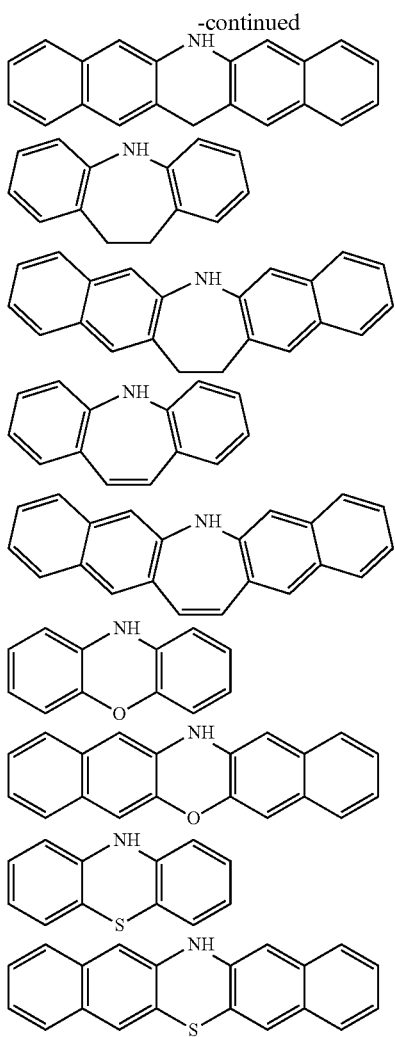

The organic solvent used in the liquid separation and washing is not particularly limited, as long as it is capable of dissolving the target product and being separated into two layers when mixed with water. Examples of the organic solvent include hydrocarbons such as hexane, heptane, benzene, toluene, and xylene; esters such as ethyl acetate, n-butyl acetate, and propylene glycol methyl ether acetate; ketones such as methyl ethyl ketone, methyl amyl ketone, cyclohexanone, and methyl isobutyl ketone; ethers such as diethyl ether, diisopropyl ether, methyl-tert-butyl ether, and ethylcyclopentylmethyl ether; chlorinated solvents such as methylene chloride, chloroform, dichloroethane, and trichloroethylene; mixtures thereof; and the like. As the water used for washing in this event, generally, what is called deionized water or ultrapure water may be used. The washing may be performed once or more, preferably approximately once to five times, because washing ten times or more does not always produce the full washing effects thereof.

In the liquid separation and washing, the washing may be performed with a basic aqueous solution to remove acidic components in the system. Specific examples of the base include hydroxides of alkaline metals, carbonates of alkaline metals, hydroxides of alkali earth metals, carbonates of alkali earth metals, ammonia, organic ammonium, etc.

Further, in the liquid separation and washing, the washing may be performed with an acidic aqueous solution to remove metal impurities or basic components in the system. Specific examples of the acid include inorganic acids such as hydrochloric acid, hydrobromic acid, sulfuric acid, nitric acid, phosphoric acid, and heteropoly acid; organic acids such as oxalic acid, fumaric acid, maleic acid, trifluoroacetic acid, methanesulfonic acid, benzenesulfonic acid, p-toluenesulfonic acid, and trifluoromethanesulfonic acid; etc.

The liquid separation and washing may be performed with any one of the basic aqueous solution and the acidic aqueous solution, or can be performed with a combination of the two. The liquid separation and washing is preferably performed with the basic aqueous solution and the acidic aqueous solution in this order from the viewpoint of removing the metal impurities.

After the liquid separation and washing with the basic aqueous solution and/or acidic aqueous solution, washing with neutral water may be successively performed. This washing may be performed once or more, preferably approximately once to five times. As the neutral water, deionized water, ultrapure water, or the like mentioned above may be used. The washing may be performed once or more, but if the washing is not performed sufficiently, the basic components and the acidic components may not be removed in some cases. The washing is performed preferably approximately once to five times because washing ten times or more does not always produce the full washing effects.

Further, the reaction product after the liquid separation operation can also be collected as a powder by concentrating and drying the solvent or crystallizing the reaction product under reduced pressure or normal pressure. Alternatively, the reaction product can be retained in a solution state with an appropriate concentration to improve the workability in preparing an organic film composition. The concentration at this point is preferably 0.1 to 50 mass %, more preferably 0.5 to 30 mass %. With such a concentration, the viscosity is hardly increased, making it possible to prevent degradation of the workability; in addition, since the amount of the solvent is not excessive, the solution can be prepared economically.

The solvent in this event is not particularly limited, as long as it is capable of dissolving the polymer. Specific examples of the solvent include ketones such as cyclohexanone and methyl-2-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate. One of these or a mixture of two or more thereof can be used.

[Polymer Production Method 2 (Alternative Method)]

Further, the polymers having the partial structure shown by (2) or (4) can also be obtained by a method as follows: first, an intermediate is obtained by polycondensation as in Polymer Production Method 1 described above using a compound having hydrogen on nitrogen as a substituent and a tertiary alcohol or alkyl ether compound (Step 1); then, the hydrogen atom(s) on nitrogen are substituted with Y (Step 2). AR1, AR2, AR3, AR4, AR5, AR6, AR7, $W_2$, R, and Y are as defined above.

(Step 1)

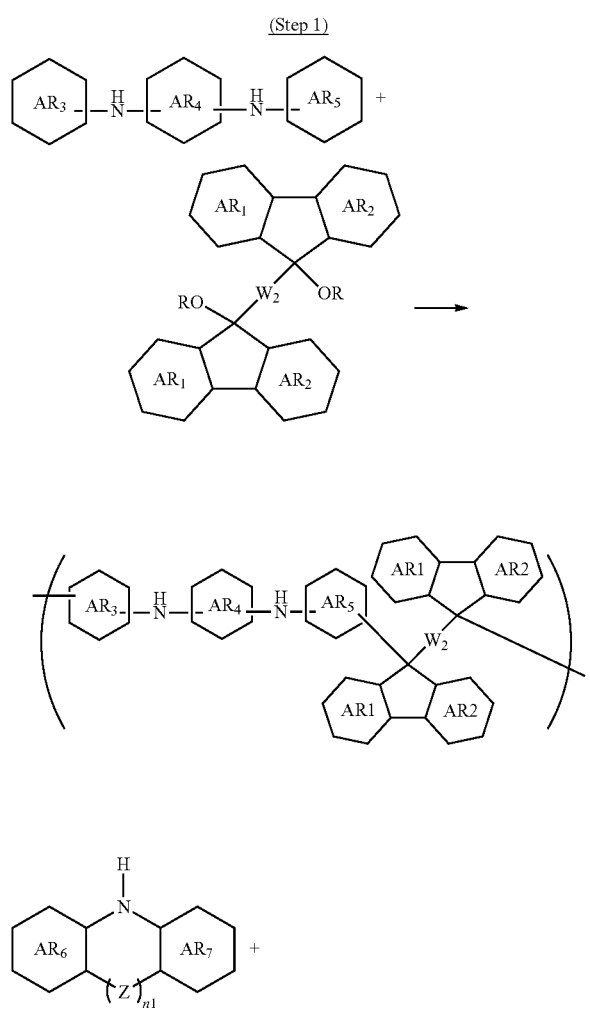

(Step 2)

Step 2 is not particularly limited, as long as the reaction enables the introduction of the structure of Y onto the nitrogen atom(s). Examples of the reaction include N-alkylation reaction using a halide, tosylate, or mesylate of Y and a base catalyst as shown in the above scheme; a coupling reaction using a transition metal catalyst; and other similar methods. In this scheme, X represents a halogen, a tosyl group, or a mesyl group.

Examples of the base catalyst used in the substitution reaction include inorganic base compounds such as sodium hydrogen carbonate, sodium carbonate, potassium carbonate, calcium carbonate, cesium carbonate, sodium hydroxide, potassium hydroxide, sodium hydride, and potassium phosphate; organic amine compounds such as triethylamine, pyridine, and N-methylmorpholine; etc. One of these may be used alone, or a combination of two or more thereof can be used. Meanwhile, in the case where a transition metal catalyst is used, it is possible to use copper catalysts such as powdered copper, copper chloride, copper bromide, copper iodide, copper acetate, copper hydroxide, and copper nitrate; palladium catalysts such as tris(dibenzylideneacetone)dipalladium and tetrakis(triphenylphosphine)palladium; etc. These can also be combined with any of the above-described base catalysts.

The solvent used in this alternative method is not particularly limited, as long as the solvent is inactive in the reaction. Examples of the solvent include ether-based solvents such as diethyl ether, tetrahydrofuran, and dioxane; aromatic solvents such as benzene, toluene, and xylene; acetonitrile, dimethylsulfoxide, N,N-dimethylformamide, N-methylpyrrolidone, water, etc. One of these can be used alone, or a mixture thereof can be used.

As to the reaction method and the compound collection method, the target product can be collected by the same methods as those in Polymer Production Method 1.

Furthermore, among the polymers having the partial structure shown by the general formula (6), the polymer having OY as the substituent can also be obtained by a method as follows: first, an intermediate is obtained by polycondensation as in Polymer Production Methods 1, 2 described above using a compound having a hydroxyl group as a substituent and a tertiary alcohol or alkyl ether compound (Step 1); then, Y is introduced to the hydroxyl group by a substitution reaction (Step 2).

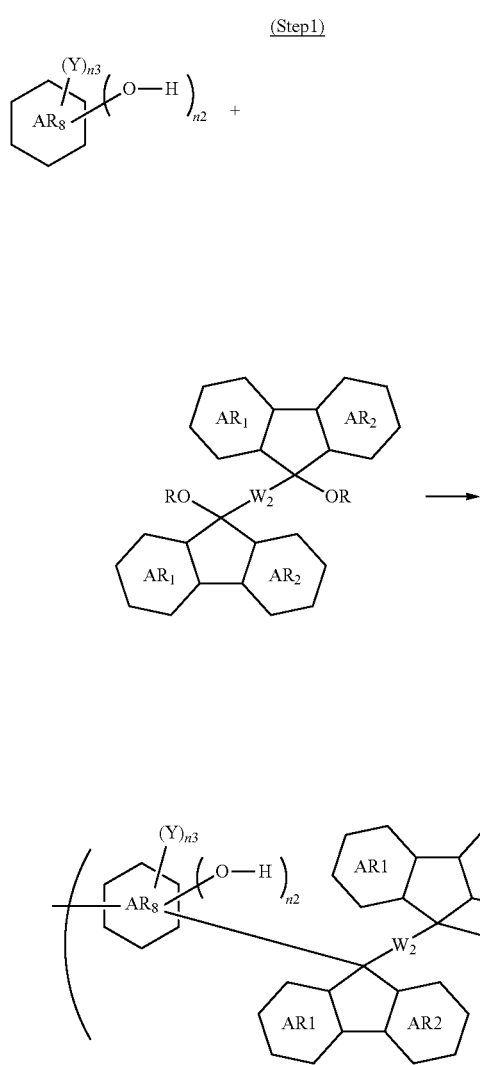

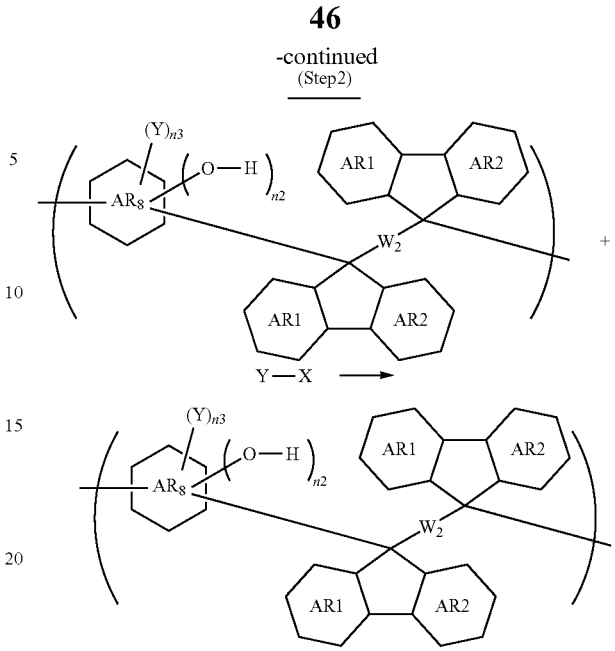

Step 2 is not particularly limited, as long as the reaction enables the introduction of Y. Examples of the reaction include a substitution reaction using a halide, tosylate, or mesylate of Y and a base catalyst; and other similar methods. In this scheme, X represents a halogen, a tosyl group, or a mesyl group.

Examples of the base catalyst used in the substitution reaction include inorganic base compounds such as sodium hydrogen carbonate, sodium carbonate, potassium carbonate, calcium carbonate, cesium carbonate, sodium hydroxide, potassium hydroxide, sodium hydride, and potassium phosphate; organic amine compounds such as triethylamine, pyridine, and N-methylmorpholine; etc. One of these may be used alone, or a combination of two or more thereof can be used.

The solvent used in this event is not particularly limited, as long as the solvent is inactive in the reaction. Examples of the solvent include ether-based solvents such as diethyl ether, tetrahydrofuran, and dioxane; aromatic solvents such as benzene, toluene, and xylene; acetonitrile, dimethylsulfoxide, N,N-dimethylformamide, N-methylpyrrolidone, water, etc., One of these can be used alone, or a mixture thereof can be used.

As to the reaction method and the compound collection method, the target product can be collected by the same methods as those in Polymer Production Methods 1, 2.

In preparing the polymer, two or more kinds of Y—X, or other halide, tosylate, and mesylate than Y—X can be combined, depending on the required performances. A compound containing a side chain structure for improving planarizing property or a rigid aromatic ring structure for improving etching resistance and heat resistance can be combined at a certain ratio. A composition for forming an organic film, which uses the polymer produced with such compounds, can achieve all of filling and planarizing properties and etching resistance at high levels.

As described above, the inventive polymer enables the composition for forming an organic film to have all of heat resistance to 400° C. or higher and high filling and planarizing properties.

Note that, in the present invention, the planarizing property refers to a performance of planarizing a substrate surface. For example, as shown in FIG. 1, a composition for forming an organic film containing the inventive polymer is capable of reducing a 100-nm step of a substrate 1 to 30 nm or less by coating the substrate 1 with a composition 3' for forming an organic film and heating the resultant to form an organic film 3. Note that the step profile shown in FIG. 1 represents a typical example of the step profile in a substrate for manufacturing a semiconductor device. It is a matter of course that the step profile of a substrate which can be planarized by the composition for forming an organic film containing the inventive polymer is not limited thereto.

[Composition for Forming Organic Film]

The present invention further provides a composition for forming an organic film, containing: (A) the inventive polymer described above; and (B) an organic solvent. Note that, in the inventive composition for forming an organic film, one kind of the inventive polymer can be used alone, or a combination of two or more kinds thereof can be used.

The organic solvent usable in the inventive composition for forming an organic film is not particularly limited, as long as the organic solvent is capable of dissolving constituent components contained in materials such as the polymer, an acid generator, a crosslinking agent, and other additives. Specifically, a solvent having a boiling point of lower than 180° C. can be used, such as solvents disclosed in paragraphs (0091) to (0092) of JP 2007-199653 A. Above all, it is preferable to use propylene glycol monomethyl ether acetate, propylene glycol monomethyl ether, 2-heptanone, cyclopentanone, cyclohexanone, and a mixture of two or more thereof.

Such a composition for forming an organic film can be applied by spin coating. Since the inventive polymer as described above is incorporated, the composition for forming an organic film has all of heat resistance to 400° C. or higher and high filling and planarizing properties.

Further, in the inventive composition for forming an organic film, it is also possible to add, as a component of the organic solvent, a high-boiling-point solvent having a boiling point of 180° C. or higher to the above-described solvent having a boiling point of lower than 180° C. (a mixture of the solvent having a boiling point of lower than 180° C. and the solvent having a boiling point of 180° C. or higher). The high-boiling-point organic solvent is not particularly limited to hydrocarbons, alcohols, ketones, esters, ethers, chlorinated solvents, and so forth, as long as the high-boiling-point organic solvent is capable of dissolving the inventive polymer. Specific examples of the high-boiling-point organic solvent include 1-octanol, 2-ethylhexanol, 1-nonanol, 1-decanol, 1-undecanol, ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol, tripropylene glycol, glycerin, n-nonyl acetate, ethylene glycol monohexyl ether, ethylene glycol mono-2-ethylhexyl ether, ethylene glycol monophenyl ether, ethylene glycol monobenzyl ether, diethylene glycol monoethyl ether, diethylene glycol monoisopropyl ether, diethylene glycol mono-n-butyl ether, diethylene glycol monoisobutyl ether, diethylene glycol monohexyl ether, diethylene glycol monophenyl ether, diethylene glycol monobenzyl ether, diethylene glycol diethyl ether, diethylene glycol dibutyl ether, diethylene glycol butylmethyl ether, triethylene glycol dimethyl ether, triethylene glycol monomethyl ether, triethylene glycol-n-butyl ether, triethylene glycol butylmethyl ether, triethylene glycol diacetate, tetraethylene glycol dimethyl ether, dipropylene glycol monomethyl ether, dipropylene glycol mono-n-propyl ether, dipropylene glycol mono- n-butyl ether, tripropylene glycol dimethyl ether, tripropylene glycol monomethyl ether, tripropylene glycol mono-n-propyl ether, tripropylene glycol mono-n-butyl ether, ethylene glycol monoethyl ether acetate, ethylene glycol monobutyl ether acetate, diethylene glycol monomethyl ether acetate, diethylene glycol monoethyl ether acetate, diethylene glycol monobutyl ether acetate, triacetin, propylene glycol diacetate, dipropylene glycol monomethyl ether acetate, dipropylene glycol methyl-n-propyl ether, dipropylene glycol methyl ether acetate, 1,4-butanediol diacetate, 1,3-butylene glycol diacetate, 1,6-hexanediol diacetate, triethylene glycol diacetate, γ-butyrolactone, dihexyl malonate, diethyl succinate, dipropyl succinate, dibutyl succinate, dihexyl succinate, dimethyl adipate, diethyl adipate, dibutyl adipate, etc. One of these may be used alone, or a mixture thereof may be used.

The boiling point of the high-boiling-point solvent may be appropriately selected according to the temperature at which the composition for forming an organic film is heated. The boiling point of the high-boiling-point solvent to be added is preferably 180° C. to 300° C., more preferably 200° C. to 300° C. Such boiling points prevent the evaporation rate at baking (heating) from becoming excessive, which would otherwise occur if the boiling point is too low. Thus, sufficient thermal flowability can be obtained. Meanwhile, the boiling points are not too high, so that the high-boiling-point solvent evaporates after baking and does not remain in the film. Thus, the film properties such as etching resistance are not affected.

When the high-boiling-point solvent is used, the high-boiling-point solvent is blended in an amount of preferably 1 to 30 parts by mass based on 100 parts by mass of the solvent having a boiling point of lower than 180° C. The high-boiling-point solvent in such a formulation amount prevents a failure in providing sufficient thermal flowability during baking, which would otherwise occur if the amount is too small; in addition, degradation of the film properties such as etching resistance is prevented, which would otherwise occur if the amount is so large that the high-boiling-point solvent remains in the film.

In such a composition for forming an organic film, the inventive polymer is provided with thermal flowability by adding the high-boiling-point solvent, so that the composition for forming an organic film has both high filling and planarizing properties.

In the inventive composition for forming an organic film, (C) an acid generator can be added so as to further promote the curing reaction. The acid generator includes a material that generates an acid by thermal decomposition, and a material that generates an acid by light irradiation. Any acid generator can be added. Specifically, materials disclosed in paragraphs (0061) to (0085) of JP 2007-199653 A can be added, but the present invention is not limited thereto.

One kind of the acid generator, or a combination of two or more kinds thereof can be used. When the acid generator is added, the amount is preferably 0.05 to 50 parts by mass, more preferably 0.1 to 10 parts by mass, based on 100 parts by mass of the inventive polymer.

To the inventive composition for forming an organic film, (D) a surfactant can be added so as to improve the coating property in spin coating. As the surfactant, for example, those disclosed in (0142) to (0147) of JP 2009-269953 A can be used.

Moreover, to the inventive composition for forming an organic film, (E) a crosslinking agent can also be added so as to increase the curability and to further suppress intermixing with an upper layer film. The crosslinking agent is not particularly limited, and known various types of crosslinking agents can be widely used. Examples thereof include melamine-based crosslinking agents, glycoluril-based crosslinking agents, benzoguanamine-based crosslinking agents, urea-based crosslinking agents, β-hydroxyalkylamide-based crosslinking agents, isocyanurate-based crosslinking agents, aziridine-based crosslinking agents, oxazoline-based crosslinking agents, and epoxy-based crosslinking agents.

Specific examples of the melamine-based crosslinking agents include hexamethoxymethylated melamine, hexabutoxymethylated melamine, alkoxy- and/or hydroxy-substituted derivatives thereof, and partial self-condensates thereof. Specific examples of the glycoluril-based crosslinking agents include tetramethoxymethylated glycoluril, tetrabutoxymethylated glycoluril, alkoxy- and/or hydroxy-substituted derivatives thereof, and partial self-condensates thereof. Specific examples of the benzoguanamine-based crosslinking agents include tetramethoxymethylated benzoguanamine, tetrabutoxymethylated benzoguanamine, alkoxy- and/or hydroxy-substituted derivatives thereof, and partial self-condensates thereof. Specific examples of the urea-based crosslinking agents include dimethoxymethylated dimethoxyethyleneurea, alkoxy- and/or hydroxy-substituted derivatives thereof, and partial self-condensates thereof. A specific example of the β-hydroxyalkylamide-based crosslinking agents includes N,N,N',N'-tetra(2-hydroxyethyl)adipic acid amide. Specific examples of the isocyanurate-based crosslinking agents include triglycidyl isocyanurate and triallyl isocyanurate. Specific examples of the aziridine-based crosslinking agents include 4,4'-bis(ethyleneiminocarbonylamino)diphenylmethane and 2,2-bishydroxymethylbutanol-tris[3-(1-aziridinyl)propionate]. Specific examples of the oxazoline-based crosslinking agents include 2,2'-isopropylidenebis(4-benzyl-2-oxazoline), 2,2'-isopropylidenebis(4-phenyl-2-oxazoline), 2,2'-methylenebis4,5-diphenyl-2-oxazoline, 2,2'-methylenebis-4-phenyl-2-oxazoline, 2,2'-methylenebis-4-tert-butyl-2-oxazoline, 2,2'-bis(2-oxazoline), 1,3-phenylenebis(2-oxazoline), 1,4-phenylenebis(2-oxazoline), and a 2-isopropenyloxazoline copolymer. Specific examples of the epoxy-based crosslinking agents include diglycidyl ether, ethylene glycol diglycidyl ether, 1,4-butanediol diglycidyl ether, 1,4-cyclohexanedimethanol diglycidyl ether, poly(glycidyl methacrylate), trimethylolethane triglycidyl ether, trimethylolpropane triglycidyl ether, and pentaerythritol tetraglycidyl ether.

Further, to the inventive composition for forming an organic film, (F) a plasticizer can be added so as to further improve the planarizing and filling properties. The plasticizer is not particularly limited, and known various types of plasticizers can be widely used. Examples thereof include low-molecular-weight compounds such as phthalic acid esters, adipic acid esters, phosphoric acid esters, trimellitic acid esters, and citric acid esters; and polymers such as polyethers, polyesters, and polyacetal-based polymers disclosed in JP 2013-253227 A.

Further, like the plasticizer, as an additive for imparting the filling and planarizing properties to the inventive composition for forming an organic film, it is preferable to use, for example, liquid additives having polyethylene glycol or polypropylene glycol structure, or thermo-decomposable polymers having a weight loss ratio between 30° C. and 250° C. of 40 mass % or more and a weight-average molecular weight of 300 to 200,000. The thermo-decomposable polymers preferably contain a repeating unit having an acetal structure shown by the following general formula (DP1) or (DP1a).

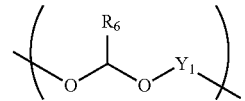

(DP1)

In the formula, $R_6$ represents a hydrogen atom or a saturated or unsaturated monovalent organic group having 1 to 30 carbon atoms which may be substituted. $Y_1$ represents a saturated or unsaturated divalent organic group having 2 to 30 carbon atoms.

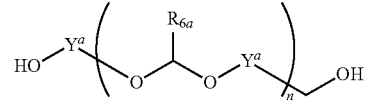

(DP1a)

In the formula, $R_{6a}$ represents an alkyl group having 1 to 4 carbon atoms. $Y^a$ represents a saturated or unsaturated divalent hydrocarbon group having 4 to 10 carbon atoms which may have an ether bond. "n" represents an average repeating unit number of 3 to 500.

As described above, the inventive composition for forming an organic film has all of heat resistance to 400° C. or higher and high filling and planarizing properties. Thus, the inventive composition for forming an organic film is quite useful as an organic film material for multilayer resist methods such as a two-layer resist method, a three-layer resist method using a silicon-containing resist middle layer film or a silicon-containing inorganic hard mask, and a four-layer resist method using a silicon-containing resist middle layer film or a silicon-containing inorganic hard mask and an organic antireflective coating. Moreover, the inventive composition for forming an organic film generates no by-product even during film formation in an inert gas, and has excellent filling and planarizing properties. Accordingly, the inventive composition for forming an organic film is suitably usable as a planarizing material in a semiconductor device manufacturing process, besides the multilayer resist methods.

[Substrate for Manufacturing Semiconductor Device]

Moreover, the present invention provides a substrate for manufacturing a semiconductor device, including an organic film on the substrate, the organic film being formed by curing the above-described composition for forming an organic film.

The organic film formed from the inventive composition for forming an organic film has high filling and planarizing properties. Thus, the organic film does not have fine pores due to insufficient filling or asperity in the organic film surface due to insufficient planarizing property. The semiconductor device substrate planarized by this organic film increases the process margin at patterning, and enables semiconductor device manufacturing with high yields.

[Method for Forming Organic Film]

The film formation step by heating to form an organic film can employ one-stage baking, two-stage baking, or multi-stage baking of three or more stages. Nevertheless, the one-stage baking or the two-stage baking is economically preferable. The film formation by the one-stage baking is performed, for example, at a temperature of 50° C. or higher and 600° C. or lower within a range of 5 to 7200 seconds, preferably at a temperature of 150° C. or higher and 500° C.

or lower within a range of 10 to 3600 seconds. Heating under such conditions can promote the planarization attributable to thermal flow and the crosslinking reaction. In a multilayer resist method, a coating-type silicon middle layer film or a CVD hard mask is sometimes formed on a film obtained as described above. In the case where a coating-type silicon middle layer film is employed, the film formation is performed preferably at a temperature higher than a temperature at which the silicon middle layer film is formed. Generally, a silicon middle layer film is formed at 100° C. or higher and 400° C. or lower, preferably 150° C. or higher and 350° C. or lower. Forming the organic film at a temperature higher than these temperatures makes it possible to prevent a composition for forming the silicon middle layer film from dissolving the organic film, and to form the organic film not mixed with the composition.

In the case where a CVD hard mask is employed, the organic film is formed preferably at a temperature higher than a temperature at which the CVD hard mask is formed. Examples of the temperature at which the CVD hard mask is formed include temperatures at 150° C. or higher and 500° C. or lower.

On the other hand, in the film formation by the two-stage baking, the first baking is performed such that the upper limit of the treatment temperature in air is set to, for example, 250° C. or lower, preferably 200° C. or lower but 50° C. or higher, within 5 to 600 seconds, considering the influence of oxygen on the substrate corrosion. The second baking temperature is higher than the first baking temperature, and the second baking is performed at a temperature of 600° C. or lower, preferably 500° C. or lower but 200° C. or higher, within a range of 10 to 7200 seconds. In a multilayer resist method, a coating-type silicon middle layer film or a CVD hard mask is sometimes formed on a film obtained as described above. In the case where a coating-type silicon middle layer film is employed, the film formation is performed preferably at temperatures higher than a temperature at which the silicon middle layer film is formed. Generally, a silicon middle layer film is formed at 100° C. or higher and 400° C. or lower, preferably 150° C. or higher and 350° C. or lower. Forming the organic film at temperatures higher than these temperatures makes it possible to prevent a composition for forming the silicon middle layer film from dissolving the organic film, and to form the organic film not mixed with the composition.

In the case where a CVD hard mask is employed in the two-stage baking, the organic film is formed preferably at temperatures higher than a temperature at which the CVD hard mask is formed. Examples of the temperature at which the CVD hard mask is formed include temperatures at 150° C. or higher and 500° C. or lower.

The present invention also provides a method for forming an organic film that functions as an organic film employed in a semiconductor device manufacturing process. In order to prevent corrosion of a substrate to be processed, the method includes heating the substrate to be processed under an atmosphere with an oxygen concentration of 1% or less to thereby form a cured film.

In this method for forming an organic film, for example, first of all, a substrate to be processed is spin-coated with the above-described inventive composition for forming an organic film. After the spin coating, in the two-stage baking, first, baking is performed in air at 50° C. or higher and 250° C. or lower. Then, the second baking is performed preferably under an atmosphere with an oxygen concentration of 1% or less. In the case of one-stage baking, the first baking in air aforementioned initially can be skipped. Note that examples of the atmosphere during the baking include inert gases such as nitrogen, argon, and helium. The inventive composition for forming an organic film is capable of forming a sufficiently cured organic film without generating a sublimation product, even when the baking is performed under such an inert gas atmosphere.

Meanwhile, the inventive method for forming an organic film makes it possible to use a substrate to be processed having a structure or step with a height of 30 nm or more. As described above, since the inventive composition for forming an organic film is excellent in filling and planarizing properties, even when the substrate to be processed has a structure or step (asperity) with a height of 30 nm or more, a flat cured film can be formed. Specifically, the inventive method for forming an organic film is particularly useful when a flat organic film is formed on such a substrate to be processed.

Note that the thickness of the organic film to be formed is appropriately selected, but is preferably 30 to 20,000 nm, more preferably 50 to 15,000 nm.

Additionally, the above-described method for forming an organic film is applicable, using the inventive composition for forming an organic film, to both cases where an organic film for an organic underlayer film is formed, and where an organic film for a planarizing film is formed.

The present invention provides a method for forming an organic film employed in a semiconductor device manufacturing process, the method including steps of:

spin-coating a substrate to be processed with the above-described composition for forming an organic film; and heating the substrate to be processed coated with the composition for forming an organic film under an inert gas atmosphere at a temperature of 50° C. or higher and 600° C. or lower within a range of 10 seconds to 7200 seconds to obtain a cured film.

Further, the present invention provides a method for forming an organic film employed in a semiconductor device manufacturing process, the method including steps of:

spin-coating a substrate to be processed with the above-described composition for forming an organic film;

heating the substrate to be processed coated with the composition for forming an organic film in air at a temperature of 50° C. or higher and 250° C. or lower within a range of 5 seconds to 600 seconds, preferably 10 to 600 seconds to form a coating film; and subsequently heating the resultant under an inert gas atmosphere at a temperature of 200° C. or higher and 600° C. or lower, preferably 250° C. or higher within a range of 10 seconds to 7200 seconds to obtain a cured film.

The organic films formed by the inventive methods for forming an organic film and employed in a semiconductor device manufacturing process have high heat resistance and high filling and planarizing properties. The use of such organic films in a semiconductor device manufacturing process improves the yield of semiconductor devices.

In these methods for forming an organic film, first, a substrate to be processed is spin-coated with the inventive composition for forming an organic film described above. By employing the spin coating method, favorable filling property can be obtained. After the spin coating, baking (heating) is performed to promote the planarization attributable to thermal flow and the crosslinking reaction. Note that since this baking allows the solvent in the composition for forming an organic film to evaporate, even when a resist upper layer film or a silicon-containing resist middle layer film is formed on the organic film, the mixing can be prevented.

[Patterning Processes]

<Three-Layer Resist Method Using Silicon-Containing Resist Middle Layer Film>

The present invention provides a patterning process including steps of:

forming an organic film by using the inventive composition for forming an organic film on a body to be processed;

forming a silicon-containing resist middle layer film by using a silicon-containing resist middle layer film material on the organic film;

forming a resist upper layer film by using a photoresist composition on the silicon-containing resist middle layer film;

forming a circuit pattern in the resist upper layer film;

transferring the pattern to the silicon-containing resist middle layer film by etching using the resist upper layer film having the formed circuit pattern as a mask;

transferring the pattern to the organic film by etching using the silicon-containing resist middle layer film having the transferred pattern as a mask; and etching the body to be processed using the organic film having the transferred pattern as a mask to form the pattern in the body to be processed.

As the body to be processed, it is preferable to use a semiconductor device substrate or the semiconductor device substrate coated with any of a metal film, a metal carbide film, a metal oxide film, a metal nitride film, a metal oxycarbide film, and a metal oxynitride film. More specifically, although the body to be processed is not particularly limited, examples thereof include substrates made of Si, α-Si, p-Si, $SiO_2$, SiN, SiON, W, TiN, Al, or the like; these substrates coated with any film of the aforementioned metals, or the like as a layer to be processed; etc.

Examples of the layer to be processed include various Low-k films made of Si, $SiO_2$, SiON, SiN, p-Si, α-Si, W, W—Si, Al, Cu, Al—Si, or the like; and stopper films thereof. The layer can be formed to have a thickness of generally 50 to 10,000 nm, particularly 100 to 5,000 nm. Note that when the layer to be processed is formed, the substrate and the layer to be processed are formed from different materials.

Note that the metal constituting the body to be processed is preferably silicon, titanium, tungsten, hafnium, zirconium, chromium, germanium, copper, silver, gold, aluminum, indium, gallium, arsenic, palladium, iron, tantalum, iridium, cobalt, manganese, molybdenum, or an alloy thereof.

Moreover, as the body to be processed, it is preferable to use a substrate to be processed which has a structure or step with a height of 30 nm or more.

When an organic film is formed on a body to be processed by using the inventive composition for forming an organic film, the above-described inventive methods for forming an organic film may be employed.

Next, using a resist middle layer film material containing silicon atoms, a resist middle layer film (silicon-containing resist middle layer film) is formed on the organic film. The silicon-containing resist middle layer film material is preferably a polysiloxane-based middle layer film material. The silicon-containing resist middle layer film having antireflective effect can suppress the reflection. Particularly, for 193-nm light exposure, a material containing many aromatic groups and having high etching selectivity relative to the substrate is used as a material for forming an organic film, so that the k-value and thus the substrate reflection are increased; in contrast, the reflection can be suppressed by imparting absorption to the silicon-containing resist middle layer film so as to have an appropriate k-value, and the substrate reflection can be reduced to 0.5% or less. As the silicon-containing resist middle layer film having antireflective effect, a polysiloxane is preferably used which has anthracene for 248-nm and 157-nm light exposure, or a phenyl group or a light-absorbing group having a silicon-silicon bond for 193-nm light exposure in a pendant structure or polysiloxane structure, and which is crosslinked by an acid or heat.

Next, using a resist upper layer film material composed of a photoresist composition, a resist upper layer film is formed on the silicon-containing resist middle layer film. The resist upper layer film material may be a positive type or a negative type, and any generally-used photoresist composition can be used. After the spin coating of the resist upper layer film material, pre-baking is preferably performed within ranges of 60 to 180° C. and 10 to 300 seconds. Then, light exposure, post-exposure bake (PEB), and development are performed according to conventional methods to obtain a resist upper layer film pattern. Note that the thickness of the resist upper layer film is not particularly limited, but is preferably 30 to 500 nm, particularly preferably 50 to 400 nm.

Next, a circuit pattern (the resist upper layer film pattern) is formed in the resist upper layer film. The circuit pattern is preferably formed by a lithography using light with a wavelength ranging from 10 nm or more and 300 nm or less, direct lithography with electron beam, nanoimprinting, or a combination thereof.

Note that the exposure light includes high energy beam with a wavelength of 300 nm or less; specifically, deep ultraviolet ray, KrF excimer laser beam (248 nm), ArF excimer laser beam (193 nm), $F_2$ laser beam (157 nm), $Kr_2$ laser beam (146 nm), $Ar_2$ laser beam (126 nm), soft X-ray (EUV) of 3 to 20 nm, electron beam (EB), ion beam, X-ray, etc. Moreover, nanoimprinting, or a combination therewith can be used.

Additionally, in forming the circuit pattern, the circuit pattern is preferably developed with an alkali or organic solvent.

Next, using the resist upper layer film having the formed circuit pattern as a mask, the pattern is transferred to the silicon-containing resist middle layer film by etching. The etching of the silicon-containing resist middle layer film using the resist upper layer film pattern as a mask is preferably performed with a fluorocarbon-based gas. Thereby, a silicon-containing resist middle layer film pattern is formed.

Next, using the silicon-containing resist middle layer film having the transferred pattern as a mask, the pattern is transferred to the organic film by etching. Since the silicon-containing resist middle layer film exhibits higher etching resistance to an oxygen gas or a hydrogen gas than an organic compound, the etching of the organic film using the silicon-containing resist middle layer film pattern as a mask is preferably performed with an etching gas mainly containing an oxygen gas or a hydrogen gas. Thereby, an organic film pattern is successfully formed.

Next, using the organic film having the transferred pattern as a mask, the pattern is transferred to the body to be processed by etching. The subsequent etching of the body to be processed (layer to be processed) can be performed according to a conventional method. For example, the body to be processed made of $SiO_2$, SiN, or silica low-dielectric insulating film is etched mainly with a fluorocarbon-based gas; and p-Si, Al, or W is etched mainly with a chlorine- or bromine-based gas. When the substrate is processed by etching with a fluorocarbon-based gas, the silicon-containing resist middle layer film pattern is removed when the substrate is processed. Meanwhile, when the substrate is processed by etching with a chlorine- or bromine-based gas, the silicon-containing resist middle layer film pattern needs to be removed by additional dry etching with a fluorocarbon-based gas after the substrate processing.

The organic film obtained from the inventive composition for forming an organic film can exhibit excellent etching resistance when the body to be processed is etched as described above.

[Four-Layer Resist Method Using Silicon-Containing Resist Middle Layer Film and Organic Antireflective Coating]

Moreover, the present invention provides a patterning process including steps of:

forming an organic film by using the inventive composition for forming an organic film on a body to be processed;

forming a silicon-containing resist middle layer film by using a silicon-containing resist middle layer film material on the organic film;

forming an organic antireflective coating (BARC) on the silicon-containing resist middle layer film;

forming a resist upper layer film by using a photoresist composition on the BARC;

forming a circuit pattern in the resist upper layer film;

successively transferring the pattern by etching to the BARC and the silicon-containing resist middle layer film using the resist upper layer film having the formed circuit pattern as a mask;

transferring the pattern to the organic film by etching using the silicon-containing resist middle layer film having the transferred pattern as a mask; and etching the body to be processed using the organic film having the transferred pattern as a mask to form the pattern in the body to be processed.

Note that this method can be performed in the same manner as the above-described three-layer resist method using the silicon-containing resist middle layer film, except that the organic antireflective coating (BARC) is formed between the silicon-containing resist middle layer film and the resist upper layer film.

The organic antireflective coating (BARC) can be formed by spin coating from a known organic antireflective coating material.

[Three-Layer Resist Method Using Inorganic Hard Mask]

Further, the present invention provides a patterning process including steps of:

forming an organic film by using the inventive composition for forming an organic film on a body to be processed;

forming an inorganic hard mask selected from a silicon oxide film, a silicon nitride film, a silicon oxynitride film, a titanium oxide film, and a titanium nitride film on the organic film;

forming a resist upper layer film by using a photoresist composition on the inorganic hard mask;

forming a circuit pattern in the resist upper layer film;

transferring the pattern to the inorganic hard mask by etching using the resist upper layer film having the formed circuit pattern as a mask;

transferring the pattern to the organic film by etching using the inorganic hard mask having the formed pattern as a mask; and etching the body to be processed using the organic film having the formed pattern as a mask to form the pattern in the body to be processed.

Note that this method can be performed in the same manner as the above-described three-layer resist method using the silicon-containing resist middle layer film, except that the inorganic hard mask is formed in place of the silicon-containing resist middle layer film on the organic film.

The inorganic hard mask selected from a silicon oxide film, a silicon nitride film, and a silicon oxynitride film (SiON film) can be formed by a CVD method, an ALD method, or the like. The method for forming the silicon nitride film is disclosed in, for example, JP 2002-334869 A, WO 2004/066377 A1, and so forth. The film thickness of the inorganic hard mask is preferably 5 to 200 nm, more preferably 10 to 100 nm. As the inorganic hard mask, a SiON film is most preferably used which is effective as an antireflective film. When the SiON film is formed, the substrate temperature reaches 300 to 500° C. Hence, the underlayer film needs to withstand the temperature of 300 to 500° C. Since the organic film formed from the inventive composition for forming an organic film has high heat resistance and can withstand high temperatures of 300° C. to 500° C., this enables the combination of the inorganic hard mask formed by a CVD method or an ALD method with the organic film formed by a spin coating method.

[Four-Layer Resist Method Using Inorganic Hard Mask and Organic Antireflective Coating]

Furthermore, the present invention provides a patterning process including steps of:

forming an organic film by using the inventive composition for forming an organic film on a body to be processed;

forming an inorganic hard mask selected from a silicon oxide film, a silicon nitride film, a silicon oxynitride film, a titanium oxide film, and a titanium nitride film on the organic film;

forming a BARC on the inorganic hard mask;

forming a resist upper layer film by using a photoresist composition on the BARC;

forming a circuit pattern in the resist upper layer film;

successively transferring the pattern to the BARC and the inorganic hard mask by etching using the resist upper layer film having the formed circuit pattern as a mask;

transferring the pattern to the organic film by etching using the inorganic hard mask having the formed pattern as a mask; and etching the body to be processed using the organic film having the formed pattern as a mask to form the pattern in the body to be processed.

Note that this method can be performed in the same manner as the above-described three-layer resist method using the inorganic hard mask, except that the organic antireflective coating (BARC) is formed between the inorganic hard mask and the resist upper layer film.

Particularly, when the SiON film is used as the inorganic hard mask, two antireflective films including the SiON film and the BARC make it possible to suppress the reflection even in liquid immersion exposure at a high NA exceeding 1.0. Another merit of the BARC formation is having an effect of reducing trailing of the resist upper layer film pattern immediately above the SiON film.

Herein, FIG. 2 (A) to (F) show an example of the inventive patterning process according to the three-layer resist method. As shown in FIG. 2 (A), in the three-layer resist method, using the inventive composition for forming an organic film, an organic film 3 is formed on a layer 2 to be processed formed on a substrate 1. Then, a silicon-containing resist middle layer film 4 is formed, and a resist upper layer film 5 is formed thereon. Subsequently, as shown in FIG. 2 (B), a light-exposure portion 6 of the resist upper layer film 5 is exposed to light, followed by PEB (post-exposure bake). Thereafter, as shown in FIG. 2 (C), a resist upper layer film pattern 5a is formed by development. After that, as shown in FIG. 2 (D), using the resist upper layer film pattern 5a as a mask, the silicon-containing resist middle layer film 4 is processed by dry etching with a fluorocarbon-based gas; thereby, a silicon-containing resist middle layer film pattern 4a is formed. Then, as shown in FIG. 2 (E), after the resist upper layer film pattern 5a is removed, the organic film 3 is etched with oxygen plasma using the silicon-containing resist middle layer film pattern 4a as a mask; thereby, an organic film pattern 3a is formed. Further, as shown in FIG. 2 (F), after the silicon-containing resist middle layer film pattern 4a is removed, the layer 2 to be processed is processed by etching using the organic film pattern 3a as a mask. Thus, a pattern 2a is formed.

In the case where an inorganic hard mask is formed, the silicon-containing resist middle layer film 4 may be replaced with the inorganic hard mask. In the case where a BARC is formed, the BARC may be formed between the silicon-containing resist middle layer film 4 and the resist upper layer film 5. The etching of the BARC starts before the etching of the silicon-containing resist middle layer film 4, but these etchings may be performed continuously. Alternatively, after the BARC is etched alone, for example, the etching apparatus is changed, and then the etching of the silicon-containing resist middle layer film 4 may be started.

As described above, the inventive patterning processes make it possible to precisely form a fine pattern in a body to be processed by the multilayer resist methods.

EXAMPLE

Hereinafter, the present invention will be further specifically described by referring to Synthesis Examples, Comparative Synthesis Examples, Examples, and Comparative Examples. However, the present invention is not limited thereto. Note that, regarding molecular weight and dispersity, gel permeation chromatography (GPC) was performed using tetrahydrofuran (THF) as an eluent to determine weight-average molecular weight (Mw) and number-average molecular weight (Mn) in terms of polystyrene, and dispersity (Mw/Mn, also referred to as molecular-weight distribution) was obtained therefrom.

Synthesis Examples: Synthesis of Polymers

Polymers (A1) to (A18) were synthesized using the following Compounds B: (B1) to (B16) and Compounds C: (C1) to (C4).

Compounds B

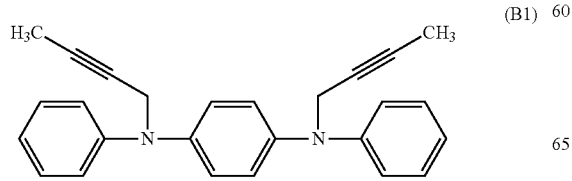

(B1)

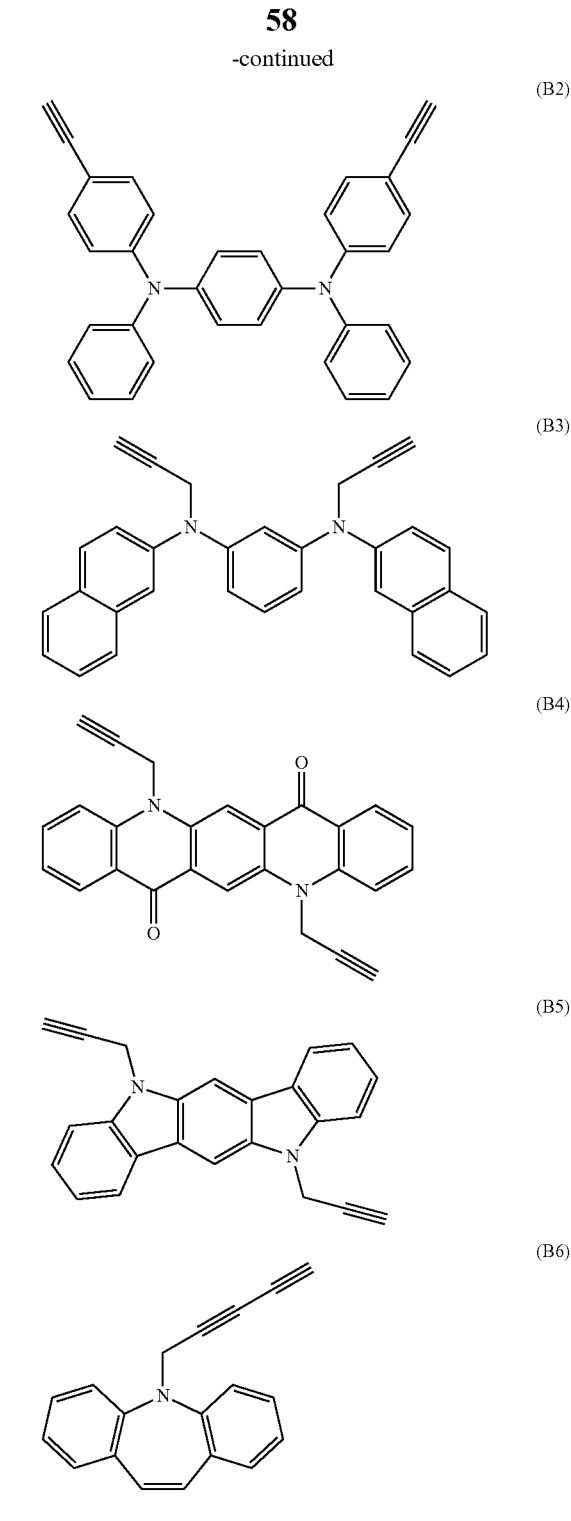

(B8)
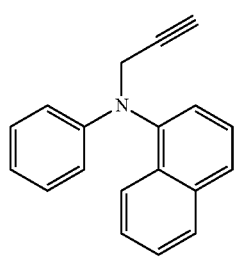
(B9)
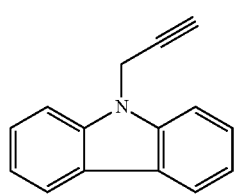
(B10)
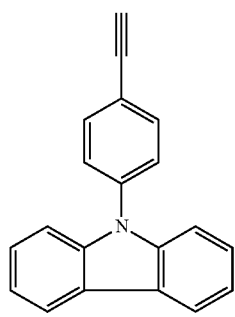
(B11)
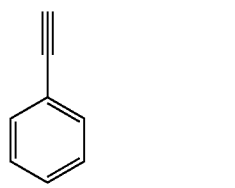
(B12)
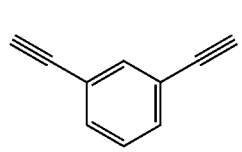
(B13)
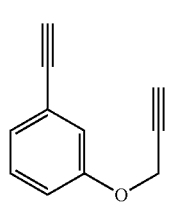
(B14)
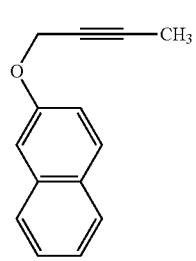
(B15)
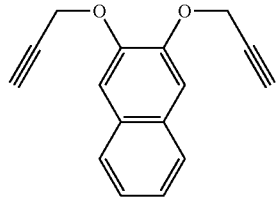
(B16)
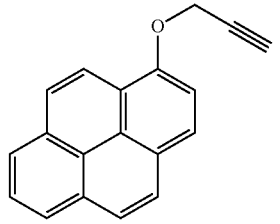
Compounds C
(C1)
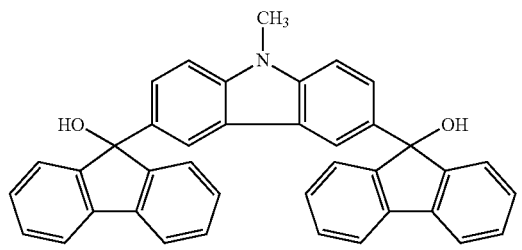
(C2)
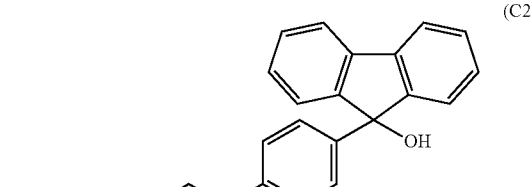
(C3)
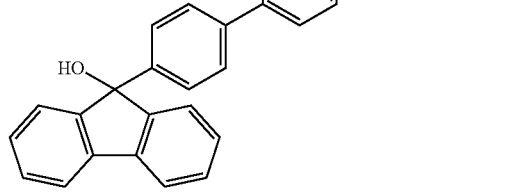
(C4)
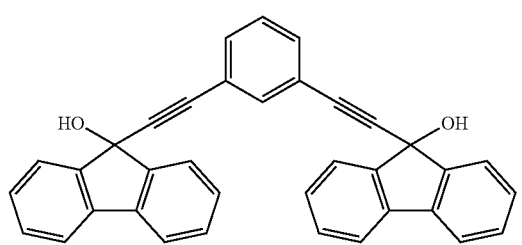

[Synthesis Example 1] Synthesis of Compound (A1)

Under a nitrogen atmosphere, a suspension with an inner temperature of 50° C. was prepared from 50.5 g of Compound (B1), 50.0 g of Compound (C1), and 400 g of 1,2-dichloroethane. Then, 20.0 g of methanesulfonic acid was slowly added thereto. After confirming that the heat generation ended, the inner temperature was raised to 70° C. for the reaction for 8 hours. After cooling to room temperature, 1000 g of toluene was added, and the organic layer was washed six times with 300 g of pure water. Subsequently, the organic layer was evaporated under reduced pressure to dryness. To the residue, 300 g of THF was added to form a homogeneous solution. Thereafter, the polymer was reprecipitated with 1000 g of methanol. The precipitated polymer was separated by filtration, washed twice with 600 g of methanol, and collected. The collected polymer was vacuum dried at 70° C. Thus, (A1) was obtained. The weight-average molecular weight (Mw) and dispersity (Mw/Mn) thereof were determined by GPC. The results were Mw=2320 and Mw/Mn=1.85.

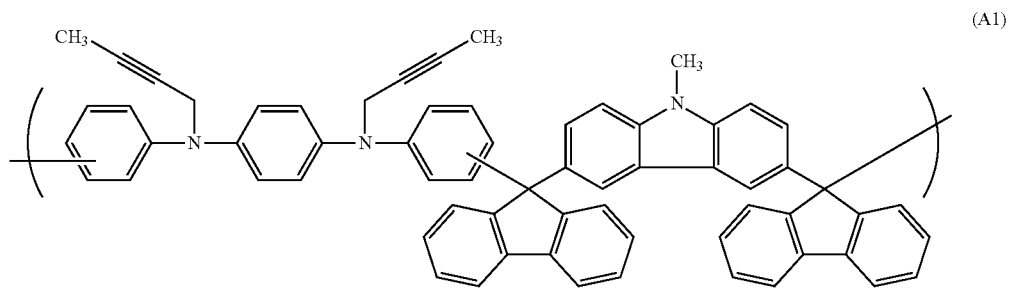

(A1)

[Synthesis Examples 2 to 18] Synthesis of Polymers (A2) to (A18)

Polymers (A2) to (A18) as shown in Table 2 were obtained as products under the same reaction conditions as those in Synthesis Example 1, except that Compounds B and Compounds C shown in Table 1 were used.

TABLE 1

| Synthesis Example | Compounds B | Compounds C | Polymer |
|---|---|---|---|
| 1 | B1: 50.5 g | C1: 50.0 g | A1 |
| 2 | B2: 53.7 g | C2: 40.0 g | A2 |
| 3 | B3: 46.2 g | C3: 50.0 g | A3 |
| 4 | B4: 51.9 g | C4: 50.0 g | A4 |
| 5 | B5: 48.4 g | C2: 50.0 g | A5 |
| 6 | B6: 46.0 g | C1: 50.0 g | A6 |

TABLE 1-continued

| Synthesis Example | Compounds B | Compounds C | Polymer |
|---|---|---|---|
| 7 | B7: 37.0 g | C2: 60.0 g | A7 |
| 8 | B8: 31.8 g | C3: 60.0 g | A8 |
| 9 | B9: 32.9 g | C4: 60.0 g | A9 |
| 10 | B10: 31.8 g | C3: 60.0 g | A10 |
| 11 | B11: 14.9 g | C2: 60.0 g | A11 |
| 12 | B12: 15.6 g | C3: 60.0 g | A12 |
| 13 | B13: 25.0 g | C4: 60.0 g | A13 |
| 14 | B14: 28.6 g | C2: 60.0 g | A14 |
| 15 | B15: 31.5 g | C3: 60.0 g | A15 |
| 16 | B16: 36.9 g | C4: 50.0 g | A16 |
| 17 | B9: 27.3 g | C2: 24.5 g C3: 30.0 g | A17 |
| 18 | B10: 19.2 g B15: 17.0 g | C4: 50.0 g | A18 |

[Synthesis Example 19] Synthesis of Compound (A19)

Under a nitrogen atmosphere, a suspension with an inner temperature of 50° C. was prepared from 32.4 g of 5,11-dihydroindolo[3,2-b]carbazole, 50.0 g of Compound (C2), and 400 g of 1,2-dichloroethane. Then, 20.0 g of methanesulfonic acid was slowly added thereto. After confirming that the heat generation ended, the inner temperature was raised to 70° C. for the reaction for 8 hours. After cooling to room temperature, 1000 g of toluene was added, and the organic layer was washed six times with 300 g of pure water. Subsequently, the organic layer was evaporated under reduced pressure to dryness. To the residue, 300 g of THF was added to form a homogeneous solution. Thereafter, the polymer was reprecipitated with 1000 g of methanol. The precipitated polymer was separated by filtration, washed twice with 600 g of methanol, and collected. The collected polymer was vacuum dried at 70° C. Thus, (A19) was obtained. The weight-average molecular weight (Mw) and dispersity (Mw/Mn) thereof were determined by GPC. The results were Mw=2430 and Mw/Mn=1.65.

[Synthesis Example 21] Synthesis of Compound (A21)

Under a nitrogen atmosphere, a homogeneous dispersion with an inner temperature of 50° C. was prepared from 20.0 g of Polymer (A20) synthesized in Synthesis Example 20, 0.5 g of tetrabutylammonium iodide, 8.4 g of a 25% sodium

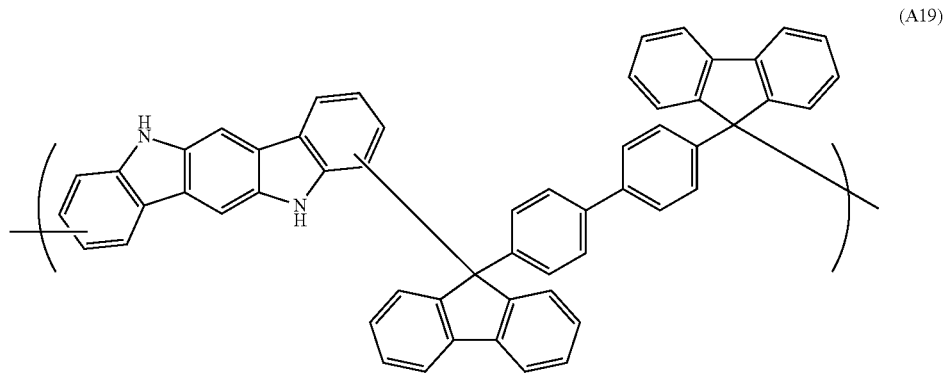

(A19)

[Synthesis Example 20] Synthesis of Compound (A20)

Under a nitrogen atmosphere, a suspension with an inner temperature of 50° C. was prepared from 22.3 g of carbazole, 50.0 g of Compound (C3), and 400 g of 1,2-dichloroethane. Then, 20.0 g of methanesulfonic acid was slowly added thereto. After confirming that the heat generation ended, the inner temperature was raised to 70° C. for the reaction for 8 hours. After cooling to room temperature, 1000 g of toluene was added, and the organic layer was washed six times with 300 g of pure water. Subsequently, the organic layer was evaporated under reduced pressure to dryness. To the residue, 300 g of THF was added to form a homogeneous solution. Thereafter, the polymer was reprecipitated with 1000 g of methanol. The precipitated polymer was separated by filtration, washed twice with 600 g of methanol, and collected. The collected polymer was vacuum dried at 70° C. Thus, (A20) was obtained. The weight-average molecular weight (Mw) and dispersity (Mw/Mn) thereof were determined by GPC. The results were Mw=2270 and Mw/Mn=1.68.

hydroxide aqueous solution, and 100 g of toluene. To the dispersion, a mixture solution containing 1.3 g of butyl bromide and 2.6 g of propargyl bromide was slowly added dropwise, and the reaction was allowed to proceed with the inner temperature of 50° C. for 24 hours. After cooling to room temperature, 200 g of toluene was added, and the aqueous layer was removed. Further, the organic layer was washed twice with 60 g of a 3.0% nitric acid aqueous solution and five times with 60 g of pure water. The organic layer was evaporated under reduced pressure to dryness. To the residue, 100 g of THF was added, and the polymer was reprecipitated with 400 g of methanol. The precipitated polymer was separated by filtration, washed twice with 300 g of methanol, and collected. The collected polymer was vacuum dried at 70° C. Thus, (A21) was obtained. The weight-average molecular weight (Mw) and dispersity (Mw/Mn) thereof were determined by GPC. The results were Mw=2670 and Mw/Mn=1.74.

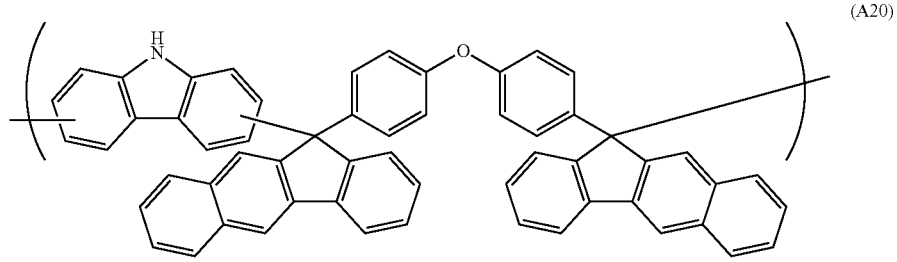

(A20)

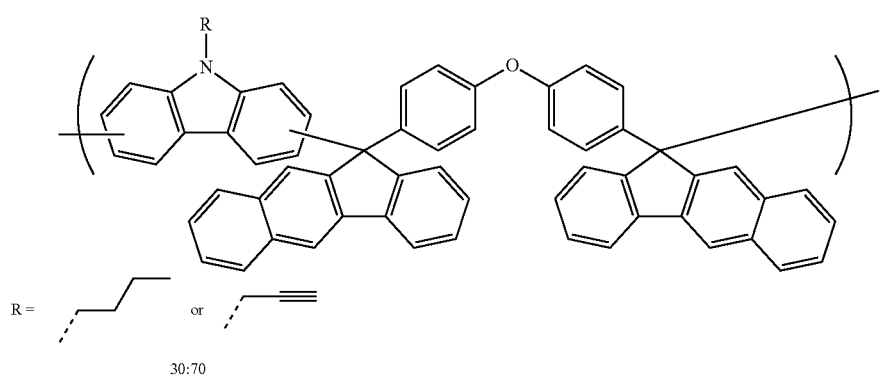

(A21)

R = [butyl] or [propargyl]

30:70

[Synthesis Example 22] Synthesis of Compound (A22)

Under a nitrogen atmosphere, a homogeneous dispersion with an inner temperature of 50° C. was prepared from 20.0 g of Polymer (A20) synthesized in Synthesis Example 20, 0.5 g of tetrabutylammonium iodide, 8.4 g of a 25% sodium hydroxide aqueous solution, and 100 g of toluene. To the dispersion, 4.3 g of butyl bromide was slowly added dropwise, and the reaction was allowed to proceed with the inner temperature of 50° C. for 24 hours. After cooling to room temperature, 200 g of toluene was added, and the aqueous layer was removed. Further, the organic layer was washed twice with 60 g of a 3.0% nitric acid aqueous solution and five times with 60 g of pure water. The organic layer was evaporated under reduced pressure to dryness. To the residue, 100 g of THF was added, and the polymer was reprecipitated with 400 g of methanol. The precipitated polymer was separated by filtration, washed twice with 300 g of methanol, and collected. The collected polymer was vacuum dried at 70° C. Thus, (A22) was obtained. The weight-average molecular weight (Mw) and dispersity (Mw/Mn) thereof were determined by GPC. The results were Mw=2650 and Mw/Mn=1.77.

[Synthesis Example 23] Synthesis of Compound (A23)

Under a nitrogen atmosphere, a suspension with an inner temperature of 50° C. was prepared from 21.0 g of 2,7-dihydroxynaphthalene, 50.0 g of Compound (C2), and 400 g of 1,2-dichloroethane. Then, 20.0 g of methanesulfonic acid was slowly added thereto. After confirming that the heat generation ended, the inner temperature was raised to 70° C. for the reaction for 8 hours. After cooling to room temperature, 1000 g of toluene was added, and the organic layer was washed six times with 300 g of pure water. Subsequently, the organic layer was evaporated under reduced pressure to dryness. To the residue, 300 g of THF was added to form a homogeneous solution. Thereafter, the polymer was reprecipitated with 800 g of diisopropyl ether. The precipitated polymer was separated by filtration, washed twice with 500 g of diisopropyl ether, and collected. The collected polymer was vacuum dried at 70° C. Thus, (A23) was obtained.

The weight-average molecular weight (Mw) and dispersity (Mw/Mn) thereof were determined by GPC. The results were Mw=2370 and Mw/Mn=1.82.

(A22)

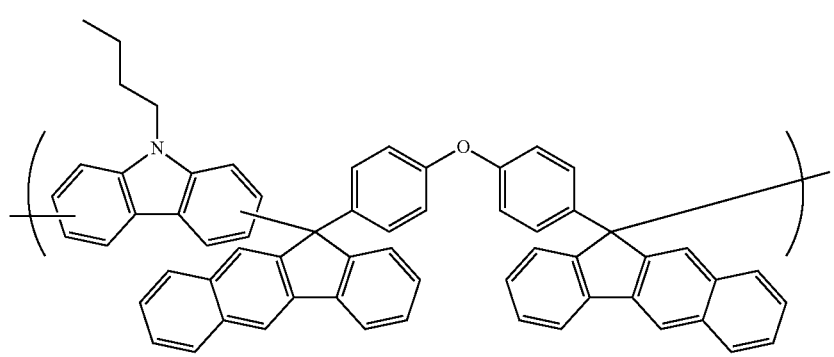

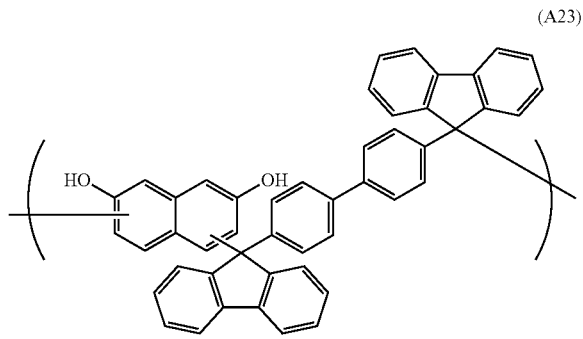

(A23)

[Synthesis Example 24] Synthesis of Compound (A24)

Under a nitrogen atmosphere, a homogeneous dispersion with an inner temperature of 50° C. was prepared from 20.00 g of Compound (A23), 8.7 g of potassium carbonate, and 80 g of dimethylformamide. Then, 5.2 g of propargyl bromide was slowly added dropwise thereto, and the reaction was allowed to proceed with the inner temperature of 50° C. for 16 hours. After cooling to room temperature, 200 g of methyl isobutyl ketone and 100 g of pure water were added, and the resultant was homogenized. Subsequently, the aqueous layer was removed. Further, the organic layer was washed twice with 60 g of a 3.0% nitric acid aqueous solution and five times with 60 g of pure water. The organic layer was evaporated under reduced pressure to dryness. To the residue, 100 g of THF was added, and the polymer was reprecipitated with 400 g of methanol. The precipitated polymer was separated by filtration, washed twice with 300 g of methanol, and collected. The collected polymer was vacuum dried at 70° C. Thus, (A24) was obtained. The weight-average molecular weight (Mw) and dispersity (Mw/Mn) thereof were determined by GPC. The results were Mw=2580 and Mw/Mn=1.89.

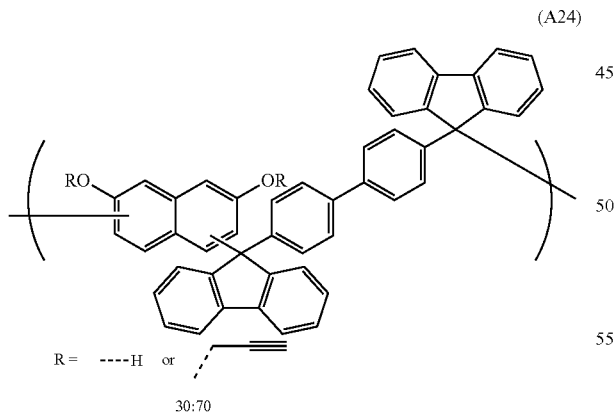

(A24)

[Synthesis Example 25] Synthesis of Compound (A25)

Under a nitrogen atmosphere, a homogeneous solution with an inner temperature of 70° C. was prepared from 60.0 g of carbazole, 40.0 g of 9-fluorenone, 5 ml of 3-mercaptopropionic acid, and 300 ml of 1,2-dichloroethane. Then, 10 ml of methanesulfonic acid was slowly added thereto, and the reaction was allowed to proceed with the inner temperature of 70° C. for 24 hours. After cooling to room temperature, 500 g of methyl isobutyl ketone was added, and the organic layer was washed five times with 100 g of pure water. Subsequently, the organic layer was evaporated under reduced pressure to dryness. To the residue, 200 g of THF was added to form a homogeneous solution. Thereafter, the polymer was reprecipitated with 1000 g of methanol. The precipitated polymer was separated by filtration, washed twice with 600 g of methanol, and collected. The collected polymer was vacuum dried at 70° C. Thus, (A25) was obtained. The weight-average molecular weight (Mw) and dispersity (Mw/Mn) thereof were determined by GPC. The results were Mw=2880 and Mw/Mn=2.29.

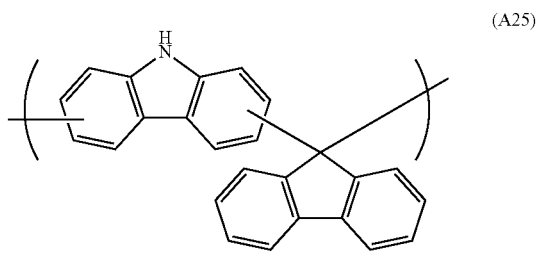

(A25)

[Synthesis Example 26] Synthesis of Compound (A26)

Under a nitrogen atmosphere, 15.0 g of 2-acetyl-9-ethylcarbazole, 14.9 g of thionyl chloride, and 2.8 g of ethanol were added and allowed to react at 80° C. for 8 hours. After cooling to room temperature, 50 g of pure water and 50 g of dichloromethane were added to the reaction solution, followed by liquid separation and water-washing. Subsequently, the resulting organic layer was evaporated under reduced pressure to dryness. To the residue, 50 g of THF was added to form a homogeneous solution, followed by crystallization with 200 g of methanol. The precipitated crystal was separated by filtration, washed twice with 100 g of methanol, and collected. The collected crystal was vacuum dried at 70° C. Thus, (A26) was obtained. The weight-average molecular weight (Mw) and dispersity (Mw/Mn) thereof were determined by GPC. The results were Mw=690 and Mw/Mn=1.03.

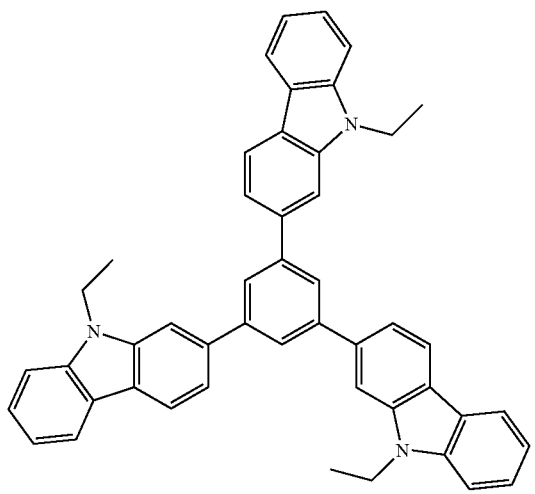

(A26)

[Synthesis Example 27] Synthesis of Compound (A27)

Under a nitrogen atmosphere, 17.8 g of N-ethylcarbazole-3-carboxyaldehyde, 25.6 g of 2,6-dihydroxynaphthalene, 3.9 g of p-toluenesulfonic acid, and 100 g of 1,4-dioxane were added and allowed to react at 90° C. for 6 hours. After cooling to room temperature, 200 g of methyl isobutyl ketone was added, and the organic layer was washed five times with 50 g of pure water. Subsequently, the organic layer was evaporated under reduced pressure to dryness. To the residue, 100 g of THF was added to form a homogeneous solution, followed by crystallization with 400 g of heptane. The precipitated crystal was separated by filtration, washed twice with 200 g of heptane, and collected. The collected crystal was vacuum dried at 70° C. Thus, (A27) was obtained. The weight-average molecular weight (Mw) and dispersity (Mw/Mn) thereof were determined by GPC. The results were Mw=540 and Mw/Mn=1.02.

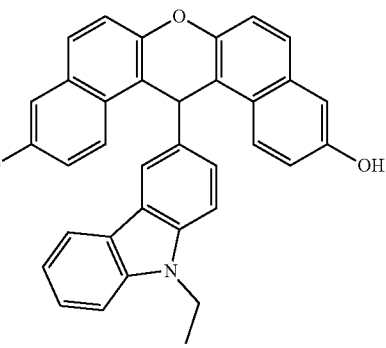

(A27)

Table 2 shows a list of the structural formulae, weight-average molecular weights (Mw), and dispersities (Mw/Mn) of the polymers and compounds obtained as described above.

TABLE 2

| Synthesis Example | Polymer or Compound | Mw | Mw/Mn |
|---|---|---|---|
| 1 | 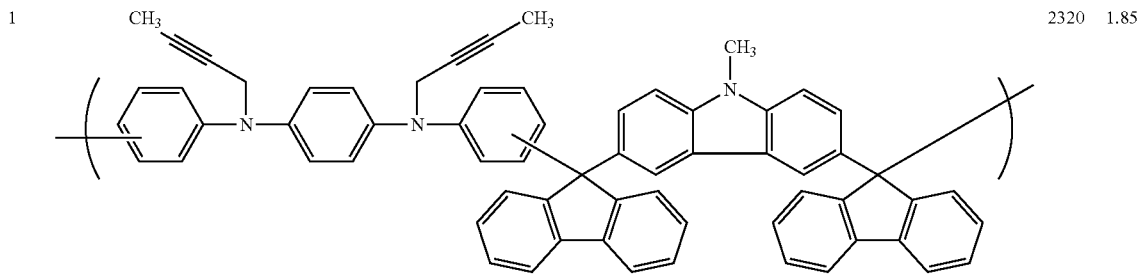<br>(A1) | 2320 | 1.85 |

TABLE 2-continued
| Synthesis Example | Polymer or Compound | Mw | Mw/Mn |
|---|---|---|---|
| 2 | 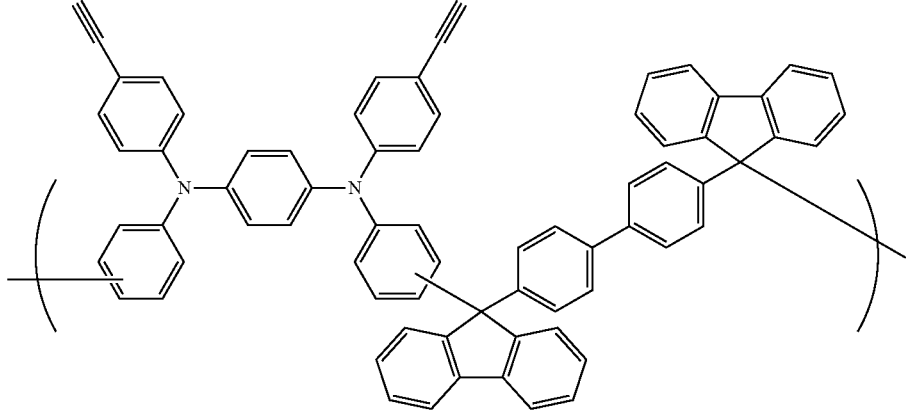<br>(A2) | 2550 | 1.73 |
| 3 | 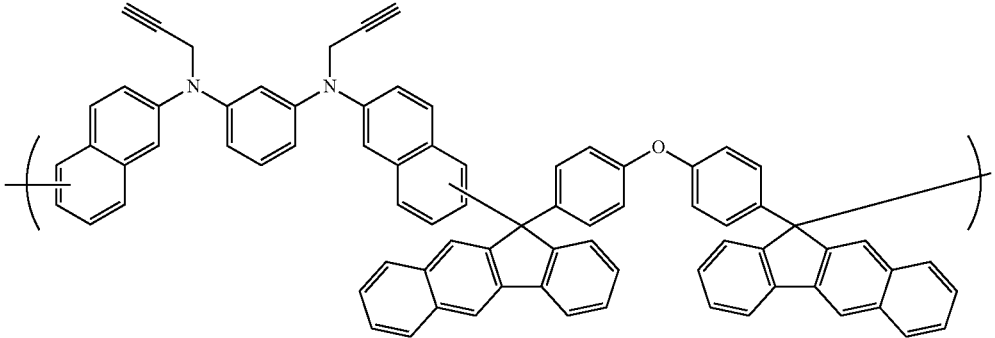<br>(A3) | 2780 | 1.71 |
| 4 | 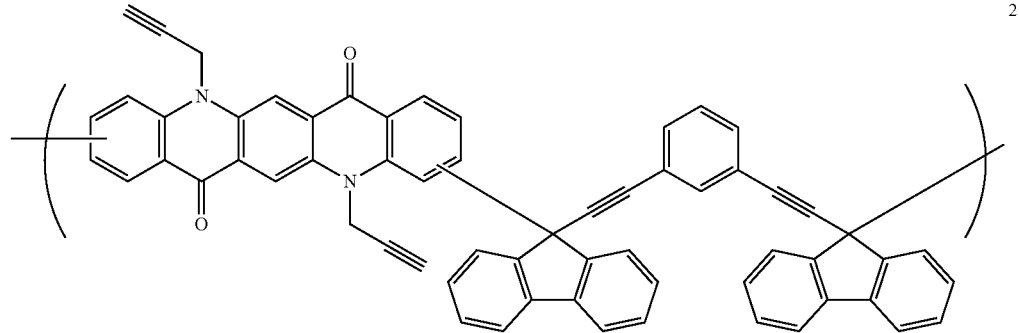<br>(A4) | 2840 | 1.95 |

TABLE 2-continued
| Synthesis Example | Polymer or Compound | Mw | Mw/Mn |
|---|---|---|---|
| 5 | 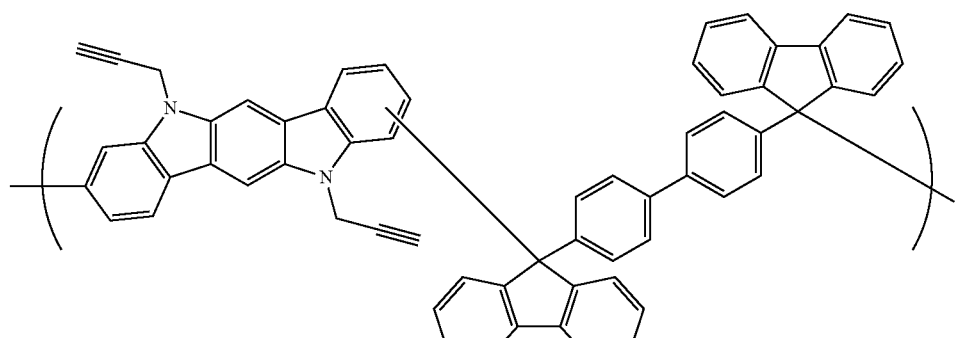 (A5) | 2120 | 1.63 |
| 6 | 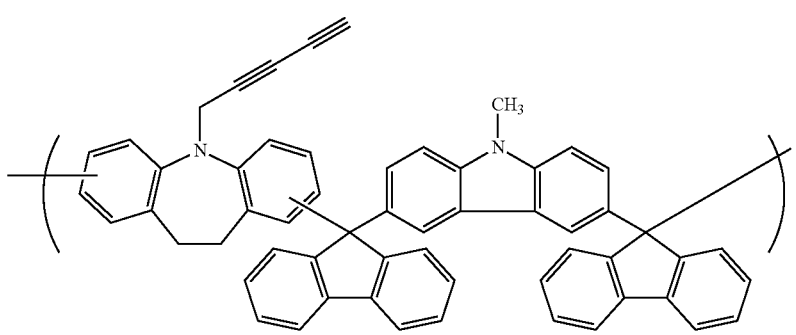 (A6) | 2210 | 1.58 |
| 7 | 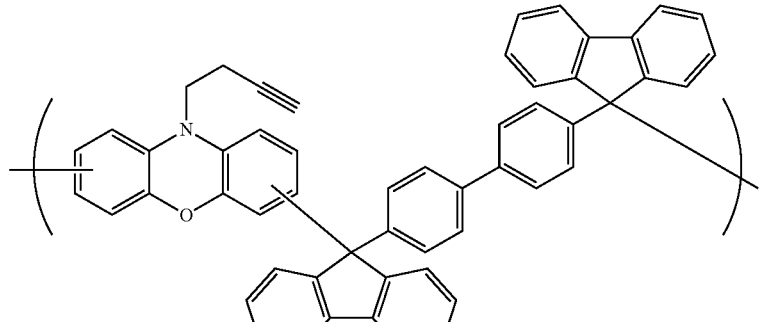 (A7) | 2050 | 1.68 |

TABLE 2-continued
| Synthesis Example | Polymer or Compound | Mw | Mw/Mn |
|---|---|---|---|
| 8 | 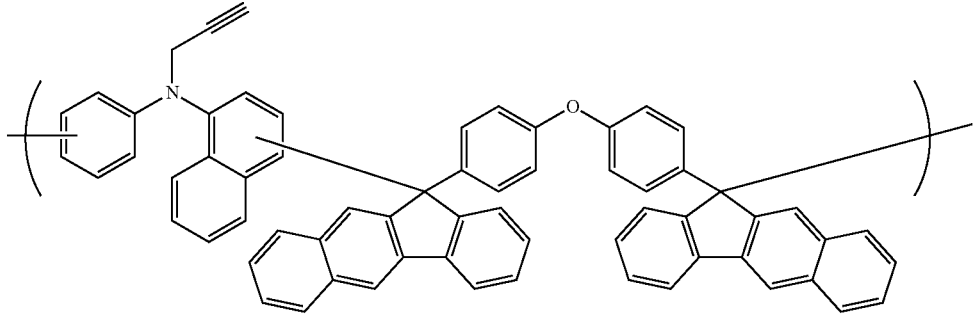<br>(A8) | 2440 | 1.81 |
| 9 | 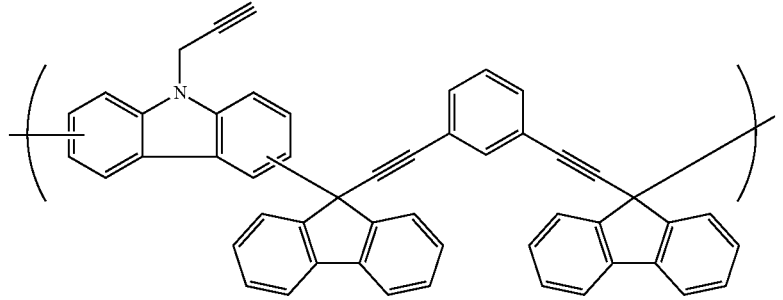<br>(A9) | 2280 | 1.76 |
| 10 | 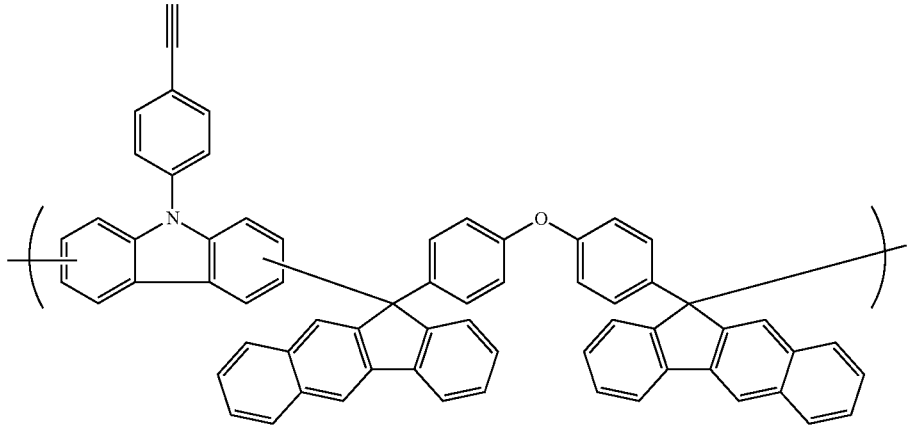<br>(A10) | 2940 | 1.90 |

TABLE 2-continued
| Synthesis Example | Polymer or Compound | Mw | Mw/Mn |
|---|---|---|---|
| 11 | 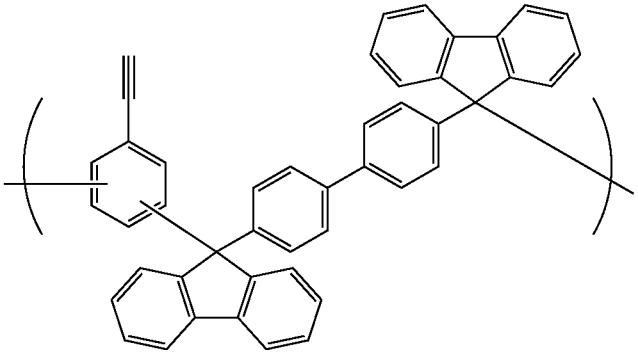 (A11) | 2680 | 2.10 |
| 12 | 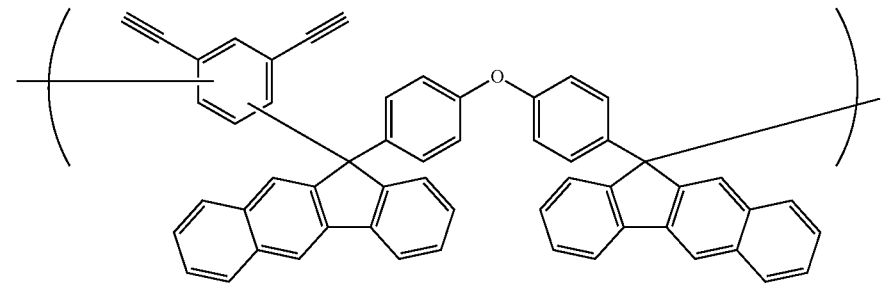 (A12) | 2480 | 1.99 |
| 13 | 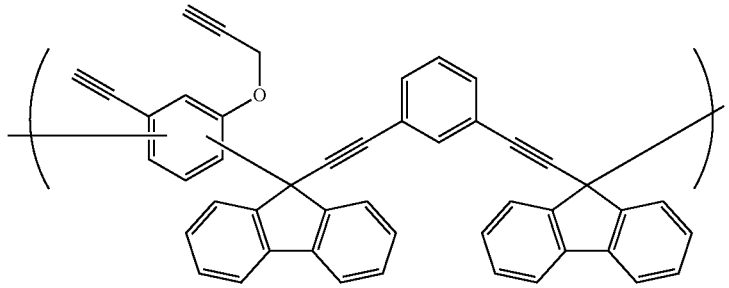 (A13) | 2830 | 2.21 |
| 14 | 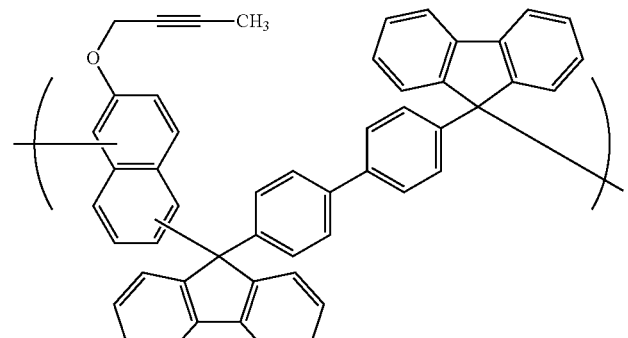 (A14) | 2940 | 1.94 |

TABLE 2-continued

| Synthesis Example | Polymer or Compound | Mw | Mw/Mn |
|---|---|---|---|
| 15 | (A15) | 2750 | 1.87 |
| 16 | (A16) | 2510 | 1.76 |
| 17 | (A17) | 2710 | 2.24 |

TABLE 2-continued
| Synthesis Example | Polymer or Compound | Mw | Mw/Mn |
|---|---|---|---|
| 18 | (A18) | 2600 | 2.31 |
| 19 | (A19) | 2430 | 1.65 |
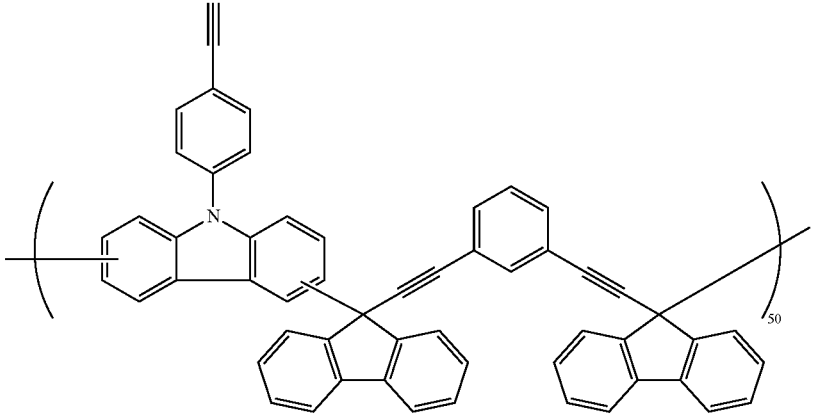
(A18)
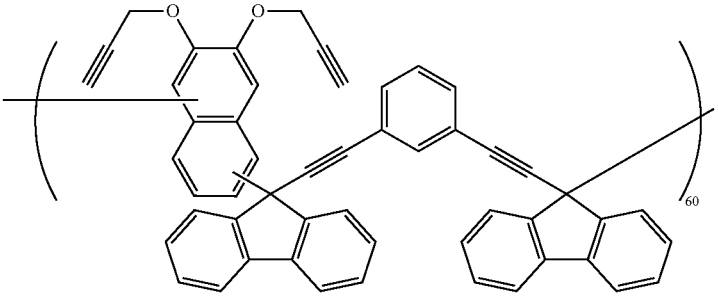
(A19)

TABLE 2-continued
| Synthesis Example | Polymer or Compound | | Mw | Mw/Mn |
|---|---|---|---|---|
| 20 | 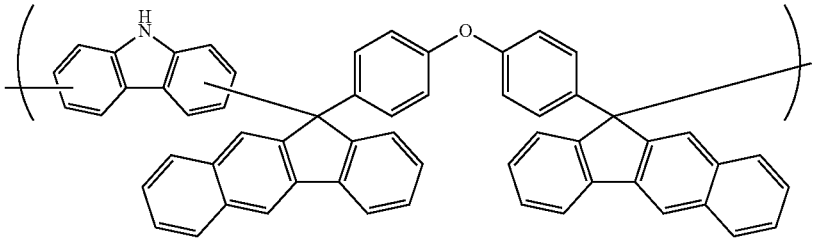 (A20) | | 2270 | 1.68 |
| 21 | 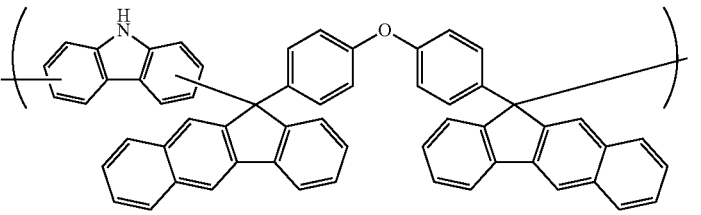 (A21) | 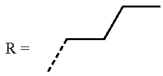 R = / or / 30:70 | 2670 | 1.74 |
| 22 | 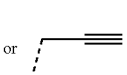 (A22) | | 2650 | 1.77 |
| 23 | 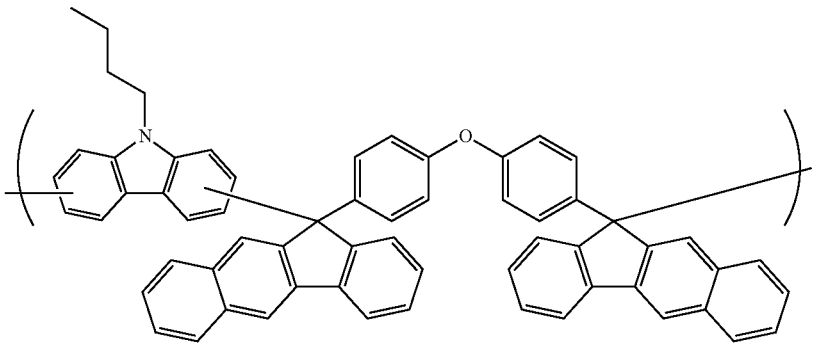 (A23) | | 2370 | 1.82 |

TABLE 2-continued
| Synthesis Example | Polymer or Compound | Mw | Mw/Mn |
|---|---|---|---|
| 24 | 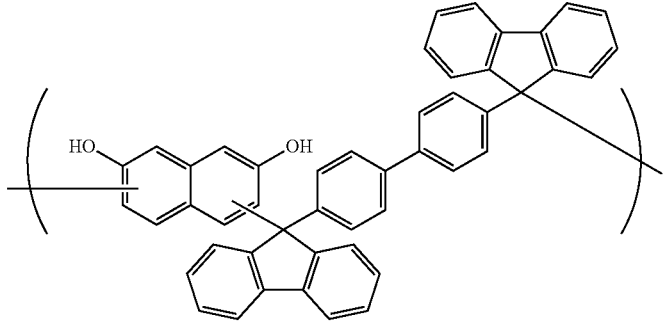 (A24) | 2580 | 1.89 |
| 25 | 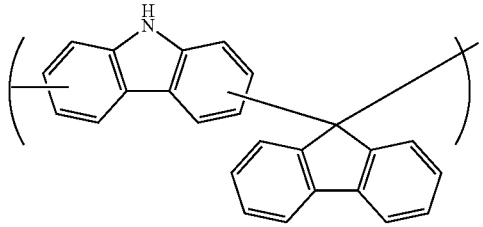 (A25) | 2880 | 2.29 |
| 26 | 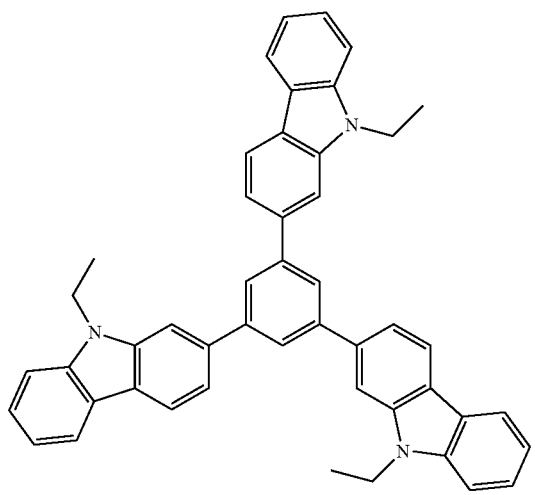 (A26) | 690 | 1.03 |

TABLE 2-continued

| Synthesis Example | Polymer or Compound | Mw | Mw/Mn |
|---|---|---|---|
| 27 | 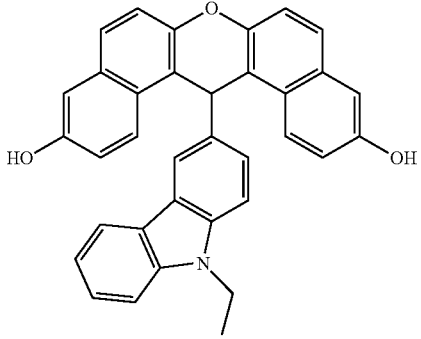<br>(A27) | 540 | 1.02 |

Preparation of Compositions (UDL-1 to -23, Comparative UDL-1 to -14) for Forming Organic Film Polymers or Compounds (A1) to (A27) described above were dissolved in proportions shown in Table 3 using at least one solvent of propylene glycol monomethyl ether acetate (PGMEA) and cyclohexanone (CyHO) both of which contained 0.1 mass % FC-4430 (manufactured by Sumitomo 3M Ltd.), and optionally using a crosslinking agent (CR1, CR2) and an acid generator (AG1) as additives, and (S1) 1,6-diacetoxyhexane (boiling point: 260° C.), (S2) γ-butyrolactone (boiling point: 204° C.), and (S3) tripropylene glycol monomethyl ether (boiling point: 242° C.) as high-boiling-point solvents. The solutions were filtered through a 0.1-μm filter made of a fluorinated resin to prepare compositions (UDL-1 to -23, Comparative UDL-1 to -14) for forming an organic film.

TABLE 3

| Composition for forming organic film | Polymer or Compound (parts by mass) | Crosslinking agent (parts by mass) | Acid generator (parts by mass) | High-boiling-point solvent (parts by mass) | CyHO (parts by mass) | PGMEA (parts by mass) |
|---|---|---|---|---|---|---|
| UDL-1 | A1 (10) | — | — | — | — | 90 |
| UDL-2 | A2 (10) | — | — | — | 60 | 30 |
| UDL-3 | A3 (10) | — | — | — | — | 90 |
| UDL-4 | A4 (10) | — | — | — | 60 | 30 |
| UDL-5 | A5 (10) | — | — | — | 60 | 30 |
| UDL-6 | A6 (10) | — | — | — | — | 90 |
| UDL-7 | A7 (10) | — | — | — | 60 | 30 |
| UDL-8 | A8 (10) | — | — | — | — | 90 |
| UDL-9 | A9 (10) | — | — | — | — | 90 |
| UDL-10 | A10 (10) | — | — | — | — | 90 |
| UDL-11 | A11 (10) | — | — | — | 60 | 30 |
| UDL-12 | A12 (10) | — | — | — | 60 | 30 |
| UDL-13 | A13 (10) | — | — | — | — | 90 |
| UDL-14 | A14 (10) | — | — | — | — | 90 |
| UDL-15 | A15 (10) | — | — | — | — | 90 |
| UDL-16 | A16 (10) | — | — | — | 60 | 30 |
| UDL-17 | A17 (10) | — | — | — | — | 90 |
| UDL-18 | A18 (10) | — | — | — | — | 90 |
| UDL-19 | A21 (10) | — | — | — | — | 90 |
| UDL-20 | A24 (10) | — | — | — | — | 90 |
| UDL-21 | A5 (10) | — | — | S1 (10) | — | 80 |
| VOL-22 | A9 (10) | — | — | S2 (10) | — | 80 |
| UDL-23 | A15 (10) | — | — | S3 (10) | — | 80 |
| Comparative UDL-1 | A19 (10) | — | — | — | 90 | — |
| Comparative UDL-2 | A20 (10) | — | — | — | 60 | 30 |
| Comparative UDL-3 | A22 (10) | — | — | — | — | 90 |
| Comparative UDL-4 | A23 (10) | — | — | — | — | 90 |
| Comparative UDL-5 | A25 (10) | — | — | — | 90 | — |
| Comparative UDL-6 | A26 (10) | — | — | — | 60 | 30 |

TABLE 3-continued

| Composition for forming organic film | Polymer or Compound (parts by mass) | Crosslinking agent (parts by mass) | Acid generator (parts by mass) | High-boiling-point solvent (parts by mass) | CyHO (parts by mass) | PGMEA (parts by mass) |
|---|---|---|---|---|---|---|
| Comparative UDL-7 | A27 (10) | — | — | — | — | 90 |
| Comparative UDL-8 | A19 (10) | CR1 (1) | AG1 (0.5) | — | 90 | — |
| Comparative UDL-9 | A20 (10) | CR1 (1) | AG1 (0.5) | — | 60 | 30 |
| Comparative UDL-10 | A22 (10) | CR1 (1) | AG1 (0.5) | — | — | 90 |
| Comparative UDL-11 | A23 (10) | CR1 (1) | AG1 (0.5) | — | — | 90 |
| Comparative UDL-12 | A25 (10) | CR1 (1) | AG1 (0.5) | — | 90 | — |
| Comparative UDL-13 | A26 (10) | CR1 (1) | AG1 (0.5) | — | 60 | 30 |
| Comparative UDL-14 | A27 (10) | CR2 (1) | AG1 (0.5) | — | — | 90 |

The crosslinking agents (CR1), (CR2) and the acid generator (AG1) used are shown below.

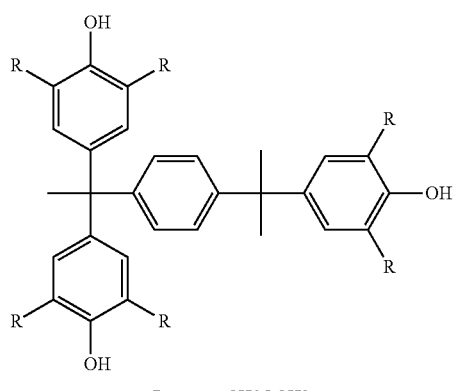

(CR1)

R = —CH2OCH3

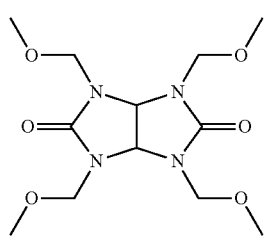

(CR2)

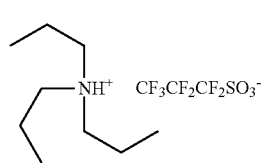

(AG1)

Example 1: Solvent Resistance Measurement
(Examples 1-1 to 1-23, Comparative Examples 1-1 to 1-14)

The compositions (UDL-1 to -23, Comparative UDL-1 to -14) for forming an organic film prepared above were each applied onto a silicon substrate, and baked at 400° C. for 60 seconds under a nitrogen stream with the oxygen concentration being controlled to 0.2% or less. Then, the film thickness was measured. A PGMEA solvent was dispensed on the film and allowed to stand for 30 seconds. The resultant was spin dried and baked at 100° C. for 60 seconds to evaporate the PGMEA. The film thickness was measured to find a difference in the film thicknesses before and after the PGMEA treatment.

TABLE 4

| | Composition for forming organic film | Film thickness after film formation: a (Å) | Film thickness after PGMEA treatment: b (Å) | b/a × 100 (%) |
|---|---|---|---|---|
| Example 1-1 | UDL-1 | 2007 | 1999 | 99.6 |
| Example 1-2 | UDL-2 | 2011 | 2002 | 99.6 |
| Example 1-3 | UDL-3 | 2008 | 2000 | 99.6 |
| Example 1-4 | UDL-4 | 1999 | 1995 | 99.8 |
| Example 1-5 | UDL-5 | 1990 | 1983 | 99.6 |
| Example 1-6 | UDL-6 | 1991 | 1985 | 99.7 |
| Example 1-7 | UDL-7 | 2000 | 1992 | 99.6 |
| Example 1-8 | UDL-8 | 2010 | 2004 | 99.7 |
| Example 1-9 | UDL-9 | 2006 | 1998 | 99.6 |
| Example 1-10 | UDL-10 | 2008 | 2001 | 99.7 |
| Example 1-11 | UDL-11 | 1998 | 1993 | 99.7 |
| Example 1-12 | UDL-12 | 2004 | 1995 | 99.6 |
| Example 1-13 | UDL-13 | 1999 | 1990 | 99.5 |
| Example 1-14 | UDL-14 | 2011 | 2004 | 99.7 |
| Example 1-15 | UDL-15 | 1998 | 1989 | 99.5 |
| Example 1-16 | UDL-16 | 1992 | 1990 | 99.9 |
| Example 1-17 | UDL-17 | 2008 | 2004 | 99.8 |
| Example 1-18 | UDL-18 | 1990 | 1987 | 99.8 |
| Example 1-19 | UDL-19 | 1998 | 1990 | 99.6 |
| Example 1-20 | UDL-20 | 2013 | 2007 | 99.7 |
| Example 1-21 | UDL-21 | 1990 | 1980 | 99.5 |
| Example 1-22 | UDL-22 | 2011 | 2005 | 99.7 |
| Example 1-23 | UDL-23 | 1999 | 1995 | 99.8 |
| Comparative Example 1-1 | Comparative UDL-1 | 1994 | 967 | 48.5 |
| Comparative Example 1-2 | Comparative UDL-2 | 1994 | 924 | 46.3 |
| Comparative Example 1-3 | Comparative UDL-3 | 2000 | 884 | 44.2 |
| Comparative Example 1-4 | Comparative UDL-4 | 2005 | 456 | 22.7 |
| Comparative Example 1-5 | Comparative UDL-5 | 2011 | 946 | 47.0 |
| Comparative Example 1-6 | Comparative UDL-6 | 1998 | 670 | 33.5 |
| Comparative Example 1-7 | Comparative UDL-7 | 1997 | 255 | 12.8 |
| Comparative Example 1-8 | Comparative UDL-8 | 2010 | 1998 | 99.4 |
| Comparative Example 1-9 | Comparative UDL-9 | 2014 | 2001 | 99.4 |

TABLE 4-continued

| | Composition for forming organic film | Film thickness after film formation: a (Å) | Film thickness after PGMEA treatment: b (Å) | b/a × 100 (%) |
|---|---|---|---|---|
| Comparative Example 1-10 | Comparative UDL-10 | 1999 | 1987 | 99.4 |
| Comparative Example 1-11 | Comparative UDL-11 | 2002 | 1990 | 99.4 |
| Comparative Example 1-12 | Comparative UDL-12 | 2001 | 1983 | 99.1 |
| Comparative Example 1-13 | Comparative UDL-13 | 2001 | 1985 | 99.2 |
| Comparative Example 1-14 | Comparative UDL-14 | 1991 | 1978 | 99.3 |

As shown in Table 4, the inventive compositions for forming an organic film (Examples 1-1 to 1-23) had film remaining percentages of 99% or more after the PGMEA treatment. This indicates that the crosslinking reaction took place even under the nitrogen atmosphere, and sufficient solvent resistance was exhibited. In contrast, among Comparative Examples 1-1 to 1-14, in Comparative Examples 1-1 to 1-7 in which the crosslinking agent and the thermal acid generator were not added, the film remaining percentages after the PGMEA treatment were all less than 50%, and sufficient solvent resistance was not exhibited. In order for solvent resistance to be exhibited as in Comparative Examples 1-8 to 1-14, the crosslinking agent and the thermal acid generator need to be added. These results indicate that the thermosetting reaction took place by the substituent containing a triple bond in the inventive polymer, so that the solvent resistance was exhibited, and the cured film was formed.

Example 2: Heat Resistance Evaluation (Examples 2-1 to 2-23, Comparative Examples 2-1 to 2-14)

The compositions (UDL-1 to -23, Comparative UDL-1 to -14) for forming an organic film were each applied onto a silicon substrate and baked in the atmosphere at 180° C. for 60 seconds to form a coating film of 200 nm. The film thickness was measured. This substrate was further baked at 450° C. for 10 minutes under a nitrogen stream with the oxygen concentration being controlled to 0.2% or less. The resulting film thickness was measured. Table 5 shows these results.

TABLE 5

| | Composition for forming organic film | Film thickness at 180° C.: A (Å) | Film thickness at 450° C.: B (Å) | Film reduction ratio (B/A) % |
|---|---|---|---|---|
| Example 2-1 | UDL-1 | 1994 | 1990 | 99.8 |
| Example 2-2 | UDL-2 | 2010 | 2001 | 99.6 |
| Example 2-3 | UDL-3 | 2003 | 1990 | 99.4 |
| Example 2-4 | UDL-4 | 2000 | 1987 | 99.4 |
| Example 2-5 | UDL-5 | 2014 | 2001 | 99.4 |
| Example 2-6 | UDL-6 | 2001 | 1994 | 99.7 |
| Example 2-7 | UDL-7 | 2007 | 1998 | 99.6 |
| Example 2-8 | UDL-8 | 2012 | 2001 | 99.5 |
| Example 2-9 | UDL-9 | 2001 | 1989 | 99.4 |
| Example 2-10 | UDL-10 | 2003 | 1993 | 99.5 |
| Example 2-11 | UDL-11 | 1997 | 1981 | 99.2 |
| Example 2-12 | UDL-12 | 1994 | 1983 | 99.4 |
| Example 2-13 | UDL-13 | 2008 | 2000 | 99.6 |
| Example 2-14 | UDL-14 | 1992 | 1978 | 99.3 |
| Example 2-15 | UDL-15 | 2008 | 1999 | 99.6 |
| Example 2-16 | UDL-16 | 1990 | 1976 | 99.3 |
| Example 2-17 | UDL-17 | 2007 | 1999 | 99.6 |
| Example 2-18 | UDL-18 | 1995 | 1988 | 99.6 |
| Example 2-19 | UDL-19 | 2003 | 1996 | 99.7 |
| Example 2-20 | UDL-20 | 1995 | 1985 | 99.5 |
| Example 2-21 | UDL-21 | 1994 | 1988 | 99.7 |
| Example 2-22 | UDL-22 | 2011 | 2005 | 99.7 |
| Example 2-23 | UDL-23 | 2007 | 1999 | 99.6 |
| Comparative Example 2-1 | Comparative UDL-1 | 2004 | 1438 | 71.8 |
| Comparative Example 2-2 | Comparative UDL-2 | 2003 | 1349 | 67.3 |
| Comparative Example 2-3 | Comparative UDL-3 | 1991 | 1421 | 71.4 |
| Comparative Example 2-4 | Comparative UDL-4 | 2005 | 1299 | 64.8 |
| Comparative Example 2-5 | Comparative UDL-5 | 1997 | 1440 | 72.1 |
| Comparative Example 2-6 | Comparative UDL-6 | 1993 | 851 | 42.7 |
| Comparative Example 2-7 | Comparative UDL-7 | 1993 | 489 | 24.5 |
| Comparative Example 2-8 | Comparative UDL-8 | 2002 | 1678 | 83.8 |
| Comparative Example 2-9 | Comparative UDL-9 | 2011 | 1720 | 85.5 |
| Comparative Example 2-10 | Comparative UDL-10 | 2000 | 1688 | 84.4 |
| Comparative Example 2-11 | Comparative UDL-11 | 2009 | 1713 | 85.3 |
| Comparative Example 2-12 | Comparative UDL-12 | 1992 | 1692 | 84.9 |
| Comparative Example 2-13 | Comparative UDL-13 | 2011 | 1611 | 80.1 |
| Comparative Example 2-14 | Comparative UDL-14 | 2015 | 1605 | 79.7 |

As shown in Table 5, in Examples 2-1 to 2-23 using the inventive compositions for forming an organic film, the film thicknesses were reduced by less than 1% even after the baking at 450° C. Since the film thicknesses were kept even after the baking at 450° C., this indicates that the inventive compositions for forming an organic film have high heat resistance. In contrast, in Comparative Examples 2-1 to 2-14, the film thicknesses were reduced much more than those of the inventive compositions for forming an organic film. Particularly, in Comparative Examples 2-6 and 2-7 using single-molecular compounds, the film thicknesses were consequently reduced even more greatly by generation of sublimation product. Moreover, in Comparative Examples 2-8 to 2-14 also in which the crosslinking agent was added and cured, the film thickness reductions due to thermal decomposition were no suppressed, and the film thickness were reduced by 10% or more. In Examples 2-1 to 2-23 using the inventive compositions for forming an organic film, the film thicknesses after the baking at 180° C. were retained after the baking at 450° C. under the nitrogen atmosphere. These indicate that the inventive compositions for forming an organic film exhibit excellent heat resistance in an inert gas.

Example 3: Filling Property Evaluation (Examples 3-1 to 3-23, Comparative Examples 3-1 to 3-14)

As shown in FIG. 3, the compositions (UDL-1 to -23, Comparative UDL-1 to -14) for forming an organic film were each applied onto a SiO$_2$ wafer substrate having a dense hole pattern (hole diameter: 0.16 μm, hole depth: 0.50

μm, distance between the centers of adjacent two holes: 0.32 μm) and baked with a hot plate at 450° C. for 60 seconds under a nitrogen stream with the oxygen concentration being controlled to 0.2% or less. Thereby, an organic film 8 was formed. The substrate used was a base substrate 7 ($SiO_2$ wafer substrate) having a dense hole pattern as shown in FIG. 3 (G) (top view) and (H) (sectional view). The sectional shapes of the resulting wafer substrates were observed with a scanning electron microscope (SEM) to check whether or not the holes were filled with the organic film without voids (space). Table 6 shows the result. If a composition for forming an organic film having poor filling property is used, voids occur inside the holes in this evaluation. If a composition for forming an organic film having good filling property is used, the holes are filled with an organic film 8 without voids in this evaluation as shown in FIG. 3 (I).

TABLE 6

|  | Composition for forming organic film | Presence/absence of voids |
|---|---|---|
| Example 3-1 | UDL-1 | absence |
| Example 3-2 | UDL-2 | absence |
| Example 3-3 | UDL-3 | absence |
| Example 3-4 | UDL-4 | absence |
| Example 3-5 | UDL-5 | absence |
| Example 3-6 | UDL-6 | absence |
| Example 3-7 | UDL-7 | absence |
| Example 3-8 | UDL-8 | absence |
| Example 3-9 | UDL-9 | absence |
| Example 3-10 | UDL-10 | absence |
| Example 3-11 | UDL-11 | absence |
| Example 3-12 | UDL-12 | absence |
| Example 3-13 | UDL-13 | absence |
| Example 3-14 | UDL-14 | absence |
| Example 3-15 | UDL-15 | absence |
| Example 3-16 | UDL-16 | absence |
| Example 3-17 | UDL-17 | absence |
| Example 3-18 | UDL-18 | absence |
| Example 3-19 | UDL-19 | absence |
| Example 3-20 | UDL-20 | absence |
| Example 3-21 | UDL-21 | absence |
| Example 3-22 | UDL-22 | absence |
| Example 3-23 | UDL-23 | absence |
| Comparative Example 3-1 | Comparative UDL-1 | presence |
| Comparative Example 3-2 | Comparative UDL-2 | presence |
| Comparative Example 3-3 | Comparative UDL-3 | presence |
| Comparative Example 3-4 | Comparative UDL-4 | presence |
| Comparative Example 3-5 | Comparative UDL-5 | presence |
| Comparative Example 3-6 | Comparative UDL-6 | presence |
| Comparative Example 3-7 | Comparative UDL-7 | presence |
| Comparative Example 3-8 | Comparative UDL-8 | presence |
| Comparative Example 3-9 | Comparative UDL-9 | presence |
| Comparative Example 3-10 | Comparative UDL-10 | presence |
| Comparative Example 3-11 | Comparative UDL-11 | presence |
| Comparative Example 3-12 | Comparative UDL-12 | presence |
| Comparative Example 3-13 | Comparative UDL-13 | presence |
| Comparative Example 3-14 | Comparative UDL-14 | presence |

As shown in Table 6, the inventive compositions for forming an organic film (Examples 3-1 to 3-23) enable the hole patterns to be filled without voids, confirming that the filling property was favorable. Meanwhile, in Comparative Examples 3-1 to 3-14, voids occurred, confirming that the filling property was poor. The results indicated that the inventive composition for forming an organic film enables filling without creating voids while the heat resistance is guaranteed through the thermosetting reaction by the action of the substituent containing a triple bond. On the other hand, in Comparative Examples 3-1 to 3-14, even when the crosslinking agent was used to form a cured film, voids occurred due to insufficient heat resistance under the nitrogen atmosphere, and favorable filling property was not obtained.

Example 4: Planarizing Property Evaluation
(Examples 4-1 to 4-23, Comparative Examples 4-1 to 4-12)

The compositions (UDL-1 to -23, Comparative UDL-1 to -5, -8 to -14) for forming an organic film were each applied onto a base substrate 9 ($SiO_2$ wafer substrate) having a giant isolated trench pattern (FIG. 4(J), trench width: 10 μm, trench depth: 0.10 μm), and baked at 450° C. for 60 seconds under a nitrogen stream with the oxygen concentration being controlled to 0.2% or less. Then, a step (delta 10 in FIG. 4 (K)) between the trench portion and the non-trench portion of an organic film 10 was observed with an atomic force microscope (AFM) NX10 manufactured by Park systems Corp. Table 7 shows the result. In this evaluation, the smaller the step, the more favorable the planarizing property. Note that, in this evaluation, a trench pattern having a depth of 0.10 μm was generally planarized using a composition for forming an organic film with a film thickness of approximately 0.2 μm. This is a strict evaluation condition to evaluate the planarizing property. Note that, regarding Comparative UDL-6 and -7, since the film thicknesses were reduced too much after the baking, it was impossible to evaluate the planarizing properties.

TABLE 7

|  | Composition for forming organic film | Step (nm) |
|---|---|---|
| Example 4-1 | UDL-1 | 60 |
| Example 4-2 | UDL-2 | 45 |
| Example 4-3 | UDL-3 | 40 |
| Example 4-4 | UDL-4 | 50 |
| Example 4-5 | UDL-5 | 40 |
| Example 4-6 | UDL-6 | 60 |
| Example 4-7 | UDL-7 | 50 |
| Example 4-8 | UDL-8 | 55 |
| Example 4-9 | UDL-9 | 35 |
| Example 4-10 | UDL-10 | 45 |
| Example 4-11 | UDL-11 | 35 |
| Example 4-12 | UDL-12 | 35 |
| Example 4-13 | UDL-13 | 40 |
| Example 4-14 | UDL-14 | 35 |
| Example 4-15 | UDL-15 | 30 |
| Example 4-16 | UDL-16 | 40 |
| Example 4-17 | UDL-17 | 35 |
| Example 4-18 | UDL-18 | 40 |
| Example 4-19 | UDL-19 | 30 |
| Example 4-20 | UDL-20 | 35 |
| Example 4-21 | UDL-21 | 30 |
| Example 4-22 | UDL-22 | 25 |
| Example 4-23 | UDL-23 | 20 |
| Comparative Example 4-1 | Comparative UDL-1 | 95 |
| Comparative Example 4-2 | Comparative UDL-2 | 90 |
| Comparative Example 4-3 | Comparative UDL-3 | 95 |

TABLE 7-continued

| | Composition for forming organic film | Step (nm) |
|---|---|---|
| Comparative Example 4-4 | Comparative UDL-4 | 90 |
| Comparative Example 4-5 | Comparative UDL-5 | 90 |
| Comparative Example 4-6 | Comparative UDL-8 | 90 |
| Comparative Example 4-7 | Comparative UDL-9 | 90 |
| Comparative Example 4-8 | Comparative UDL-10 | 95 |
| Comparative Example 4-9 | Comparative UDL-11 | 95 |
| Comparative Example 4-10 | Comparative UDL-12 | 95 |
| Comparative Example 4-11 | Comparative UDL-13 | 85 |
| Comparative Example 4-12 | Comparative UDL-14 | 85 |

As shown in Table 7, the inventive compositions for forming an organic film (Examples 4-1 to 4-23) formed organic films having smaller steps between the trench and non-trench portions than those in Comparative Examples 4-1 to 4-12. This verified that the inventive compositions are excellent in planarizing property. In Comparative Examples 4-1 to 4-12, the film thickness difference between the upper portion and the lower portion of each step was noticeable due to the large reductions of the films by the high-temperature baking, and the planarizing property was consequently poor as shown above. Meanwhile, although Comparative Examples 4-11 and 4-12 contained the single-molecular compounds, adding the crosslinking agent impaired the thermal flowability, and consequently the planarizing property was poor. The comparison between Examples 4-21 to 4-23 in which the high-boiling-point solvents were added and Examples 4-5, 4-9, 4-15 without the high-boiling-point solvents shows that adding the high-boiling-point solvents further improved the planarizing property.

Example 5: Patterning Test (Examples 5-1 to 5-23, Comparative Examples 5-1 to 5-7)

The compositions (UDL-1 to -23, Comparative UDL-8 to -14) for forming an organic film were each applied onto a silicon wafer substrate on which a SiO$_2$ film of 300 nm had been formed. Then, the resultant was baked at 450° C. for 60 seconds under a nitrogen stream with the oxygen concentration being controlled to 0.2% or less. Thereby, an organic film (resist middle layer film) was formed. A CVD-SiON hard mask was formed thereon. Further, an organic antireflective coating material (ARC-29A: manufactured by Nissan Chemical Industries, Ltd.) was applied and baked at 210° C. for 60 seconds to form an organic antireflective coating having a film thickness of 80 nm. A monolayer resist for ArF was applied thereon as a resist upper layer film material, and baked at 105° C. for 60 seconds to form a photoresist film having a film thickness of 100 nm. A liquid immersion top coat material (TC-1) was applied on the photoresist film and baked at 90° C. for 60 seconds to form a top coat having a film thickness of 50 nm. Incidentally, Comparative UDL-1 to UDL-7 were not subjected to the subsequent patterning test because the solvent resistance was not enough.

The resist upper layer film material (monolayer resist for ArF) was prepared by: dissolving 100 parts by mass of a polymer (RP1) shown by the following formula, 6.6 parts by mass of an acid generator (PAG1) shown by the following formula, and 0.8 parts by mass of a basic compound (Amine1) shown by the following formula in 2500 parts by mass of PGMEA containing 0.1 mass % FC-430 (manufactured by Sumitomo 3M Ltd.); and filtering the solution through a 0.1-μm filter made of a fluorinated resin.

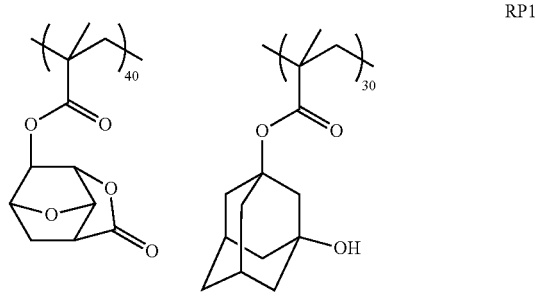

RP1

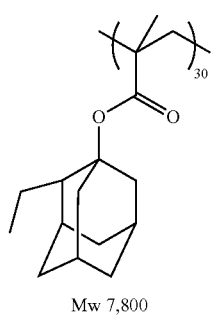

Mw 7,800

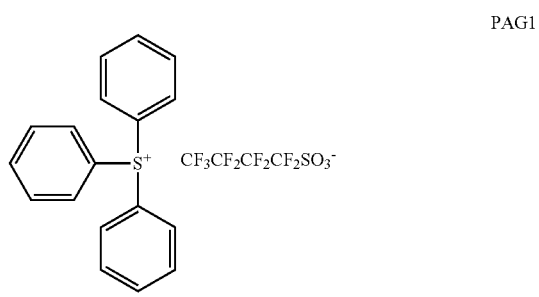

PAG1

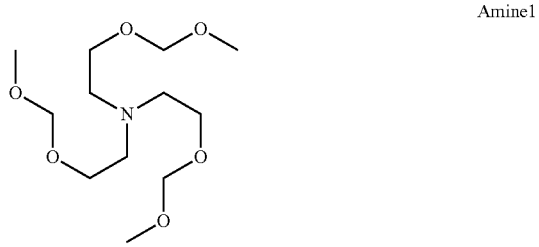

Amine1

The liquid immersion top coat material (TC-1) was prepared by: dissolving 100 parts by mass of a top coat polymer (PP1) shown by the following formula in an organic solvent consisting of 2700 parts by mass of diisoamyl ether and 270 parts by mass of 2-methyl-1-butanol; and filtering the solution through a 0.1-μm filter made of a fluorinated resin.

PP1

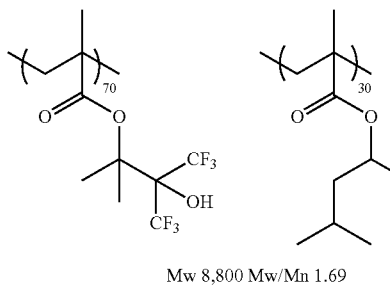

Mw 8,800 Mw/Mn 1.69

Next, the resulting substrate was exposed to light at various exposure levels with an ArF liquid immersion exposure apparatus (NSR-S610C manufactured by Nikon Corporation, NA: 1.30, σ: 0.98/0.65, 35° s-polarized dipole illumination, 6% halftone phase shift mask), baked at 100° C. for 60 seconds (PEB), and developed with a 2.38 mass % tetramethylammonium hydroxide (TMAH) aqueous solution for 30 seconds. Thus, a line and space pattern was obtained.

Then, the organic antireflective coating and the CVD-SiON hard mask were processed by dry etching using the resist pattern as a mask with an etching apparatus Telius manufactured by Tokyo Electron Limited to form a hard mask pattern. The organic film was etched using the obtained hard mask pattern as a mask to form an organic film pattern. The SiO$_2$ film was processed by etching using the obtained organic film pattern as a mask. The etching conditions were as follows.

Conditions for Transferring the Resist Pattern to the SiON Hard Mask:

| | |
|---|---|
| Chamber pressure | 10.0 Pa |
| RF power | 1,500 W |
| CF$_4$ gas flow rate | 75 sccm |
| O$_2$ gas flow rate | 15 sccm |
| Time | 15 sec |

Conditions for Transferring the Hard Mask Pattern to the Organic Film:

| | |
|---|---|
| Chamber pressure | 2.0 Pa |
| RF power | 500 W |
| Ar gas flow rate | 75 sccm |
| O$_2$ gas flow rate | 45 sccm |
| Time | 120 sec |

Conditions for Transferring the Organic Film Pattern to the SiO$_2$ Film:

| | |
|---|---|
| Chamber pressure | 2.0 Pa |
| RF power | 2,200 W |
| C$_5$F$_{12}$ gas flow rate | 20 sccm |
| C$_2$F$_6$ gas flow rate | 10 sccm |
| Ar gas flow rate | 300 sccm |
| O$_2$ gas flow rate | 60 sccm |
| Time | 90 sec |

The pattern cross sections were observed with an electron microscope (S-4700) manufactured by Hitachi, Ltd. Table 8 shows the result.

TABLE 8

| | Composition for forming organic film | Pattern profile after etching for transferring to substrate |
|---|---|---|
| Example 5-1 | UDL-1 | vertical profile |
| Example 5-2 | UDL-2 | vertical profile |
| Example 5-3 | UDL-3 | vertical profile |
| Example 5-4 | UDL-4 | vertical profile |
| Example 5-5 | UDL-5 | vertical profile |
| Example 5-6 | UDL-6 | vertical profile |
| Example 5-7 | UDL-7 | vertical profile |
| Example 5-8 | UDL-8 | vertical profile |
| Example 5-9 | UDL-9 | vertical profile |
| Example 5-10 | UDL-10 | vertical profile |
| Example 5-11 | UDL-11 | vertical profile |
| Example 5-12 | UDL-12 | vertical profile |
| Example 5-13 | UDL-13 | vertical profile |
| Example 5-14 | UDL-14 | vertical profile |
| Example 5-15 | UDL-15 | vertical profile |
| Example 5-16 | UDL-16 | vertical profile |
| Example 5-17 | UDL-17 | vertical profile |
| Example 5-18 | UDL-18 | vertical profile |
| Example 5-19 | UDL-19 | vertical profile |
| Example 5-20 | UDL-20 | vertical profile |
| Example 5-21 | UDL-21 | vertical profile |
| Example 5-22 | UDL-22 | vertical profile |
| Example 5-23 | UDL-23 | vertical profile |
| Comparative Example 5-1 | Comparative UDL-8 | vertical profile |
| Comparative Example 5-2 | Comparative UDL-9 | vertical profile |
| Comparative Example 5-3 | Comparative UDL-10 | vertical profile |
| Comparative Example 5-4 | Comparative UDL-11 | vertical profile |
| Comparative Example 5-5 | Comparative UDL-12 | vertical profile |
| Comparative Example 5-6 | Comparative UDL-13 | vertical profile |
| Comparative Example 5-7 | Comparative UDL-14 | vertical profile |

As shown in Table 8, the result of any of the inventive compositions for forming an organic film (Examples 5-1 to 5-23) revealed that the resist upper layer film pattern was favorably transferred to the final substrate, confirming that the inventive compositions for forming an organic film are suitably used in fine patterning according to the multilayer resist method. In Comparative Examples 5-1 to 5-7, the patterns were formed, although the heat resistance was insufficient.

Example 6: Patterning Test (Examples 6-1 to 6-23, Comparative Examples 6-1 to 6-7)

Coating films were formed by the same method as in Example 5, except that the compositions (UDL-1 to -23, Comparative UDL-8 to -14) for forming an organic film were each applied onto a SiO$_2$ wafer substrate having a trench pattern (trench width: 10 μm, trench depth 0.10 μm) and baked at 450° C. for 60 seconds under a nitrogen stream with the oxygen concentration being controlled to 0.2% or less. Then, the coating films were subjected to patterning and dry etching. The resulting pattern profiles were observed. Table 9 shows the result.

TABLE 9

| | Composition for forming organic film | Pattern profile after etching for transferring to substrate |
|---|---|---|
| Example 6-1 | UDL-1 | vertical profile |
| Example 6-2 | UDL-2 | vertical profile |
| Example 6-3 | UDL-3 | vertical profile |
| Example 6-4 | UDL-4 | vertical profile |
| Example 6-5 | UDL-5 | vertical profile |
| Example 6-6 | UDL-6 | vertical profile |
| Example 6-7 | UDL-7 | vertical profile |
| Example 6-8 | UDL-8 | vertical profile |
| Example 6-9 | UDL-9 | vertical profile |
| Example 6-10 | UDL-10 | vertical profile |
| Example 6-11 | UDL-11 | vertical profile |
| Example 6-12 | UDL-12 | vertical profile |
| Example 6-13 | UDL-13 | vertical profile |
| Example 6-14 | UDL-14 | vertical profile |
| Example 6-15 | UDL-15 | vertical profile |
| Example 6-16 | UDL-16 | vertical profile |
| Example 6-17 | UDL-17 | vertical profile |
| Example 6-18 | UDL-18 | vertical profile |
| Example 6-19 | UDL-19 | vertical profile |
| Example 6-20 | UDL-20 | vertical profile |
| Example 6-21 | UDL-21 | vertical profile |
| Example 6-22 | UDL-22 | vertical profile |
| Example 6-23 | UDL-23 | vertical profile |
| Comparative Example 6-1 | Comparative UDL-8 | pattern collapse |
| Comparative Example 6-2 | Comparative UDL-9 | pattern collapse |
| Comparative Example 6-3 | Comparative UDL-10 | pattern collapse |
| Comparative Example 6-4 | Comparative UDL-11 | pattern collapse |
| Comparative Example 6-5 | Comparative UDL-12 | pattern collapse |
| Comparative Example 6-6 | Comparative UDL-13 | pattern collapse |
| Comparative Example 6-7 | Comparative UDL-14 | pattern collapse |

As shown in Table 9, with any of the inventive compositions for forming an organic film (Examples 6-1 to 6-23), the resist upper layer film pattern was favorably transferred to the final substrate, confirming that the inventive compositions for forming an organic film are suitably used in fine patterning according to the multilayer resist method. Meanwhile, in Comparative Examples 6-1 to 6-7, adding the crosslinking agent imparted the solvent resistance, and cured films were obtained. However, the patterns were poorly filled due to the insufficient heat resistance. Hence, pattern collapse occurred at the patterning, and favorable patterns were not obtained in the end.

Example 8: Coatability Test (Examples 7-1 to 7-23, Comparative Examples 7-1 to 7-4)

The compositions for forming an organic film (UDL-1 to -23, Comparative UDL-6, -7, -13, -14) were applied onto each of a Bare-Si substrate, a substrate treated with hexamethyldisilazane (HMDS), and a substrate treated with SiON, which are shown in Table 10, and baked at 400° C. for 60 seconds under a nitrogen stream with the oxygen concentration being controlled to 0.2% or less. Thereby, an organic film having a film thickness of 200 nm was formed. The organic film thus formed was observed with an optical microscope (ECLIPSE L200 manufactured by Nikon INSTECH CO., LTD.) to check the coating abnormality. Table 10 shows the observation result.

TABLE 10

| | Composition for forming organic film | Bare-Si substrate | HMDS-treated substrate | SiON-treated substrate |
|---|---|---|---|---|
| Example 7-1 | UDL-1 | no abnormality | no abnormality | no abnormality |
| Example 7-2 | UDL-2 | no abnormality | no abnormality | no abnormality |
| Example 7-3 | UDL-3 | no abnormality | no abnormality | no abnormality |
| Example 7-4 | UDL-4 | no abnormality | no abnormality | no abnormality |
| Example 7-5 | UDL-5 | no abnormality | no abnormality | no abnormality |
| Example 7-6 | UDL-6 | no abnormality | no abnormality | no abnormality |
| Example 7-7 | UDL-7 | no abnormality | no abnormality | no abnormality |
| Example 7-8 | UDL-8 | no abnormality | no abnormality | no abnormality |
| Example 7-9 | UDL-9 | no abnormality | no abnormality | no abnormality |
| Example 7-10 | UDL-10 | no abnormality | no abnormality | no abnormality |
| Example 7-11 | UDL-11 | no abnormality | no abnormality | no abnormality |
| Example 7-12 | UDL-12 | no abnormality | no abnormality | no abnormality |
| Example 7-13 | UDL-13 | no abnormality | no abnormality | no abnormality |
| Example 7-14 | UDL-14 | no abnormality | no abnormality | no abnormality |
| Example 7-15 | UDL-15 | no abnormality | no abnormality | no abnormality |
| Example 7-16 | UDL-16 | no abnormality | no abnormality | no abnormality |
| Example 7-17 | UDL-17 | no abnormality | no abnormality | no abnormality |
| Example 7-18 | UDL-18 | no abnormality | no abnormality | no abnormality |
| Example 7-19 | UDL-19 | no abnormality | no abnormality | no abnormality |
| Example 7-20 | UDL-20 | no abnormality | no abnormality | no abnormality |
| Example 7-21 | UDL-21 | no abnormality | no abnormality | no abnormality |
| Example 7-22 | UDL-22 | no abnormality | no abnormality | no abnormality |
| Example 7-23 | UDL-23 | no abnormality | no abnormality | no abnormality |
| Comparative Example 7-1 | Comparative UDL-6 | no abnormality | pinhole defect | pinhole defect |
| Comparative Example 7-2 | Comparative UDL-7 | no abnormality | pinhole defect | pinhole defect |
| Comparative Example 7-3 | Comparative UDL-13 | no abnormality | pinhole defect | pinhole defect |
| Comparative Example 7-4 | Comparative UDL-14 | no abnormality | pinhole defect | pinhole defect |

As shown in Table 10, the organic films formed from the inventive compositions for forming an organic film (Examples 7-1 to 7-23) were uniform organic films without coating abnormality regardless of the substrates. In contrast, in Comparative Examples 7-1 to 7-4 in which the organic films were formed using the single-molecular compounds, since the single-molecular compounds were used, agglomeration is likely to occur depending on the substrate, so that many pinhole-like coating defects which seemed splash were observed. It was demonstrated that the use of the inventive polymers enables the formation of uniform coating films without substrate dependency, and formation of favorable organic films without substrate dependency.

From the above, it was revealed that the inventive composition for forming an organic film containing the inventive polymer has all of heat resistance to 400° C. or higher and high filling and planarizing properties even in an oxygen-free inert gas. Thus, the inventive composition for forming an organic film is quite useful as an organic film material used in multilayer resist methods. Moreover, the inventive patterning processes using such a composition make it possible to precisely form a fine pattern even when a body to be processed is an uneven substrate.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:
1. A composition for forming an organic film, comprising:
a polymer having a partial structure shown by the following general formula (1) as a repeating unit; and
an organic solvent,

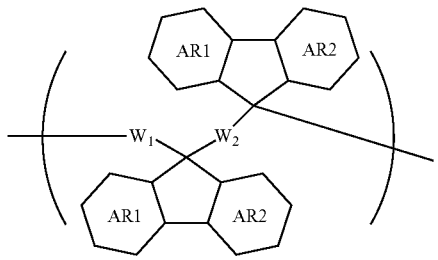

(1)

wherein each of AR1 and AR2 represents a benzene ring or a naphthalene ring which optionally have a substituent; $W_1$ represents any shown by the following general formulae (2), (4), and (6), and the polymer optionally contains two or more kinds of $W_1$; and $W_2$ represents a divalent organic group having 6 to 80 carbon atoms and at least one or more aromatic rings,

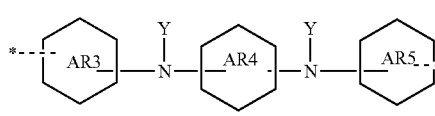

(2)

wherein AR3, AR4, and AR5 each represent a benzene ring or a naphthalene ring which optionally have a substituent, and aromatic rings of AR3 and AR4, or AR4 and AR5, optionally form a bridge structure via carbon atoms to which hydrogen atoms have been bonded on the aromatic ring; and Y represents a substituent shown by the following general formula (3),

(3)

wherein $R_3$ represents a single bond or a divalent organic group having 20 or fewer carbon atoms; and $R_4$ represents hydrogen or a monovalent organic group having 20 or fewer carbon atoms,

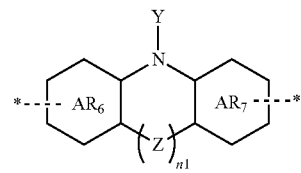

(4)

wherein $AR_6$ and $AR_7$ each represent a benzene ring or a naphthalene ring which optionally have a substituent; n1 represents 0 or 1, when n1=0, $AR_6$ and $AR_7$ form no bridge structure between aromatic rings thereof via Z, and when n1=1, $AR_6$ and $AR_7$ form a bridge structure via Z; Z represents a single bond or any in the following general formula (5); and Y represents a substituent shown by the general formula (3),

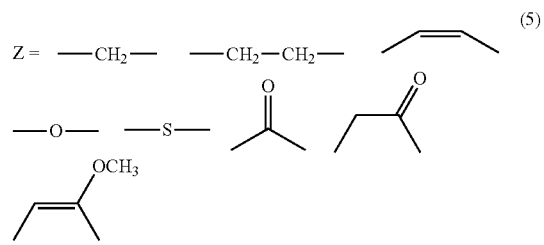

(5)

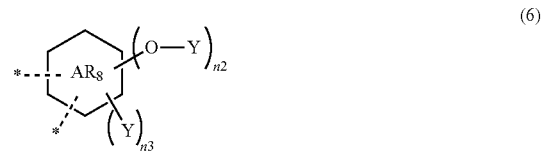

(6)

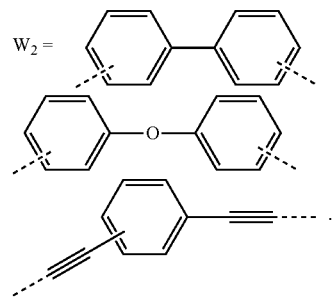

wherein $AR_8$ represents a benzene ring, a naphthalene ring, an anthracene ring, a phenanthrene ring, or a pyrene ring; Y represents a substituent shown by the general formula (3); and n2 and n3 represent integers satisfying relations of $0 \leq n2 \leq 4$, $0 \leq n3 \leq 4$, and $1 \leq n2+n3 \leq 4$.

2. The composition for forming an organic film according to claim 1, wherein the divalent organic group represented by $W_2$ in the general formula (1) is any of the following,

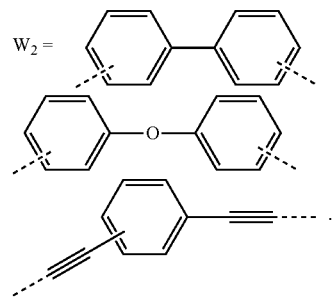

3. The composition for forming an organic film according to claim 1, wherein the polymer has a weight-average molecular weight of 1000 to 5000.

4. The composition for forming an organic film according to claim 1, wherein the organic solvent is a mixture of one or more organic solvents each having a boiling point of lower than 180° C. and one or more organic solvents each having a boiling point of 180° C. or higher.

5. The composition for forming an organic film according to claim 1, further comprising at least one of a surfactant and a plasticizer.

6. A substrate for manufacturing a semiconductor device, comprising an organic film on the substrate, the organic film being formed by curing the composition for forming an organic film according to claim 1.

7. A method for forming an organic film employed in a semiconductor device manufacturing process, the method comprising the steps of:
spin-coating a substrate to be processed with the composition for forming an organic film according to claim 1; and
heating the substrate to be processed coated with the composition for forming an organic film under an inert gas atmosphere at a temperature of 50° C. or higher and 600° C. or lower within a range of 10 seconds to 7200 seconds to obtain a cured film.

8. The method for forming an organic film according to claim 7, wherein the inert gas has an oxygen concentration of 1% or less.

9. The method for forming an organic film according to claim 7, wherein the substrate to be processed has a structure or step with a height of 30 nm or more.

10. A method for forming an organic film employed in a semiconductor device manufacturing process, the method comprising the steps of:
spin-coating a substrate to be processed with the composition for forming an organic film according to claim 1;
heating the substrate to be processed coated with the composition for forming an organic film in air at a temperature of 50° C. or higher and 250° C. or lower within a range of 5 seconds to 600 seconds to form a coating film; and
heating the resultant under an inert gas atmosphere at a temperature of 200° C. or higher and 600° C. or lower within a range of 10 seconds to 7200 seconds to obtain a cured film.

11. A patterning process comprising the steps of:
forming an organic film by using the composition for forming an organic film according to claim 1 on a body to be processed;
forming a silicon-containing resist middle layer film by using a silicon-containing resist middle layer film material on the organic film;
forming a resist upper layer film by using a photoresist composition on the silicon-containing resist middle layer film;
forming a circuit pattern in the resist upper layer film;
transferring the pattern to the silicon-containing resist middle layer film by etching using the resist upper layer film having the formed circuit pattern as a mask;
transferring the pattern to the organic film by etching using the silicon-containing resist middle layer film having the transferred pattern as a mask; and
etching the body to be processed using the organic film having the transferred pattern as a mask to form the pattern in the body to be processed.

12. The patterning process according to claim 11, wherein the circuit pattern is formed in the resist upper layer film by a photolithography with a wavelength of 10 nm or more and 300 nm or less, direct lithography with electron beam, nanoimprinting, or a combination thereof.

13. The patterning process according to claim 11, wherein alkali development or organic solvent development is employed as a development method.

14. The patterning process according to claim 11, wherein the body to be processed is a semiconductor device substrate or the semiconductor device substrate coated with any of a metal film, a metal carbide film, a metal oxide film, a metal nitride film, a metal oxycarbide film, and a metal oxynitride film.

15. The patterning process according to claim 14, wherein the metal is silicon, titanium, tungsten, hafnium, zirconium, chromium, germanium, copper, silver, gold, aluminum, indium, gallium, arsenic, palladium, iron, tantalum, iridium, cobalt, manganese, molybdenum, or an alloy thereof.

16. A patterning process comprising the steps of:
forming an organic film by using the composition for forming an organic film according to claim 1 on a body to be processed;
forming a silicon-containing resist middle layer film by using a silicon-containing resist middle layer film material on the organic film;
forming an organic antireflective coating (BARC) on the silicon-containing resist middle layer film;
forming a resist upper layer film by using a photoresist composition on the BARC;
forming a circuit pattern in the resist upper layer film;
successively transferring the pattern by etching to the BARC and the silicon-containing resist middle layer film using the resist upper layer film having the formed circuit pattern as a mask;
transferring the pattern to the organic film by etching using the silicon-containing resist middle layer film having the transferred pattern as a mask; and
etching the body to be processed using the organic film having the transferred pattern as a mask to form the pattern in the body to be processed.

17. A patterning process comprising the steps of:
forming an organic film by using the composition for forming an organic film according to claim 1 on a body to be processed;
forming an inorganic hard mask selected from a silicon oxide film, a silicon nitride film, a silicon oxynitride film, a titanium oxide film, and a titanium nitride film on the organic film;
forming a resist upper layer film by using a photoresist composition on the inorganic hard mask;
forming a circuit pattern in the resist upper layer film;
transferring the pattern to the inorganic hard mask by etching using the resist upper layer film having the formed circuit pattern as a mask;
transferring the pattern to the organic film by etching using the inorganic hard mask having the formed pattern as a mask; and
etching the body to be processed using the organic film having the formed pattern as a mask to form the pattern in the body to be processed.

18. The patterning process according to claim 17, wherein the inorganic hard mask is formed by a CVD method or an ALD method.

19. A patterning process comprising the steps of:
forming an organic film by using the composition for forming an organic film according to claim 1 on a body to be processed;
forming an inorganic hard mask selected from a silicon oxide film, a silicon nitride film, a silicon oxynitride film, a titanium oxide film, and a titanium nitride film on the organic film;

forming a BARC on the inorganic hard mask;

forming a resist upper layer film by using a photoresist composition on the BARC;

forming a circuit pattern in the resist upper layer film;

successively transferring the pattern to the BARC and the inorganic hard mask by etching using the resist upper layer film having the formed circuit pattern as a mask;

transferring the pattern to the organic film by etching using the inorganic hard mask having the formed pattern as a mask; and etching the body to be processed using the organic film having the formed pattern as a mask to form the pattern in the body to be processed.

20. A polymer comprising a partial structure shown by the following general formula (1) as a repeating unit,

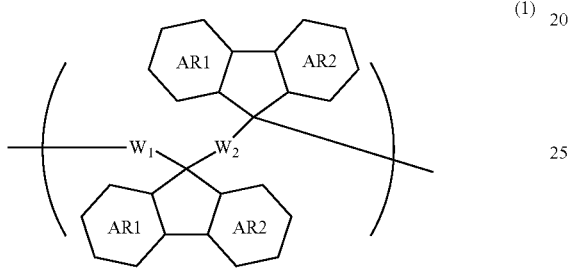
(1)

wherein each of AR1 and AR2 represents a benzene ring or a naphthalene ring which optionally have a substituent; $W_1$ represents any shown by the following general formulae (2), (4), and (6), and the polymer optionally contains two or more kinds of $W_1$; and $W_2$ represents a divalent organic group having 6 to 80 carbon atoms and at least one or more aromatic rings,

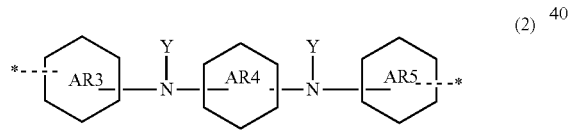
(2)

wherein AR3, AR4, and AR5 each represent a benzene ring or a naphthalene ring which optionally have a substituent, and aromatic rings of AR3 and AR4, or AR4 and AR5, optionally form a bridge structure via carbon atoms to which hydrogen atoms have been bonded on the aromatic ring; and Y represents a substituent shown by the following general formula (3), $$Y = -R_3 = R_4 \quad (3)$$

wherein $R_3$ represents a single bond or a divalent organic group having 20 or fewer carbon atoms; and $R_4$ represents hydrogen or a monovalent organic group having 20 or fewer carbon atoms,

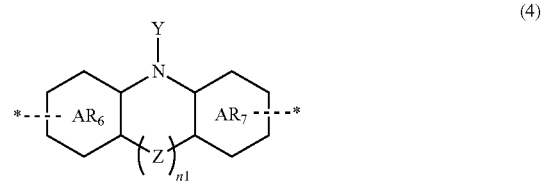
(4)

wherein $AR_6$ and $AR_7$ each represent a benzene ring or a naphthalene ring which optionally have a substituent; n1 represents 0 or 1, when n1=0, $AR_6$ and $AR_7$ form no bridge structure between aromatic rings thereof via Z, and when n1=1, $AR_6$ and $AR_7$ form a bridge structure via Z; Z represents a single bond or any in the following general formula (5); and Y represents a substituent shown by the general formula (3),

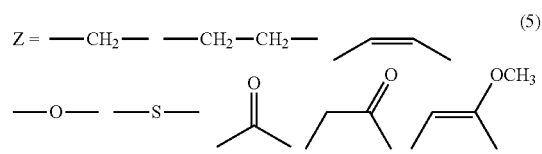
(5)

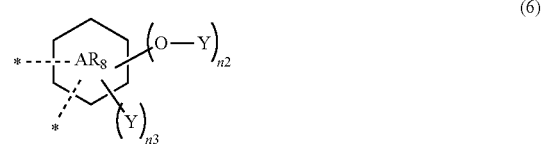
(6)

wherein $AR_8$ represents a benzene ring, a naphthalene ring, an anthracene ring, a phenanthrene ring, or a pyrene ring; Y represents a substituent shown by the general formula (3); and n2 and n3 represent integers satisfying relations of $0 \leq n2 \leq 4$, $0 \leq n3 \leq 4$, and $1 \leq n2+n3 \leq 4$.

21. The polymer according to claim 20, wherein the divalent organic group represented by $W_2$ in the general formula (1) is any of the following,

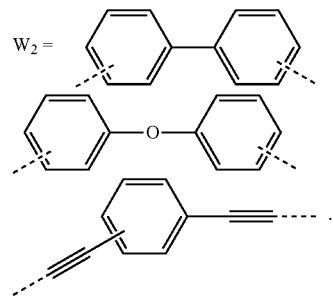

* * * * *